(12) United States Patent  (10) Patent No.: US 7,422,677 B2
Mazur et al.  (45) Date of Patent: Sep. 9, 2008

(54) MEMBRANE-MEDIATED ELECTROPOLISHING

(75) Inventors: Stephen Mazur, Wilmington, DE (US); Charles E. Jackson, Jr., Middletown, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 411 days.

(21) Appl. No.: 10/976,897

(22) Filed: Nov. 1, 2004

(65) Prior Publication Data

US 2007/0051639 A1  Mar. 8, 2007

(51) Int. Cl.
C25F 3/14 (2006.01)
C25F 3/22 (2006.01)
B23H 5/06 (2006.01)
B23H 3/10 (2006.01)
C25F 7/00 (2006.01)

(52) U.S. Cl. ............... 205/662; 205/663; 205/668; 205/93

(58) Field of Classification Search ............. None
See application file for complete search history.

(56) References Cited

U.S. PATENT DOCUMENTS

| | | | |
|---|---|---|---|
| 4,176,215 A | 11/1979 | Molnar et al. | |
| 4,545,889 A | 10/1985 | Franx | |
| 4,909,912 A | 3/1990 | Oda et al. | |
| 4,983,264 A | 1/1991 | Miyake et al. | |
| 6,375,823 B1 * | 4/2002 | Matsuda et al. | 205/117 |
| 6,527,920 B1 | 3/2003 | Mayer et al. | |
| 6,646,083 B2 | 11/2003 | Hirano et al. | |
| 6,653,226 B1 | 11/2003 | Reid | |

FOREIGN PATENT DOCUMENTS

| | | |
|---|---|---|
| EP | 1 293 481 A2 | 3/2003 |
| GB | 516898 | 1/1940 |
| WO | WO 03/030223 A2 | 4/2003 |
| WO | WO 03/046263 A1 | 6/2003 |
| WO | WO 03/064734 A1 | 8/2003 |
| WO | WO 03/092891 A1 | 11/2003 |
| WO | WO 03/098676 A1 | 11/2003 |

OTHER PUBLICATIONS

D. E. Ward, "D. Electropolishing", Electroplating Engineering Handbook, 4th Edition, 1984, pp. 100-120.
S. H. Glarum et al., "The Anodic Dissolution of Copper Into Phosphoric Acid", J. Electrochem. Soc., 1985, vol. 132:2872-2878.
C. Wagner, "Contribution to the Theory of Electropolishing", J. Electrochem. Soc., 1954, vol. 101:225-228.
Legras et al., "Sorption and Diffusion Behaviors of Water in Nafion 117 Membranes With Different Counter Ions", Desalination, 2002, vol. 147:351-357.

* cited by examiner

Primary Examiner—Harry D Wilkins, III

(57) ABSTRACT

This invention provides a membrane-mediated electropolishing process for polishing and/or planarizing metal work pieces. The work piece is wetted with a low-conductivity fluid. The wetted work piece is contacted with a first side of a charge-selective ion-conducting membrane, wherein the second side contacts a conductive electrolyte solution in electrical contact with a cathode. Current flow between the cathode and the work piece electropolishes metal from the work piece. This process can be used for both pure metals and alloys, and provides several significant advantages over conventional electropolishing processes. This invention also provides an apparatus useful in the membrane-mediated electropolishing process.

55 Claims, 24 Drawing Sheets

Schematic cross section of MMEP cathode half-cell (1-7) in contact with a work piece (8) immersed in low-conductivity solvent (9).

Figure 3 – Schematic cross section of MMEP cathode half-cell (1-7) in contact with a work piece (8) immersed in low-conductivity solvent (9).

Figure 4. Comparison of polishing efficiency using MMEP and EP on milled copper coupons.

Geometric Parameters:
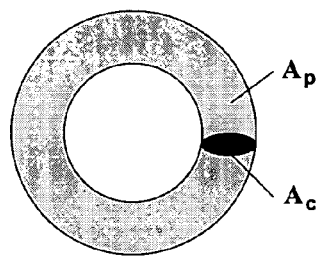
$RR = (V_m/F) (A_c/A_p) (I/n)$
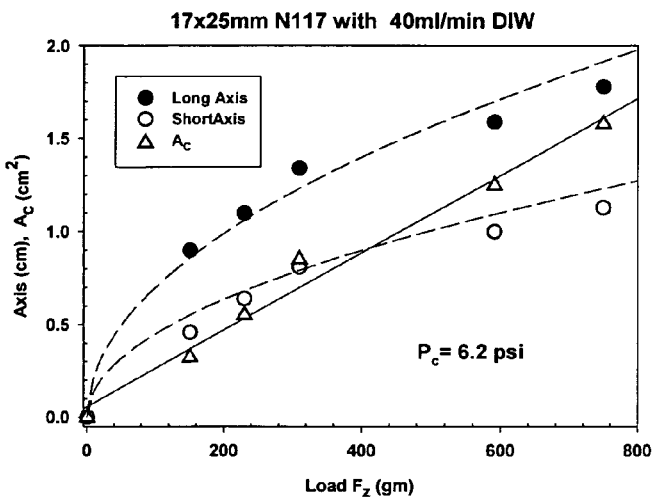
FIGURE 12A        FIGURE 12B
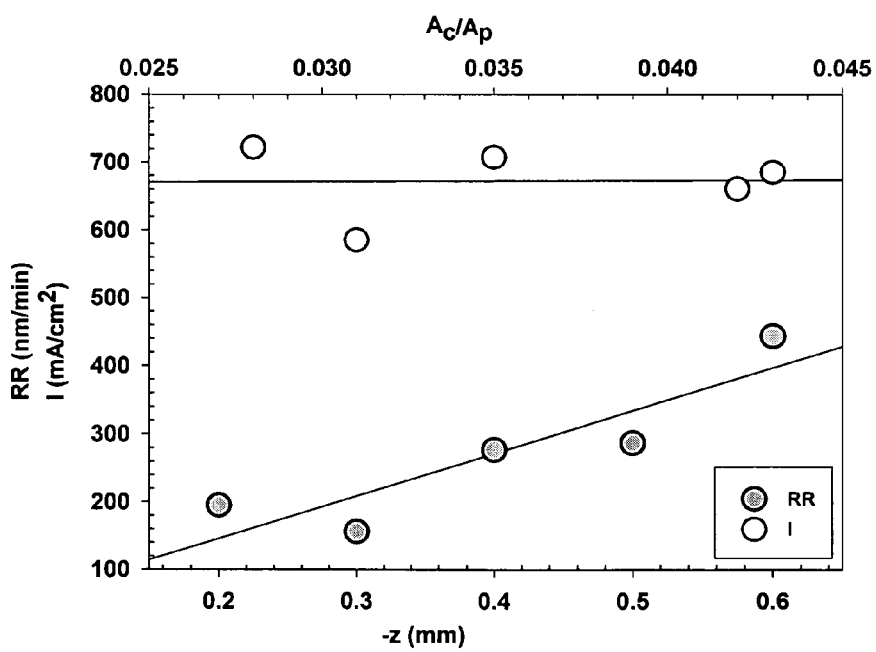
FIGURE 12C

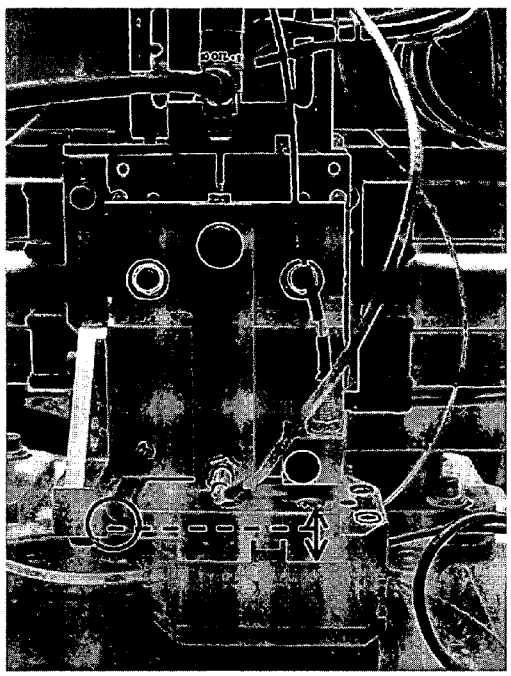
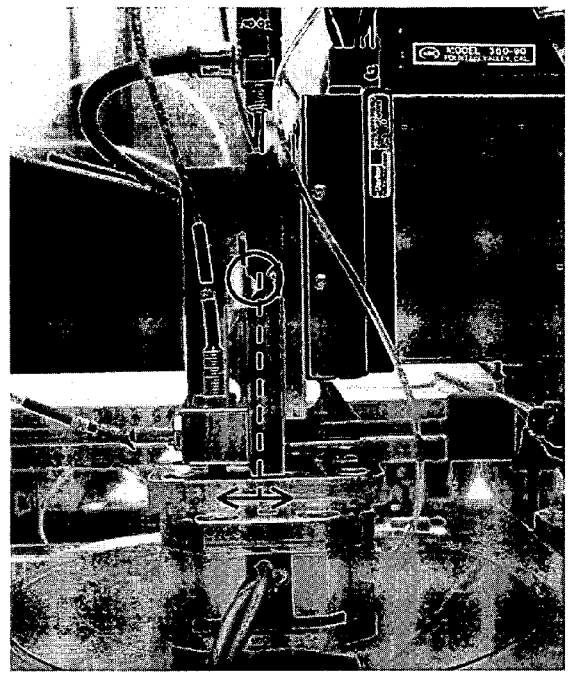
Horizontal cantilever
deflection measures normal load.
*FIGURE 18A*
Vertical cantilever
deflection measures drag load.
*FIGURE 18B*

MEMBRANE-MEDIATED ELECTROPOLISHING

CROSS-REFERENCE TO RELATED APPLICATIONS

This application claims priority to the following: U.S. Provisional Patent Application No. 60/611,699, filed on Sep. 22, 2004; U.S. Provisional Patent Application No. 60/570,967, filed on May 14, 2004; U.S. Provisional Patent Application No. 60/546,192, filed on Feb. 23, 2004; U.S. Provisional Patent Application No. 60/546,198, filed on Feb. 23, 2004; and U.S. Provisional Patent Application No. 60/516,235, filed on Oct. 31, 2003, all by Stephen Mazur and Charles E. Jackson; the disclosures of which are incorporated herein by reference hereto for all purposes.

STATEMENT REGARDING FEDERALLY SPONSORED RESEARCH OR DEVELOPMENT

N/A

INCORPORATION-BY-REFERENCE OF MATERIAL SUBMITTED ON A COMPACT DISC

N/A

SEQUENCE LISTING

N/A

FIELD OF THE INVENTION

This invention relates to a process for electropolishing metal surfaces, and more specifically to a membrane mediated electropolishing process, wherein a conductive electrolyte contacts a cathode and a first side of a charge-specific ion-conducting membrane, the membrane movably contacts the work piece anode having a low-conductivity fluid disposed thereon, and on applying sufficient voltage a current flows between the cathode and the work piece, metal is removed from the surface by means of electrochemical anodic oxidation, and most of this metal passes through the membrane and into the electrolyte. More particularly, the invention relates to use of membrane mediated electropolishing to polish copper damascene wafers at rate variable from less than 50 mA/cm to more than 3000 mA/cm² of membrane contact area, wherein metal is removed from the surface by means of electrochemical anodic oxidation and through a membrane contacting the metal surface that is permeable to the removed metal ions, and wherein the metal ions pass through the membrane and into the electrolyte, and therefore do not contaminate the wafer surface.

BACKGROUND OF THE INVENTION

Conventional electropolishing (EP) is a common metal finishing process in which the metal object to be polished (the "work piece") is connected to the positive terminal of a DC electrical power supply as the anode. The surface of the work piece or some portion of that surface is brought into contact with an electrolyte solution which, in turn, also contacts a second electrode (the cathode) which is connected to the negative terminal of the power supply. When a suitable voltage difference is applied between the two electrodes, or a suitable current density is established at the anode, then the work piece undergoes anodic oxidation forming solvated metal ions that dissolve into the electrolyte. Within a certain range of operating conditions this occurs in such a way that rough areas of the surface become smoother (current density is defined as the electrical current per unit surface area of anode in contact with the electrolyte and has units such as mA/cm²).

EP is capable of producing a mirror-like reflective finish on many different kinds of metals and is especially useful for polishing metal parts with curved surfaces and complicated shapes. As described by D. E. Ward (pp. 100-120 in *Electroplating Engineering Handbook*, 4th Edition, L. J. Durney, Ed., Van Nostrand Co., NY, 1984), the optimum electrolyte composition and current density varies with the composition of the work piece. The rate of the EP process is limited by mass transport of molecules and/or ions in the electrolyte close to the anode surface and is generally optimized by convection of the electrolyte.

Recent interest has focused on the use of EP to selectively remove excess copper in the fabrication of integrated circuits via the copper damascene process. In a typical copper damascene process, a silicon wafer is uniformly covered with a dielectric layer, for example ~0.5 microns of $SiO_2$. A pattern corresponding to the conductive circuit elements is then etched through the dielectric layer by photo-lithographic methods, and the entire surface is coated with a thin "barrier" layer, for example <10 nm tantalum or tantalum nitride. A layer of copper is then grown over the entire surface of the wafer by means of electroplating. This copper "blanket" must be sufficiently thick to fill the etched circuit features (~0.5 microns), but is generally not thicker than about 1 micron in total thickness. The external surface of the copper blanket generally retains topographic features that conform to the larger features in the underlying etched pattern. The next step in the process requires removing all excess copper from the surface of the barrier-coated dielectric while leaving the etched circuit elements filled with copper. In addition, the final surface must be left planar to within very narrow tolerances in order to permit subsequent fabrication of addition layers of circuitry. The cross-section of a typical copper damascene wafer before and after polishing and planarization is shown schematically in FIG. 1.

Planarization and removal of excess copper from Cu damascene wafers is currently achieved by means of chemical-mechanical polishing (CMP), involving mechanical abrasion and chemical reactions with oxidizers and other chemicals. However, CMP is a costly process, generates hazardous waste products, and is incompatible with the mechanically fragile materials currently under development for improved dielectric layers.

EP has been considered as an alternative to overcome the limitations CMP. Many different processes are capable of chemically or mechanically removing material from the surface of a metal work piece, but such processes differ in their ability to polish or planarize, i.e., to reduce the roughness of the surface. By planarization is meant the ability to preferentially remove topographic high points (plateaus or ridges) of both large and small lateral dimensions so that the polished surface progressively approaches an ideal plane. Planarizing conventionally plated Cu damascene wafers requires especially high efficiency.

"Planarization efficiency" may be defined quantitatively by reference to FIG. 2. Consider a surface topography where the vertical distance between high points and low points is measured by amplitude "a," the lateral distance between these points is represented by $\lambda$, and the average thickness of the work piece is $\tau$. The planarization efficiency of a polishing process is defined by the derivative $da/d\tau$, namely the differential change in amplitude of a topographic feature with the change in average thickness. Depending upon the planarization mechanism da/dτ may vary with various processing conditions and with the magnitude of a and λ. Measurements of planarization efficiency are important for practical purposes and also useful for distinguishing different planarization mechanisms.

Planarizing conventionally plated Cu damascene wafers requires that initial topographic features, with initial amplitude $a_o$~0.5 microns and λ=10 to 100 microns, must ultimately be reduced to a <25 nm, while removing only ~1-1.5 microns of material overall (Δτ=−1 micron). Conventional EP can be highly efficient at planarizing surface features where λ<1 micron, but is much less efficient for larger features (λ>10 micron). Thus use of EP to planarize Cu damascene wafers requires the use of additional technologies. For example, the SFP tool (ACM Research, Inc.) is only useful for polishing wafers which have been produced by a specialized "hump-free, dishing-free" plating process which minimized the initial topography. Similarly, in electromechanical polishing methods, the EP process is augmented with a more selective mechanical abrasion process.

Fundamental studies have shown tha the rate and planarization efficiency of EP vary with a, λ, and with convective transport in the electrolyte solution. Electrolyte convection increases the rate of EP by enhancing mass transport of solubilizing molecules such as water to the surface of the work piece (see for example S. H. Glarum, J. H. Marshall, *J. Electrochem. Soc.*, 132, 2872 (1985)). More efficient mixing of the electrolyte produces a thinner convective boundary layer resulting in faster mass transport. C. Wagner (*J. Electrochem. Soc.*, 101, 225 (1954)) showed that for " . . . an ideal electropolishing process," where the thickness of the convective boundary layer is greater than a and λ, the planarization efficiency is given by the relation: $da/d\tau = 2\pi a/\lambda$. However, when λ is larger than the convective boundary layer thickness, then $da/d\tau \rightarrow 0$, and no planarization will occur. Accordingly, to planarize features with large λ by EP, the efficiency of convective mixing and rate must be restricted, and even in the "ideal" limit planarization efficiency decreases with increasing λ.

There remains a need for an EP process that is capable of planarizing in an efficient, low-waste manner the topographic features on semiconductor substrates, e.g., Cu damascene wafers produced by the current plating technology, which is advantageously capable of producing commercially acceptable products without the use of additional planarizing steps, means such as specialized plating technologies, masking, degrading polishing materials giving changing performance, and requiring frequent regeneration, or mechanical abrasion.

SUMMARY OF THE INVENTION

One aspect of the invention relates to an apparatus for and a method of membrane-mediated electropolishing of a substrate, which is advantageously a metal layer on a copper damascene wafer used in the manufacture of integrated circuits, but also can be used on a variety of other metals and on other applications, such as planarizing and polishing other metals disposed on integrated circuit wafers, and for planarizing and polishing antenna, a micromachine, a read/write head, a memory or rigid disk, or other substrates where the tolerances are demanding.

In one embodiment, the process of membrane mediated electropolishing of an area $A_p$ of a substrate comprises the steps of:

a) providing a substrate having a surface with a metal disposed thereon, wherein said metal is electrically connected to the positive terminal of a substantially DC electric power supply;

b) providing a low-conductivity fluid layer to the surface, wherein the low-conductivity fluid advantageously has a low conductivity below about 1000 μS/cm, preferably below about 500 μS/cm, more preferably below about 200 μS/cm, for example between about 0.5 μS/cm and about 150 μS/cm, typically below about 100 μS/cm, even more preferably below 50 μS/cm, for example between about 0.1 and about 10 μS/cm, alternately between about 1 μS/cm and about 10 μS/cm;

c) providing a cathode half-cell including:
1) a cathode connected to the negative terminal of a substantially DC electrical power supply and in contact with a conductive electrolyte composition, wherein the conductivity of the conductive electrolyte composition is 100 times or more, preferably 1000 times or more, preferably about 10000 times or more, greater than the conductivity of the low-conductivity fluids; and
2) a charge-selective, ion-conducting membrane situated so as to contact on a first side the conductive electrolyte solution and on the opposite side to contact the low-conductivity fluid-covered surface of the substrate;

d) movably contacting the low-conductivity fluid-coated surface of the substrate with the membrane, moving relative to and substantially parallel to the surface of the substrate at an average velocity v, wherein a force $F_z$ exerted by the membrane on the wetted surface is greater than zero; and, e) applying a voltage V sufficient to maintain a current i between the copper and the cathode, where the current density I=i/Ac is greater than about 500 mA/cm², and wherein the slope dI/dV of the polarization curve at V is greater than about 50 mA/cm per volt.

Membrane-mediated electropolishing is in part distinguished by the following characteristics. First, a membrane disposed between a cathode and the work piece comprises first and second sides, wherein on the first side a conductive electrolyte composition contacts both the membrane and the cathode, and on the second side a low-conductivity fluid contacts the work piece and the membrane. Ionic current flow between the cathode and the work piece passes through the half-cell fluid, the membrane, and the low-conductivity fluid. Second, the membrane is substantially impermeable to the electrolyte solutes (and acids) in the electrolyte composition, but a substantial portion of the metallic material electropolished from the work piece migrates through the membrane toward the cathode and into the conductive electrolyte composition. Electrical current flow between a cathode in the half cell and the work piece is a function of the resistances between the cathode in the half cell and the work piece. As described in U.S. Pat. No. 6,653,226, if the distance between a charged body and the work piece is both small and is filled with a very-low-conductivity fluid, then the distance will be a determinative guide to current flow.

Another aspect of the invention relates to a method of membrane-mediated electropolishing of a work piece having a surface comprising a metal, the method comprising:

A) providing the work piece surface substantially covered with a low-conductivity fluid, wherein the work piece is in electrical contact with a first positive outlet of a substantially DC electric power source having positive and negative power outlets;

B) substantially and movably contacting the work piece surface covered with the low-conductivity fluid with a first side of an ion-conducting membrane having first and second sides, wherein the second side of the ion-conducting membrane contacts a conductive electrolyte composition having a conductivity greater than 10 mS/cm, and the ion-conducting membrane prevents the conductive electrolyte composition from contacting the work piece; and C) electrically contacting the conductive electrolyte composition with a cathode, wherein the cathode is electrically connected to the negative outlet of the substantially DC electric power source, thereby causing current to flow between the work piece and the cathode and electropolishing metal-containing ions from the work piece surface, and wherein a majority of the metal-containing ions electropolished from the work piece migrate through the ion-conducting membrane and into the conductive electrolyte composition. By substantially contacting, it is meant that the membrane is contacting the work piece, although a thin layer, e.g., a boundary layer, of low-conductivity fluid may exist between the membrane and the work piece, or an "effective" boundary layer may exist withing the pores of the membrane. In preferred embodiments of the invention, the ion-conducting membrane is a charge-specific ion-conducting membrane; the conductive electrolyte composition has a conductivity equal to or greater than about 5 mS, preferably equal to or greater than about 30 mS/cm, more preferably equal to or greater than about 100 mS/cm; and the low-conductivity fluid has a conductivity below about 500 µS/cm, preferably below 100 µS/cm, for example <10 µS or between about 0.1 and about 10 µS/cm. In preferred embodiments of the invention, substantially all of the metal ions electropolished from the work piece pass through the membrane and into the conductive electrolyte composition.

There is no active ion exchange material, i.e., material having ability to substantially capture and retain the metal-containing ions originating from the metal or from other sources, disposed into the electric current pathway between the cathode and the work piece surface. An "ion-exchange" material is a functional term implying the membrane captures an ion, at the same time releasing another type of ion. For the membranes of the current invention, 1) in some embodiments the membrane does not have a substantial number of functional moieties to capture metal ions as required by an ion exchange material, 2) in most embodiments the membrane is nearly saturated with metal ions, and thus has no "ion-exchange" capacity as is known in the art, and finally, 3) in all embodiments the "ion-exchange" capability is too low to be useful in functioning as such during electropolishing. Rather, the membrane in the current invention is an ion-conductive material, and is typically a charge selective ion-conductive material. Removing 1 micron of Cu from a single 20 cm Cu damascene wafer generates 4.4 mMoles of $Cu^{+2}$. This may be accomplished via MMEP using, for example, 5 $cm^2$ of membrane contact area. Moreover, the same membrane can be used to polish many wafers without regenerating the ion-exchange capacity. A preferred membrane for use in the MMEP process are any of the commercially available Nafion® membranes, and a 5 $cm^2$ layer of the thickest Nafion® membrane (N117, with Equivalent weight 1100), has a total exchange capacity of only 81 microMoles of $Cu^{+2}$. That is, the membrane would be saturated with Cu after polishing only a few percent of the required depth. This is, incidentally, a major difficulty with prior art polishing processes that utilize ion exchange material in the polishing.

The process of electropolishing a metal ion, e.g., copper, and tranporting the metal ion through the membrane is believed to remove water or other solvent from the interface between the work piece and the membrane, and, under certain polishing conditions, the contact area can lose its boundary layer of water and stick to the work piece. The electropolishing method advantageously further comprises introducing additional low-conductivity fluid to the interface between the membrane and the work piece surface during polishing.

In many embodiments, the solvated electropolished ions have a positive charge, and the ion-conducting membrane is a cation-conducting membrane comprising a polymeric ionomer functionalized with strong acid moieties having pKa(s) less than 5, preferably less than 3, for example a perfluorosulfonic acid/PTFE copolymer or a perfluorocarboxylic acid/PTFE copolymer. In an alternate embodiment, when the solvated electropolished ions have a negative charge, the ion-conducting membrane is an anion-conducting membrane, for example a polymer functionalized with protonated amines and/or quaeternary ammonium ions.

In selected embodiments of this invention, the membrane further comprises a partial covering or structure disposed between the charge-selective ion-conducting membrane and the work piece, wherein said partial cover is substantially permeable to those ions to which the membrane is permeable and also to low-conductivity fluid, and wherein said partial covering has openings sufficiently large to allow the membrane to extend therethrough to "sensibly" contact the work piece surface, i.e., to contact the work piece surface albeit with perhaps a very thin boundary layer of water between the contacting surface of the membrane and the work piece surface. This partial covering can vary widely in thickness and have a plurality of functions, as discussed infra.

In preferred embodiments of the invention, the conductive electrolyte composition has a conductivity greater than about 100 mS/cm and comprises water, an acid, and a metal salt. Alternatively, the conductive electrolyte composition comprises water and acetonitrile. In either case, the low-conductivity fluid advantageously has a conductivity much lower than that of the conductive electrolyte composition, generally at least 100 times lower than, and preferably at least 1000 times lower than said conductive electrolyte composition (e.g., the low-conductivity fluid has a conductivity below about 200 µS/cm or below about 100 µS/cm). The method can efficiently planarize most structures on a metal-containing integrated circuit surface if the low-conductivity fluid has a conductivity between about 0.5 µS/cm and about 150 µS/cm. For structures with very large λ, the low-conductivity fluid advantageously has a conductivity between about 1 µS/cm and about 10 µS/cm.

The low-conductivity fluid may consists essentially of water, acetonitrile, propionitrile, butyronitrile, ethylene carbonate, propylene carbonate, glycol, ethylene glycol, propylene glycol, diethlyene glycol, or mixtures thereof. In an alternative embodiment, the low-conductivity fluid may consist essentially of water and at least one of acetonitrile, propionitrile, butyronitrile, an alcohol having from 1 to 8 carbon atoms, glycerol, ethylene glycol, propylene glycol, diethylene glycol, propylene glycol monomethyl ether, propylene carbonate, ethylene carbonate, an alkanolamine, ethylenediamine, and dimethylformamide. The solvating capacity of the low-conductivity fluid changes with pH, and the pH varies with polishing, so advantageously the low-conductivity fluid comprises a buffer in a quantity sufficient to maintain a pH during electropolishing of within about 0.2 pH units of an initial pH. The amount of buffer must be very small or the conductivity criteria will not be achieved.

The apparatus for electropolishing includes as an essential component a cathode half cell. In one embodiment, a cathode half-cell comprises:

a fully or partially enclosed volume having a charge-specific ion-conducting membrane forming a surface of the volume, and wherein a cathode is disposed within the volume and a conductive electrolyte composition partially or essentially fills the volume and is in electrical contact with both the membrane and the cathode;

a connector electrically connecting the cathode to the negative outlet of a substantially DC electric power source; and an inlet and an outlet flowingly connected to a pump adapted to circulate the conductive electrolyte composition between the enclosed volume. The method can be performed as described above, and advantageously the pump can circulate conductive electrolyte composition between the half cell volume and the pump. In one embodiment, the circulating flow of conductive electrolyte composition into and out from the half cell is controlled, such that the pressure within the half cell is controlled at a preselected pressure that is typically between about 0.1 psig and about 40 psig, more typically between about 0.1 psig and about 20 psig. The pump may be further flowingly connected to a second apparatus adapted to change the temperature of the electrolyte composition or to change the composition of the electrolyte composition, e.g., filter, de-gas, add components, etc.

While the imposed current is generally DC, advantageously, in some embodiments, the electrical power source provides a pulsed DC current alternating between a high current value and a low current value that is less than 30%, preferably less than 50%, more preferably less than 70%, of the high current value. The period of alternating can, for example, be such that the low current value is maintained for a period of time between 0.00001 seconds (10 μsec) and 1 second and the high current value is maintained for a period of time between about 0.00001 seconds (10 μsec) and 5 seconds. The pulsing current appears to increase planarization efficiency under some circumstances.

Various electrolyte compositions are useful in this method. Generally, but not necessarily, it is preferable that at least one major component of the low-conductivity fluid be a component of the conductive electrolyte composition. For example, if the metal on the work piece surface comprises copper, the electrolyte solvent may advantageously comprises one or more nitrogen-containing solvents that can stabilize Cu(I) ions, for example soluble nitrites such as acetonitrile, propionitrile, and/or butyronitrile, alkanolamines such as monoethanolamine, diethanolamine, triethanolamine, and/or isopropanolamine, ammonia, ethylene diamine, or mixture thereof in an amount sufficient to give a electropolishing efficiency of one copper atom for every 1 to 1.99 electrons of current flow. The number of electrons of flow per atom of copper electrpolished is called n. However, if the electropolished ions are solvated by the low-conductivity fluid as Cu(I) complexes, then the conductive electrolyte must also be able to solvate thermodynamically stable Cu(I) complexes.

For most metal polishing, the conductive electrolyte composition comprises water, one or more acids acid, and from about 0.001 M to about 1 M of a metal salt. Preferably, to reduce cathodic electrolysis of water to hydrogen, the metal from the metal salt is reducible at the cathode.

One side reaction intrinsic to electropolishing is the electrolysis of water, which can produce molecular hydrogen, molecular oxygen, or both. We have found that it is very advantageous in any form of electropolishing to maintain a high enough concentration of reducible ("plate-able") metal ions in the electrolyte in the vicinity of the cathode to substantially reduce the formation of hydrogen gas, wherein this reducible-metal salt containing electrolyte and any metallic particles that may form near the cathode do not contact the integrated circuit wafer work piece. Therefore, an additional invention is a method of electropolishing or electro-mechanically polishing Cu damascene wafers wherein the electrolyte solution contacting the cathode contains a sufficient concentration of reducible-metal salts to substantially suppress the formation of molecular hydrogen at the cathode, but where the electrolyte or fluid contacting the Cu damascene wafers has substantially less reducible-metal salts. Preferred reducible-metal ions are Cu(I), Cu(II), Ni(II), Ag(I), Fe(II), Cr(III), and/or complexes of these ions. The most preferred reducible-metal ions are Cu(I) and Cu(II). Depending on the current density, generally a concentration of between 0.001 M to about 1 M of a reducible-metal salt is sufficient to suppress the formation of molecular hydrogen at the cathode, and in preferred embodiments the electrolyte contacting the cathode comprises about 0.01 M to 0.5 M, for example about 0.05 M to about 0.3 M, alternately from about 0.1 M to about 0.3 M, of a reducible-metal salt. The reducible metal from the metal salt may be the same as the metal electropolished from the work piece surface, or may be different than the metal electropolished from the work piece surface. The same criteria apply to the MMEP processes, in that the electrolyte solution or gel comprises a reducible-metal salt, wherein the amount of reducible-metal salt is sufficient to substantially reduce the formation of hydrogen gas. Another variation of any of the above-mentioned apparatus includes the embodiment wherein the conductive electrolyte solution or gel comprises from about 0.001 M to about 1 M, preferably about 0.01 M to 0.5 M, for example about 0.05 M to about 0.3 M, or alternately from about 0.1 M to about 0.3 M, of reducible-metal salt.

In preferred embodiments, the low-conductivity fluid comprises or consists essentially of at least one solvent that can solvate a metal ion, e.g., one or more of water, alkanolamines, soluble nitrites, soluble diamines, amides, ethylene carbonate, r propylene carbonate, or any mixture thereof. The low-conductivity fluid may comprises additives in low quantities, for example a chelator. The low-conductivity fluid may comprise a polar organic solvent, which is particularly advantageous if the work piece comprises water-sensitive materials, such as low-K materials.

If the metal on the work piece surface comprises aluminum, iron, or both, then the low-conductivity fluid, the conductive electrolyte composition, or both may advantageously comprise a source of strong base, cyanide ion, and/or chloride ions.

The work piece surface may comprise copper, particularly useful for integrated circuit manufacture.

One advantage of membrane mediated electropolishing is that the electropolished ions can be made to substantially quantitatively pass through the membrane and be trapped within a small reservoir of conductive electrolyte. Membrane mediated electropolishing is therefore beneficial if the work piece comprise environmentally hazardous metals, for example cobalt and/or chromium. The work piece may comprise valuable metals such as Ag, Au, and also valuable metals such as Ir, Rh, and Ru, which can be collected and recycled. Other environmentally undesirable metals and/or valuable metals, such as vanadium, manganese, zirconium, niobium, molybdenum, hafnium rhenium, osmium, iridium, ruthenium, rhodium, and/or silver, can be beneficially polished by membrane mediated electropolishing.

The metal on the work piece surface may comprise other metals commonly found on semiconductor substrates, including aluminum, nickel, tantalum, titanium, or tungsten, or nitrides thereof. The substrate surface also often comprises one or more dielectric materials. The method is useful for substrates having all commonly used dielectrics. One advantage of this invention over conventional chemical mechanical polishing is the method of this invention does not appear to cause any attrition of dielectric layers. Some embodiments of the low-conductivity fluid, particularly the pure water, the low water/polar solvent such as the water/acetonitrile systems, and the low and no water systems are particularly useful for polishing surfaces having water-sensitive low-K materials thereon.

In a specific embodiment, the membrane-mediated electropolishing process comprises:

A) providing a cathode half-cell comprising:
1. a fully or partially enclosed volume, cavity or vessel;
2. an electrolyte solution or gel which partially or essentially fills the enclosed volume, cavity, or vessel;
3. a cathode in contact with the electrolyte solution or gel;
4. a connector electrically connecting the cathode to the negative terminal of a substantially DC power source; and
5. a charge-selective ion-conducting membrane which seals one surface of the enclosed volume, cavity, or vessel in such a way that the internal surface of said membrane contacts the electrolyte solution or gel and that the external surface is adapted to movably contact the metal work piece;

B) substantially covering a surface of a metal work piece with a low-conductivity solvent or solution;

C) providing a source of DC electrical power whose positive terminal is connected to a metal work piece; and D) movaably contacting the metal work piece with at least a portion of the external surface of the membrane, while imposing a voltage between the cation and the work piece, thereby electropolishing metal from the work piece.

Another aspect of the invention relates to the apparatus adapted to perform the invention. For example, for the first method embodiment, this invention also provides an apparatus for use in membrane-mediated electropolishing of a metal work piece, comprising:

a. a substantially DC electric power source;
b. a connector for electrically connecting the work piece to the positive terminal of the substantially DC electric power source;
c. a conductive electrolyte solution or gel;
d. a low conductivity solvent or solution which is in contact with a charge-selective ion-conducting membrane and with the work piece;
e. a charge-selective ion-conducting membrane which has an internal surface which contacts the electrolyte solution or gel and an external surface which is accessible to contact the metal work piece and the low-conductivity solvent or solution disposed thereon;
f. a cathode which is in contact with the electrolyte solution or gel;
g. a connector electrically connecting the cathode to the negative terminal of the substantially DC electric power source; and
h. a mechanism to move the membrane in contact with the work piece and the low-conductivity solvent or solution along the surface of the work piece.

This invention also provides a cathode half-cell for use in membrane-mediated electropolishing, comprising:

a. a fully or partially enclosed volume, cavity, or vessel;
b. an electrolyte solution or gel, which partially or substantially fills the enclosed volume, cavity, or vessel;
c. a cathode which is in contact with the electrolyte solution or gel;
d. a charge-selective ion-conducting membrane which seals at least one surface of the enclosed volume, cavity, or vessel, wherein the internal surface of the membrane is in contact with the electrolyte solution or gel.

Membrane mediated electropolishing (MMEP) is a process for polishing and planarizing a metal work piece via anodic oxidation mediated by a charge-differentiating ion-conducting membrane. Another aspect of the present invention relates to improvements in the MMEP process and specifically to improvements which provide for high rates of removal of metal from the work piece while minimizing precipitation of metal oxides, hydroxides, and/or carbonates, and minimizing contact pressure between the membrane and the work piece. More specifically, it relates to polishing and planarizing at high removal rate and low contact pressure of a Cu work piece such as a Cu-plated damascene wafer in the manufacture of integrated circuits.

When operating at low voltages, e.g., below about 8 V, we found that we could vary conditions, such that n could equal between about 2 and 3, often very close to 2. Such a low n is advantageous in that electrolytic oxidation of water, and the accompanying evolution of gas is minimized, but the polishing rate was limited by the low voltages and subsequently lower current densities. Further, as the voltage and the polishing rate increased, a particle-like precipitate formed on the polished surface. Unless conditions were maintained to avoid the particle formation, such particles would very likely result in unacceptable scratching of the copper damascene wafer, or at least would additionally require an additional finishing step. The particles can include copper oxide, copper hydroxide, copper carbonate, or mixture thereof. For example, to obtain a polarization curve, we polish substrates at varying voltages. When a substrate was polished at increasing voltages, e.g., as described in the examples, a dark coating of CuO would be clearly visible on the wafer at 7 volts.

These oxide coatings or particles could be abraded from the surface, for example by contacting the surface with a window-frame structure that advantageously moves across the surface of the substrate and applies an abrasive action sufficient to remove the particles. The window-frame can advantageously move with the membrane, and may have abrasive attached thereto, in much the manner as an abrasive pad used in conventional CMP has abrasive attached thereto. This type of polishing, e.g., forming an oxide and abrading off the oxide, is similar to conventional CMP. The window-frame structure can also advantageously be useful for supplying low-conductivity fluid to the substrate surface, or for dividing a large membrane into a plurality of smaller areas which contact the substrate and which can even be part of the circuit between the metal surface being polished and the positive terminal of the electrical power supply.

Additionally, at lower voltages, e.g., voltages <8V, the current density I decreased systematically with increasing velocity v and with decreasing contact pressure. This effect is believed to reflect the introduction of an ohmic resistance due to dynamic introduction of a layer of water between the membrane and work piece, where with other factors being unchanged the thickness of the water layer increases with increasing v (much like a hydroplaning phenomenon) and with decreasing hydrostatic pressure $P_h$, because the more compliant blister would be more easily displaced by the hydrodynamic forces. For lower voltages, therefore, higher $P_h$ and lower v would provide thinner layers of water between the membrane and the substrate, and these thinner layers of water resulted in greater levels of current density I. However, to obtain the commercially demanded metal removal rate, e.g., greater than 500 nm per minute and preferably greater than 700 nm per minute, the tool had to be designed to provide a large area of contact of the membrane surface ($A_c$) relative to the area to be polished ($A_p$). Such large contact area and higher hydrostatic pressures ($P_h$) increased the resultant tool pressure, herein defined as the downward force divided by the are to be polished ($F_z/A_p$).

Surprisingly, however, we observed that after the voltage was increased to over 10 V, the oxide coatings and particles that had been present quickly dissapeared and would no longer form on the substrate surface. Further, when polishing at voltages above 10 V for this system, no additional oxide coating or particles were observed to form. We also surprisingly found that under many conditions the effects of velocity v and contact pressure $F_z/A_c$ were reversed, compared to the trends seen at V<7V, at the high V conditions, e.g., V>10V, preferably V>14V. We believe the formation of protons in the low conductivity water layer resulting from the anodic oxidation of water functioned to maintain the solubility of copper ions, preventing precipitates from forming and even dissolving and removing the oxide/hydroxide/carbonate particles and layers that were present. This electrolysis of water resulted in a higher n value. To be certain that copper precipitates will not form, n is advantageously at least 3 electrons per copper atom, preferably at least 3.5, and more preferably 3.9 or greater. The required number of protons necessary to prevent precipitation will to some extent depend on the polishing rate, which is directly proportional to the concentration of copper ions in the low-conductivity fluid. A higher value of n is required for higher copper dissolution rates. Generally, an n value in excess of 4, for example between about 4.5 and 8, will oxidize water molecules and thereby provide protons in an amount sufficient to prevent precipitation of copper oxides, copper hydroxides, and copper carbonates under substantially any commercially desirable polishing rate.

In the absence of other coordinating ligands, the solubility of copper ions in aqueous solutions depends upon the pH. Fully protonated, Nafion® membranes are sufficiently acidic (e.g., pH<2) to maintain a high concentration of copper ions in solution. However, if all of the protons in the membrane become exchanged by copper ions, then the pH may increase to values greater than 4 where the solubility of copper ions is extremely low. This may occur, for example, when copper ions are produced at the anode faster than protons can diffuse into the membrane from the electrolyte solution. However, under conditions where water is oxidized simultaneously with copper, the membrane may be kept partially protonated so that the pH remains less than 4. Generally, when n is equal to or greater than 4, the number of protons produced by electrolysis of water (two or more per copper atom) are sufficient to maintain a state of protonation of the membrane such that precipitation of copper particles is not an issue.

The second benefit of polishing at high voltages is that I increases. Under conditions where ohmic resistance is larger, one would expect the slope dI/dV of the polarization curve of current density I versus voltage V would at best stay constant, e.g., so that doubling the voltage would at best double the current density. Also, since the rate of water electrolysis also increases with increasing V, and since the fraction of electrons utilized for oxidation of copper must decrease accordingly, it was not obvious that the rate of copper removal (RR) would increase with increasing V or I. Surprisingly, under most conditions, the slope dI/dV of the polarization curve is not constant with V, but rather the slope of the polarization curve increased significantly as V increased. For example, FIG. 5-B shows four polarization curves that extended to 13 Volts. The velocities of the membrane relative to the work piece during these experiments were 19 cm/sec, 30 cm/sec, 43 cm/sec, and 64 cm/sec, and the width of the area of contact measured in the direction of v was such that the corresponding amount of time the membrane would contact a single point on the substrate surface (the "dwell time") was about 29 msec, 18 msec, 13 msec, and 9 msec, respectively. At 6.5 V, the data was consistent with the trends previously described—the current density was high (>400 mA/cm$^2$) at the lowest velocity v=19 cm/sec, but was lower for higher velocities, and was only about 80 mA/cm$^2$ for the highest velocity v=64 cm/sec. For the v=19 cm/sec case, doubling the voltage from 6.5 volts to 13 volts had the expected result, wherein I increased by only 73%, and RR increased by an even lesser amount. But at v=30 cm/sec, doubling the voltage to 13 V increased the I by 370%. At v=43 cm/sec and v=64 cm/sec, doubling the voltage to 13 V increased the I by over 900% and over 1200%, respectively. Removal rate is proportional to the ratio (I/n). However, as demonstrated by other examples, it was also discovered that, while n increases with V for voltages >10V, the increase in n was proportionately smaller than the increase in I. Accordingly, under these conditions, removal rate increased with increasing V.

When the current density I becomes sufficiently large compared with the rate of supply of water to the interface, then the membrane may become partially dehydrated, resulting in an increase in ohmic resistance. That is, while, at lower voltages, we believe a thicker low-conductivity fluid layer limits I by increasing the resistance proportional to the thickness of the water layer, we believe, at high V, the ohmic resistance increases when the rate of water consumption between the membrane and the substrate surface exceeds the rate of water supply. We believe this phenomenon leads to a reduction in n and, more importantly, a reduction in current due to increased resistance between the inside layer of the membrane and the substrate surface, which is probably due to increased resistance of the partially dehydrated membrane. Eventually, as V was further increased, the water loss becomes so severe that the membrane squeaked as it moved across the surface, and eventually the membrane stuck to the substrate, with accompanying damage to both the membrane and the substrate. Therefore, under the high V polishing conditions, v should be kept high to maintain a sufficient supply of water to the interface, and n should be kept sufficiently high to prevent precipitation of CuO, Cu(OH)$_2$, and/or CuCO$_3$. The same results are favored by reducing the contact pressure $P_c$, which has the additional advantage of decreasing mechanical stress on the work piece.

Our experiments showed that V>10 V, preferably V>14 V, was a sufficient voltage to prevent precipitation of precipitates, but that polishing parameters that maximize I at V<7 V can inhibit or limit I at V>10 V, for example at V>14 V. Further, the increase in n is proportionately lower than the increase in I, so the copper removal rate like the current density I increases with V. It is now easy to achieve the commercially desirable polishing rates of greater than 500 nm per minute, preferably greater than 700 nm/min, with relatively modest ratios of $A_c/A_p$, low tool pressure $F_z/A_p$, and low contact pressure $F_z/A_c$.

Another aspect of the invention is a process of membrane mediated electropolishing of a an area $A_p$ of a substrate, wherein the process includes:

A) providing a substrate having a surface comprising copper, wherein at least a portion of the copper on said surface is electrically connected to the positive terminal of a substantially DC electrical power supply, and wherein the surface is at least partially wetted with a low-conductivity fluid comprising water and having a conductivity of less than about $1 \times 10^{-4}$ S/cm;

B) movably contacting the surface with a cathode half-cell comprising:
 1. a cathode electrically connected to the negative terminal of the substantially DC electrical power supply;
 2. a cation-selective ion-conducting membrane having an interior side and an exterior side, wherein the membrane under the applied voltage allows more than half of the polished metal cations in the low-conductivity fluid to migrate through the membrane to the electrolyte, but allows less than 1 anion from the electrolyte to migrate to the low-conductivity fluid per 100 metal cations migrating from the low-conductivity fluid to the electrolyte, and wherein the exterior side is in contact with the wetted copper surface over a contact area $A_c$; and
 3. a conductive electrolyte having a conductivity of greater than about $1 \times 10^{-2}$ S/cm in electrical contact with the cathode and with the interior side of the membrane, wherein the area $A_p$ over which the membrane movably contacts is greater than $A_c$, and wherein the membrane exerts a force $F_z$ that is greater than 0; and
C) supplying the low-conductivity fluid comprising water to at least to the surface areas of the substrate surrounding $A_c$;
 wherein the exterior surface of the membrane movably contacts the wetted surface of the substrate at a velocity greater than about 30 cm/sec relative to the substrate surface, and wherein the voltage between the electrolyte and the metal is greater than 10 V.

Another aspect of the invention is a process of membrane mediated electropolishing of an area $A_p$ of a substrate, wherein the process includes:
 a) providing a cathode half-cell containing a cathode connected to the negative terminal of an electrical power supply and in contact with a conductive-electrolyte composition, and a cation-selective, ion-conducting membrane situated so as to contact on a first side the conductive electrolyte solution and on the opposite side the surface of the substrate and a layer of low-conductivity de-ionized water disposed on the surface;
 b) providing a substrate having a surface with metallic copper disposed thereon, wherein said metallic copper is electrically connected to the positive terminal of the electrical power supply;
 c) supplying a low-conductivity fluid consisting essentially of de-ionized water to the surface of the substrate;
 d) movably contacting at least the surface $A_p$ of the substrate with the membrane, moving relative to and substantially parallel with the surface of the substrate at an average velocity v, wherein an area $A_c$ of the membrane contacts the surface, and wherein the force $F_z$ exerted by the membrane on the wetted surface is greater than zero; and
 e) applying a voltage V sufficient to maintain a current i between the copper and the cathode, where the current density $I=i/A_c$ is greater than about 500 mA/cm², and wherein the slope dI/dV of the polarization curve at V is greater than about 50 mA/cm² per volt.

Another aspect of the invention is a process of membrane mediated electropolishing of an area $A_p$ of a substrate, wherein the process includes:
 a) providing a substrate having a surface having a metal comprising copper which is electrically connected to the positive terminal of a substantially DC electrical power supply;
 b) providing a low-conductivity fluid comprising water and having a conductivity of less than about $1 \times 10^{-4}$ S/cm to at least a part of the surface $A_p$;
 c) providing a cathode half-cell comprising:
  a cathode which is electrically connected to the negative terminal of a substantially DC electrical power supply,
  a cation-selective ion-conducting membrane having interior and exterior sides, wherein the membrane does not contact the cathode, and
  a conductive electrolyte having a conductivity greater than about $1 \times 10^{-1}$ S/cm in electrical contact with the cathode and with the interior side of the membrane; and
 d) movably contacting the wetted surface of the substrate over the area $A_p$ with the exterior surface of the membrane while imposing a voltage V between the cathode and the substrate sufficient to form a current "i" between the cathode and the metal on the surface, thereby electro-polishing copper from the substrate surface, wherein the ratio "n" of the current to the copper removal rate is greater than about 3.5 electrons per atom of copper, wherein the contact area between the membrane and the substrate surface is $A_c$ and the force $F_z$ exerted by the cathode half-cell on the substrate is greater than 0, and wherein the current density $i/A_c$ is greater than about 500 mA/cm².

Another aspect of the invention is a process of membrane mediated electropolishing of an area $A_p$ of a substrate, wherein the process includes:
 a) providing a substrate having a surface having a metal comprising copper which is electrically connected to the positive terminal of a substantially DC electrical power supply;
 b) providing a low-conductivity fluid comprising water and having a conductivity of less than about $5 \times 10^{-4}$ S/cm to at least a part of the surface $A_p$;
 c) providing a cathode half-cell comprising:
  a cathode which is electrically connected to the negative terminal of a substantially DC electrical power supply,
  a cation-selective ion-conducting membrane having interior and exterior sides, and
  a conductive electrolyte in electrical contact with the cathode and with the interior side of the membrane; and
 d) movably contacting the wetted surface of the substrate over the area $A_p$ with the exterior surface of the membrane while imposing a voltage V between the cathode and the substrate sufficient to form an ionic current "i" between the cathode and the metal on the surface, thereby electro-polishing copper from the substrate surface, wherein the contact area between the membrane and the substrate surface is $A_c$ and the force $F_z$ exerted by the cathode half-cell on the substrate is greater than 0, and wherein the tool pressure $F_z/A_p$ is less than 5 psi and the average removal rate of copper from the area $A_p$ is greater than about 500 nm per minute.

The process in each embodiment is improved if the conductivity of the low-conductivity fluid is less than 50 µS/cm, preferably less than 20 µS/cm, for example between about 0.1 µS/cm and about 10 µS/cm. The process in each embodiment is improved if the conductivity of the conductive electrolyte is greater than 0.1 S/cm, preferably greater than 0.3 S/cm.

The process of each embodiment is improved if the ratio $A_c/A_p$ is 0.02 or higher, preferably 0.03 or high, for example greater than about 0.05. The process of each embodiment is improved if the ratio $A_c/A_p$ is 0.4 or less, preferably 0.2 or less, for example less than about 0.15. While the polishing half-cell may have an extent substantially greater than the total area of the substrate, the area $A_c$ is the area of the membrane contacting the surface $A_p$ at any one time.

The process described in each embodiment is a preferred process if the stoichiometric number n is sufficient to prevent precipitation of copper oxide, copper hydroxide, and copper carbonate on the substrate and in the low-conductivity fluid. In each embodiment, it is advantageous if the stoichiometric number n, representing the ratio between the current i and the rate of metal removal, is between about 3.9 and about 8.5 electrons/atom Cu, for example between about 4.1 and about 8 electrons/atom Cu electropolished from the substrate surface, alternately between about 4.5 and about 7.5 electrons/atom Cu electropolished from the substrate surface.

In each embodiment, it is advantageous when the voltage V is greater than 12 V, preferably greater than 14 V. In each embodiment, it is advantageous if the slope dI/dV of a polarization curve at the voltage V is at least twice the average slope of the polarization curve from 3 Volts to 7 Volts. In each embodiment, it is advantageous if the slope dI/dV at V has a positive second derivative. In each embodiment, it is advantageous if the copper RR is equal to or greater than 500 nm/min, preferably greater than about 700 nm/min, more preferably about 800 nm/min or greater. In each embodiment, it is advantageous if the current density is between about 0.8 A/cm$^2$ and 4 A/cm$^2$, preferably between about 1 A/cm$^2$ and 3.5 A/cm$^2$, for example between about 1.5 A/cm$^2$ and 2.5 A/cm$^2$. In each embodiment, it is advantageous if the slope dI/dV is greater than about 75 mA/cm$^2$ per volt, preferably greater than 100 mA/cm$^2$ per volt, more preferably greater than 150 mA/cm$^2$ per volt.

In each embodiment, it is advantageous if the current density I increases when the interfacial velocity v is increased by 20%. In each embodiment, it is advantageous if the voltage is greater than about 15 volts and if the interfacial velocity is sufficiently high so the polishing apparatus does not squeak. In each embodiment, it is advantageous if, defining the current density $I_{sq}$ as the lowest current density where electropolishing results in an audible squeaking sound, the electropolishing is performed at a maximum current density which is below $0.9I_{sq}$. In each embodiment, it is advantageous if the voltage is greater than about 16 volts and if the interfacial velocity is greater than about 40 cm/sec. In each embodiment, it is advantageous if the voltage is greater than about 12 volts and if the dwell time is less than about 25 milliseconds, preferably less than about 16 milliseconds, for example between about 6 milliseconds and about 14 milliseconds. In each embodiment, it is advantageous if the current density I is greater than about 1.5 A/cm$^2$ and if the velocity is such that the maximum uninterrupted time a portion of the substrate surface $A_p$ is covered by the membrane is less than about 0.2 seconds, for example wherein I is greater than greater than about 2 A/cm$^2$ and wherein the velocity is such that the maximum time a portion of the substrate surface is covered by the membrane is less than about 14 milliseconds.

In each of the above processes, the preferred substrate is a copper damascene wafer for the fabrication of integrated circuits. The process of each embodiment can be improved if the tool pressure, $P_T=F_z/A_p$, is less than about 5 psi, preferably less than about 2.5 psi, for example between about 0.2 psi and about 2 psi. Further, the ratio $A_c/A_p$ is preferably between about 0.03 and 0.25, for example between about 0.05 and 0.25, sush that the contact pressure $F_z/A_c$ is thereby limited in proportion to the limit on $P_T$. In each embodiment, it is advantageous if the drag force $F_d$ of the membrane moving over the wetted substrate surface is less than one half, preferably less than one quarter, for example less than one sixth, the normal force $F_z$ exerted by the cathode half cell on the substrate.

In a preferred embodiment, I is greater than or equal to about 1A/cm$^2$, n is greater than or equal to about 4, and the contact area of membrane to surface versus area to be polished ($A_c/A_p$) is greater than or equal to about 0.03, for example wherein I is greater than 1 A/cm$^2$, n is between about 4.5 and about 7, $P_c=F_z/A_c$ is less than 5 psi, and $A_c/A_p$ is greater than 0.03. This is especially true if the substrate comprises low-k dielectric material, in which case $F_z/A_c$ is preferably less than 5 psi, and $P_T$ is preferably less than 1 psi.

In less preferred but still operative embodiments, the substrate is membrane-mediated electropolished under conditions such that the interfacial velocity between the membrane and the substrate is between about 15 cm/sec and about 27 cm/sec, and such that the voltage V the current density I increases at a rate between about 50 mA/cm$^2$ and 100 mA/cm$^2$ per volt.

Another aspect of the invention is a product by process, wherein the substrate (product) is a Cu-plated damascene wafer in the manufacture of integrated circuits. We believe a wafer polished by the claimed processes will differ from wafers polished by conventional chemical-mechanical polishing in one or more of the following:

1) the dielectric layer has substantially no loss of thickness from the Cu polishing process, e.g., less than 5 angstroms, alternately less than 2 angstroms, when the copper is polished from the substrate;

2) there are substantially no scratching and particulate defects on the polished surface after polishing, which affect component reliability; and 3) there is substantially no damage to, or alteration of, materials in the substrate, e.g., dielectric materials, metal layers, and the like, which are observed after the substrate is polished with a conventional chemical-mechanical polishing slurry.

FIGURES

The descriptions herein can be more readily understood when read with reference to the following Figures.

Figure 10A:
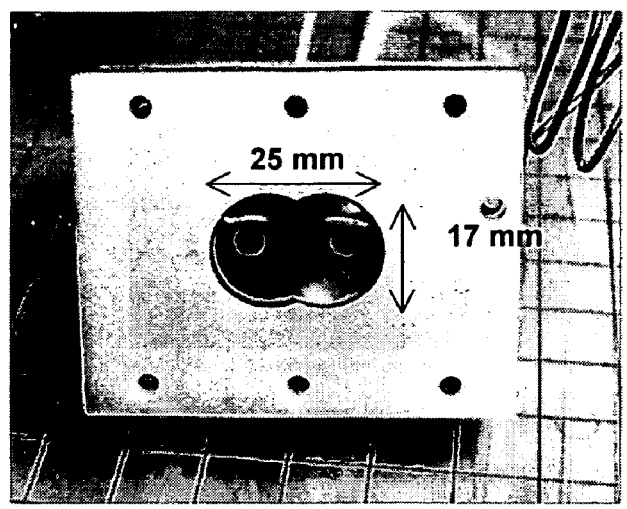
Figure 10B:
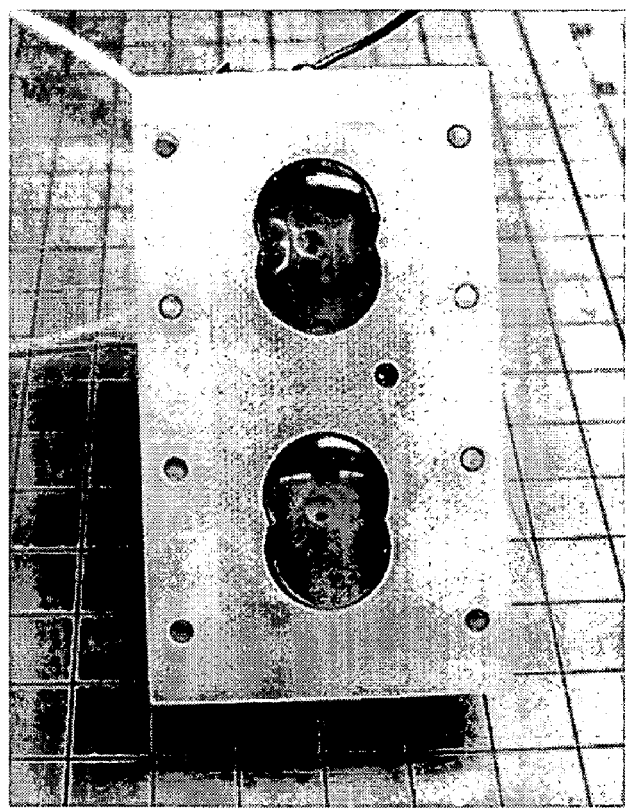
Figure 11A:
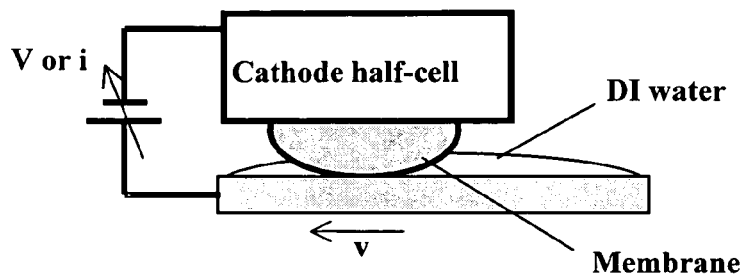
Figure 11B:
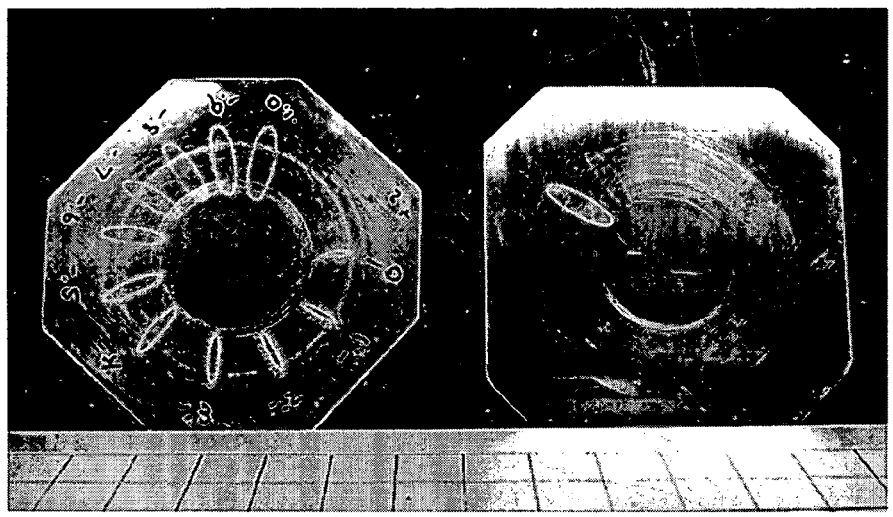
Figure 11C:
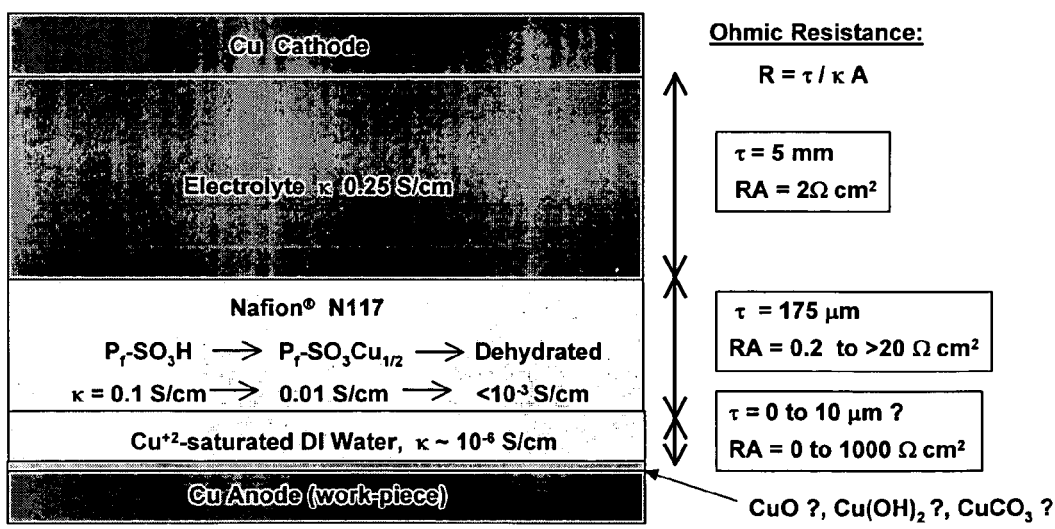
Figure 13:
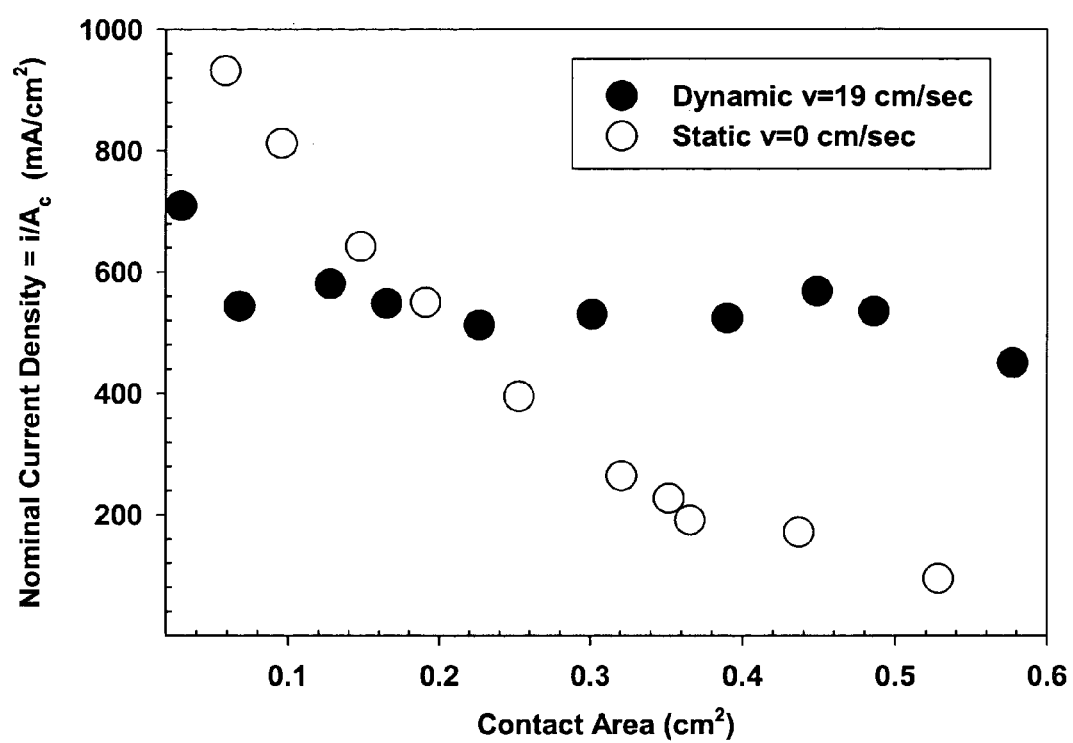
Figure 14A:
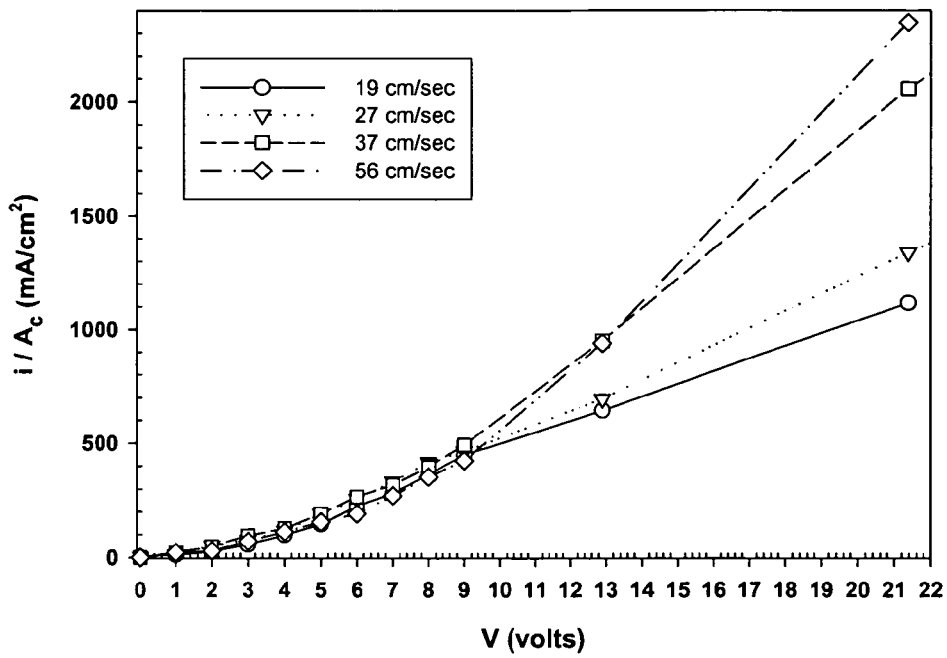
Figure 14B:
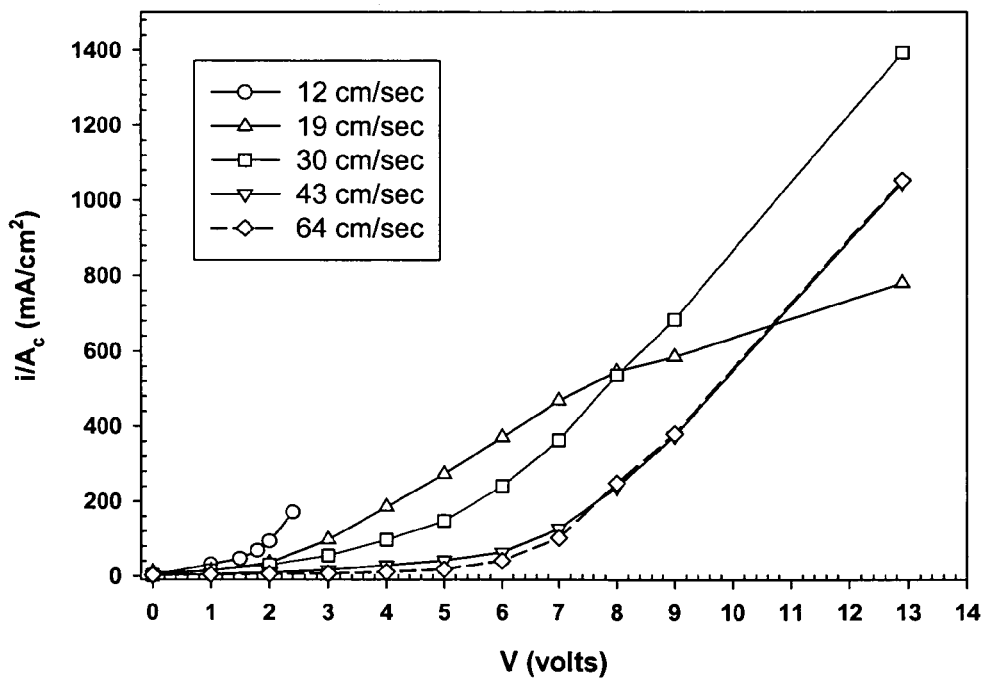
Figure 15:
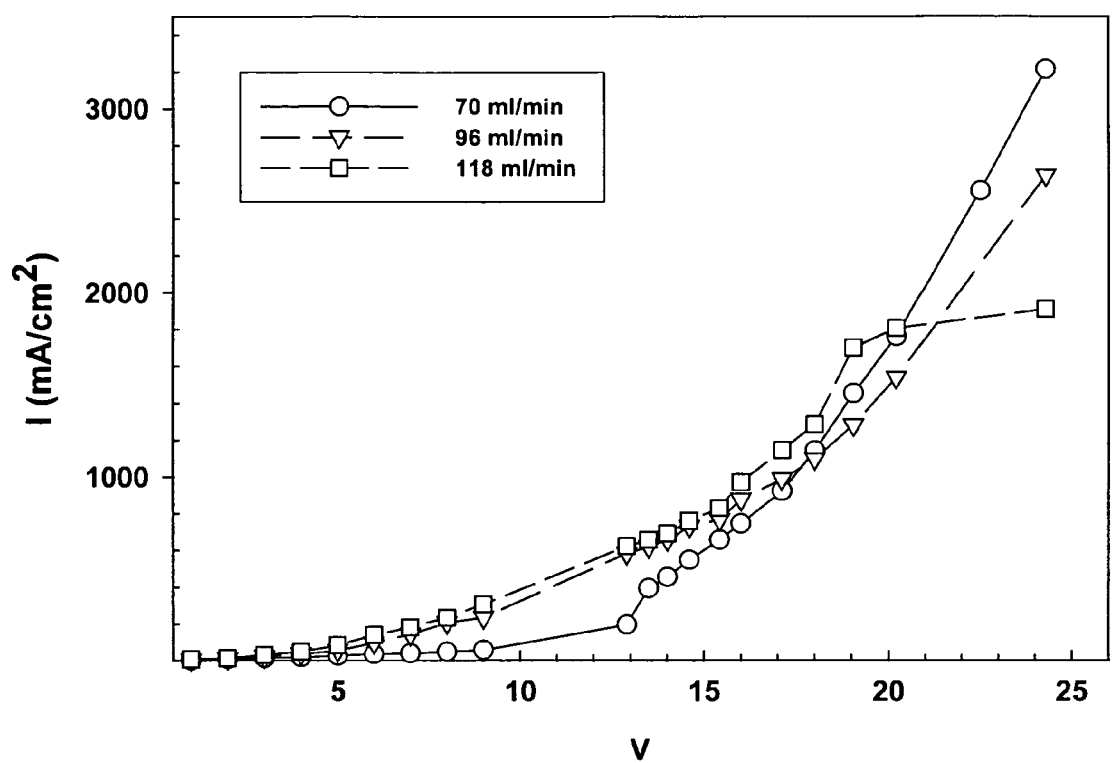
Figure 16A:
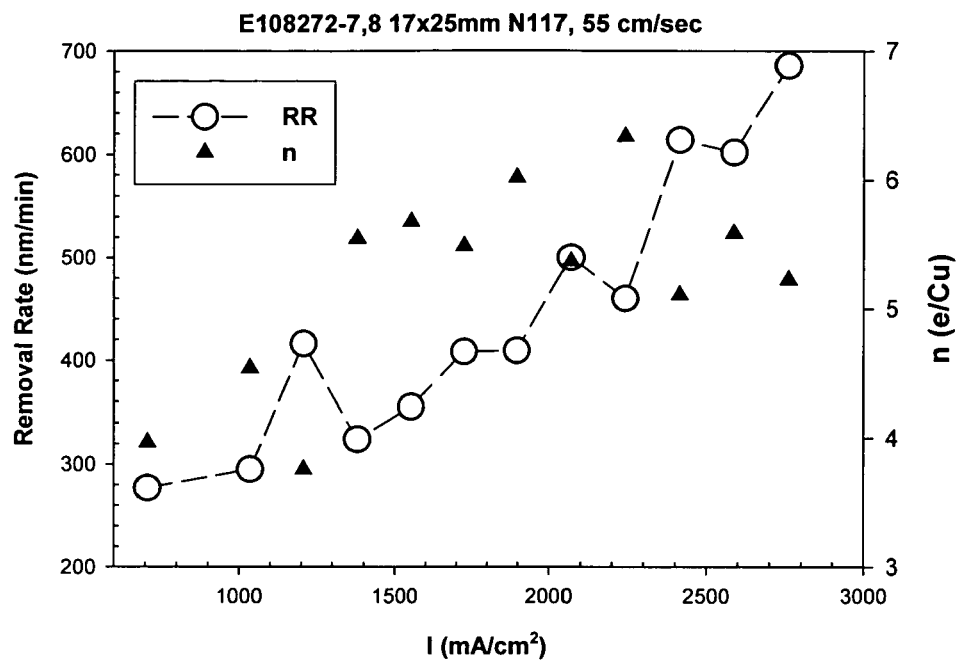
Figure 16B:
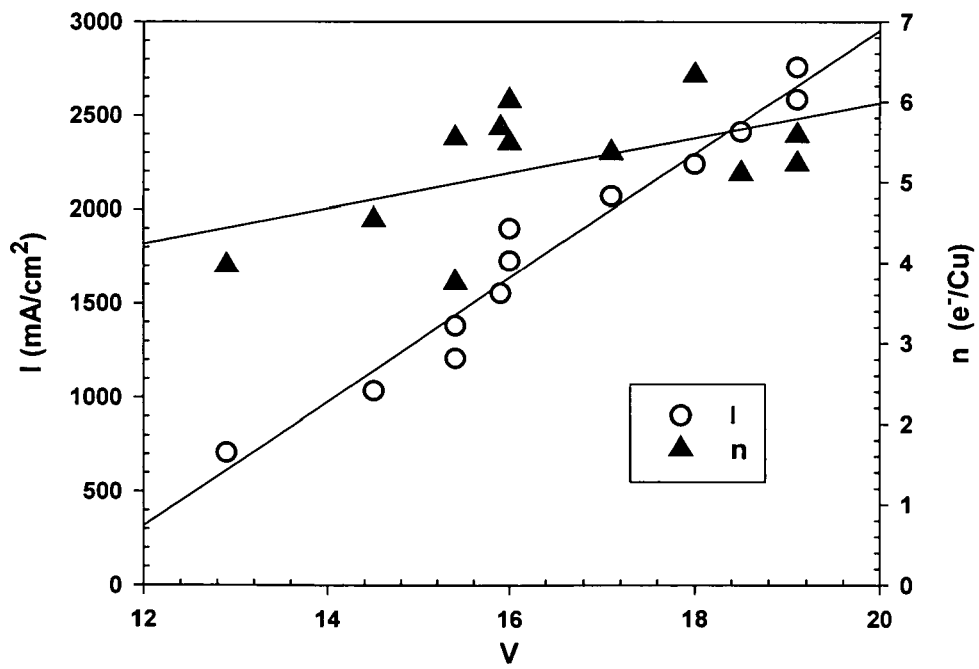
Figure 16C:
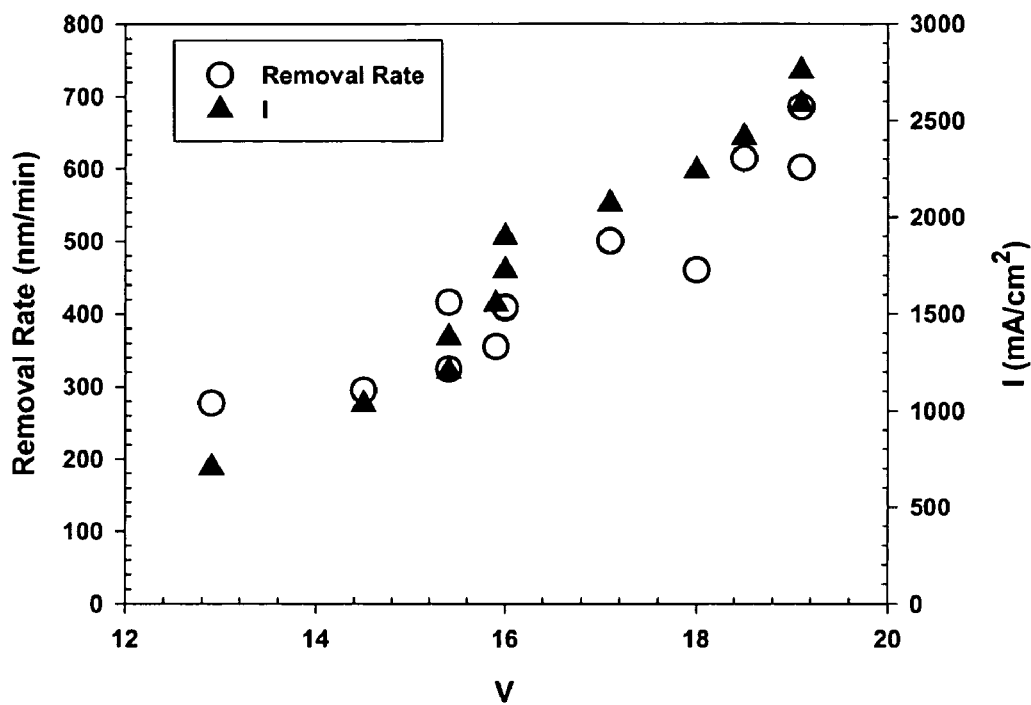
Figure 17:
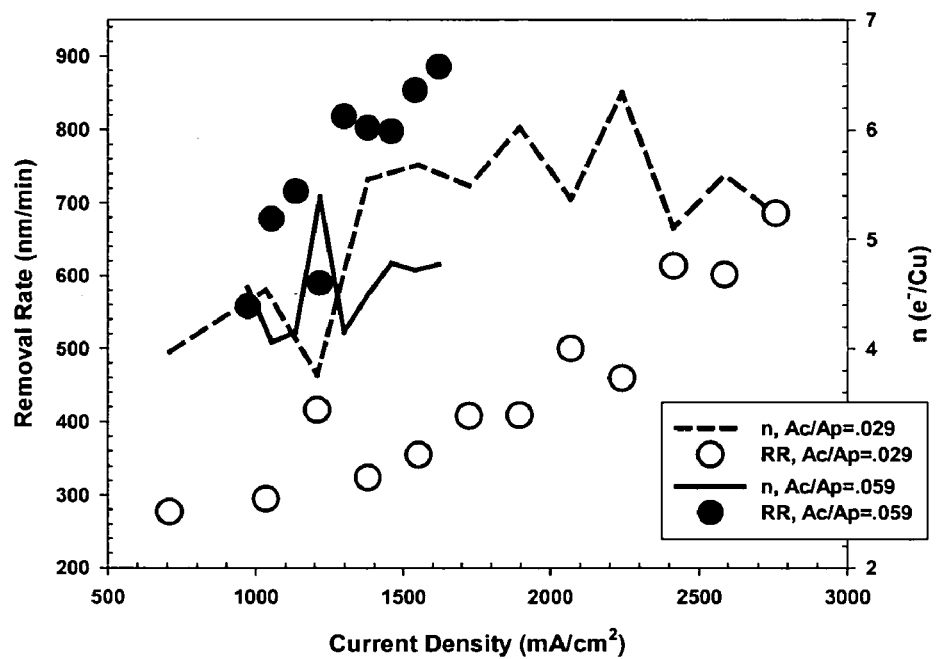
Figure 18C:
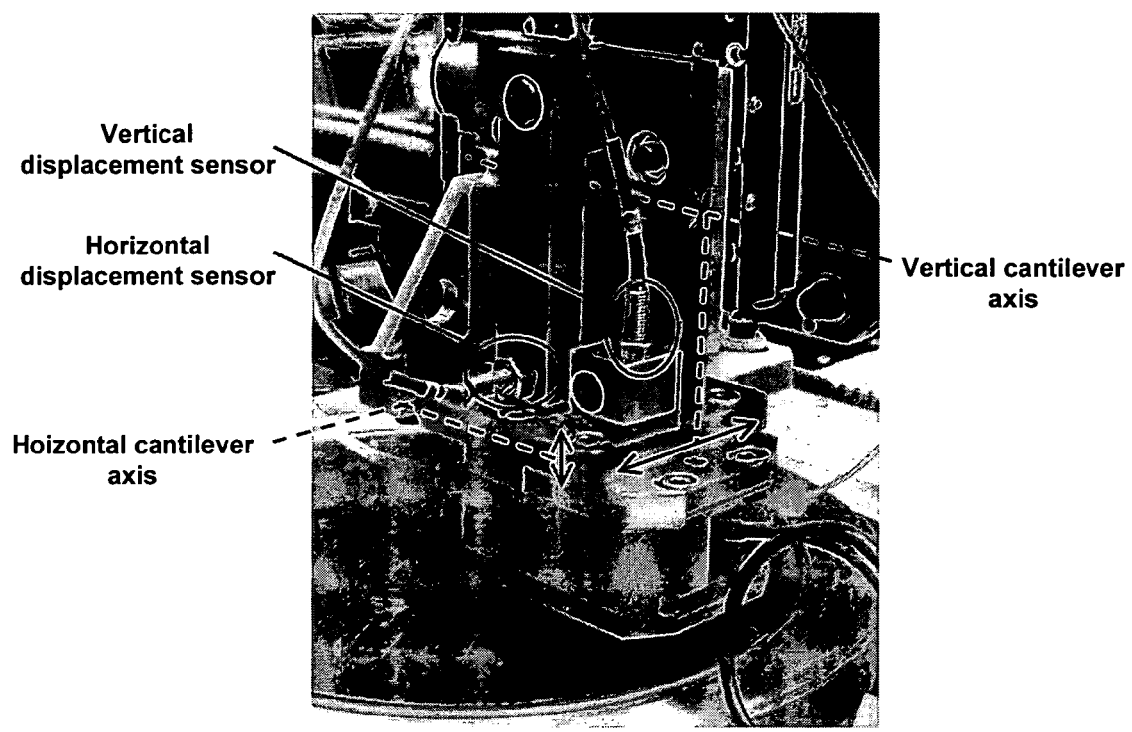
Figure 19:
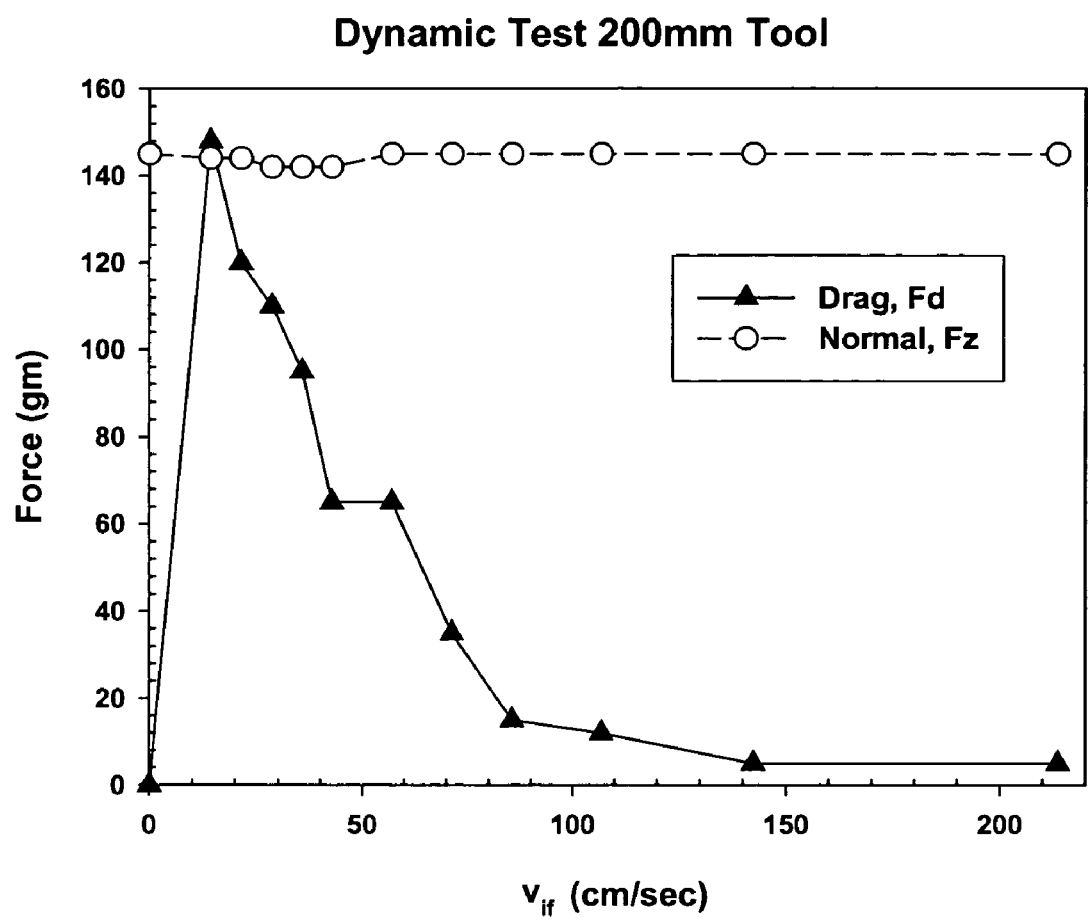
Figure 20A:
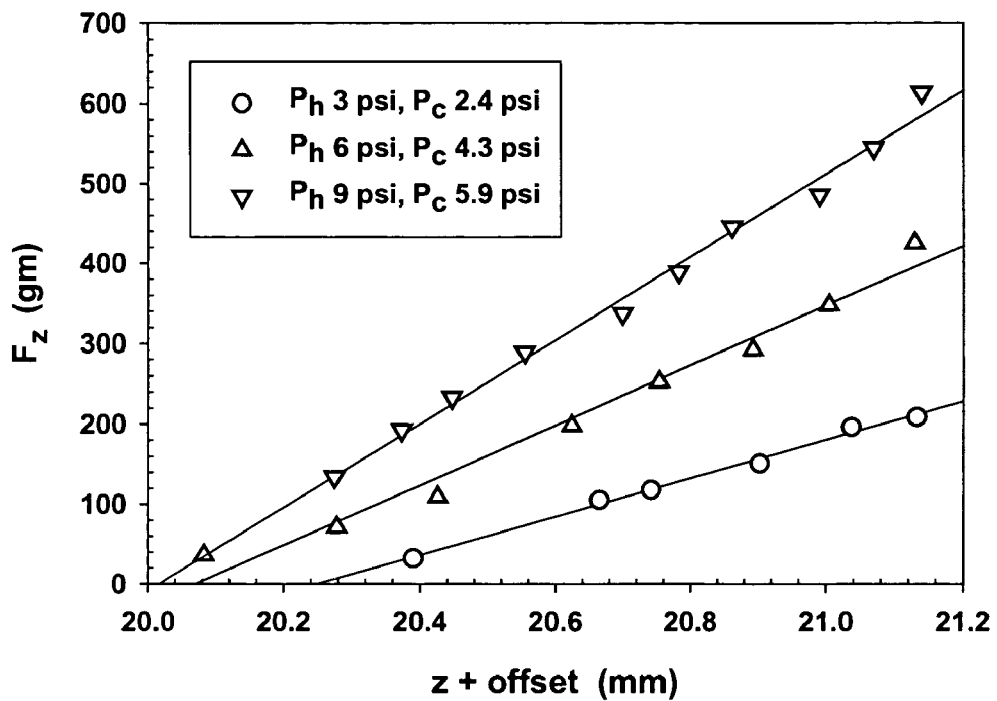
Figure 20B:
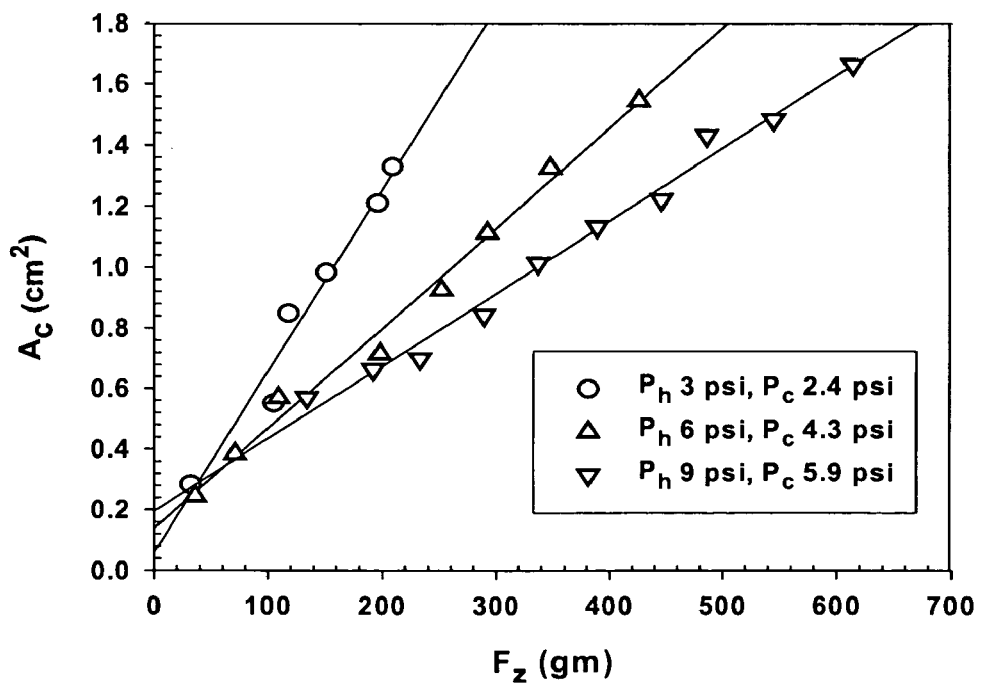
Figure 21:
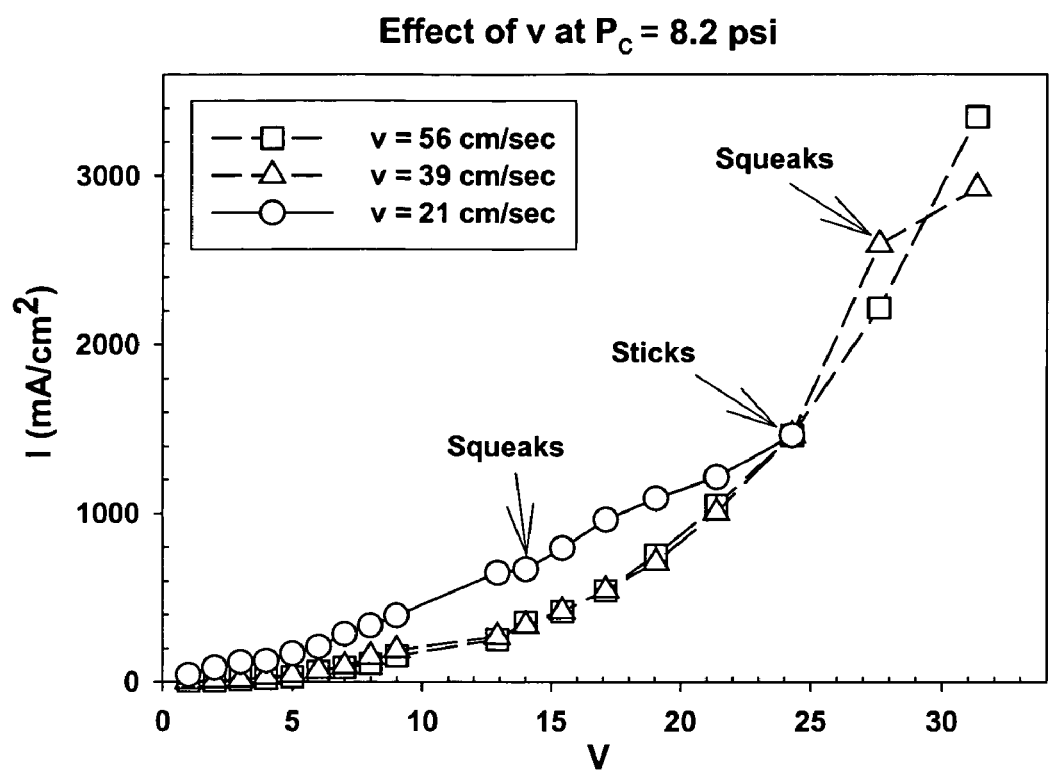
Figure 22:
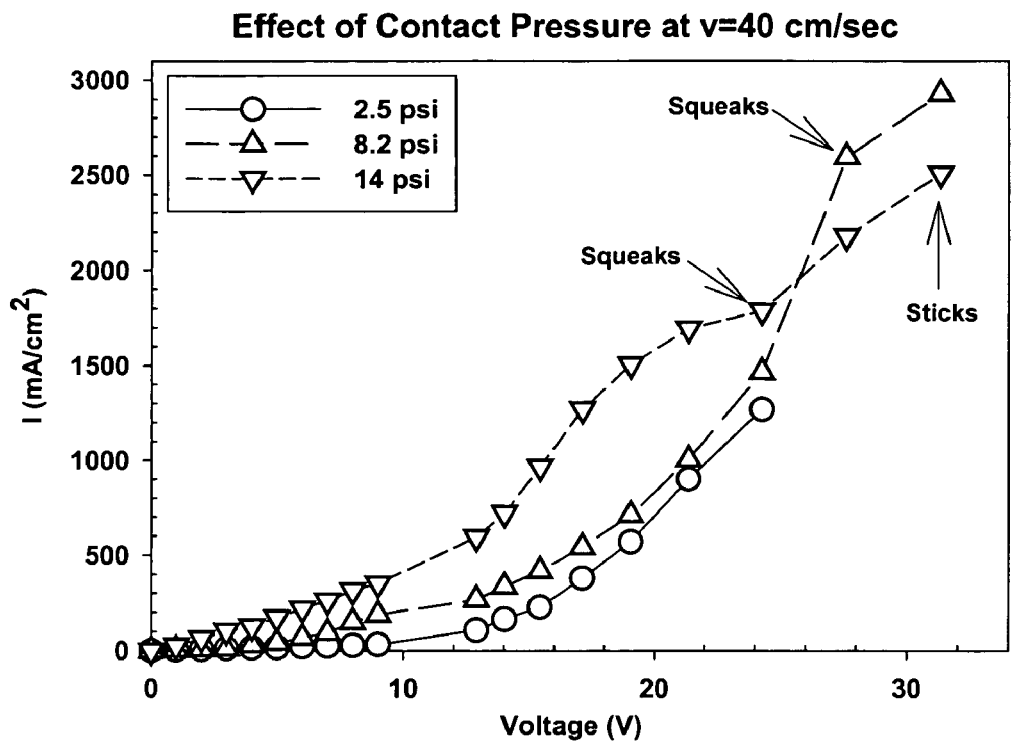
Figure 23A:
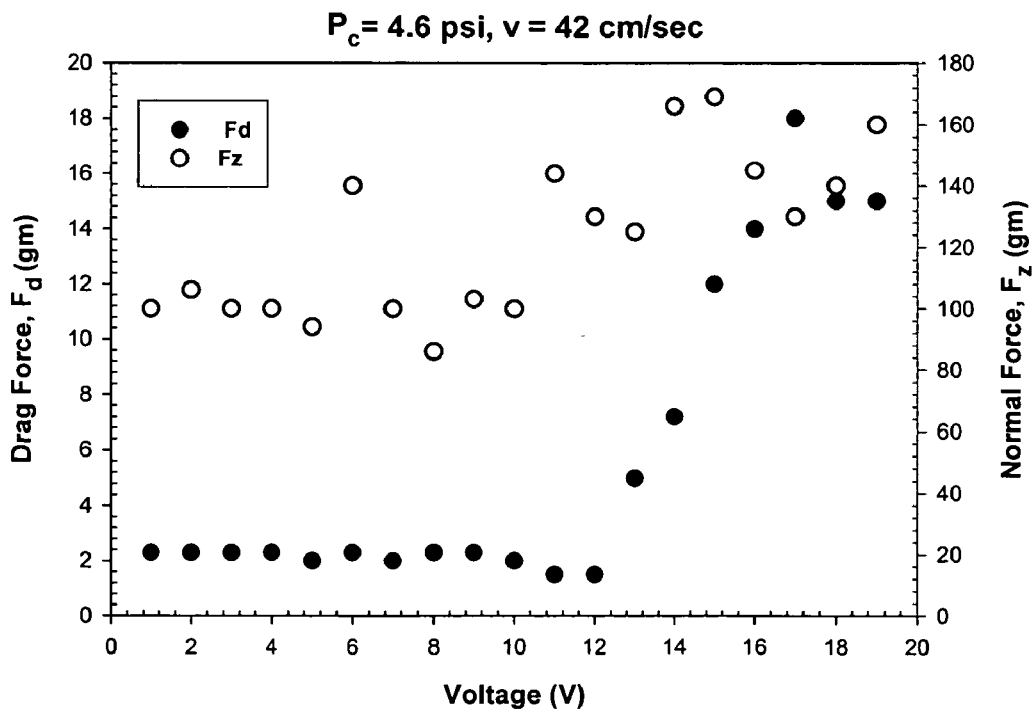
Figure 23B:
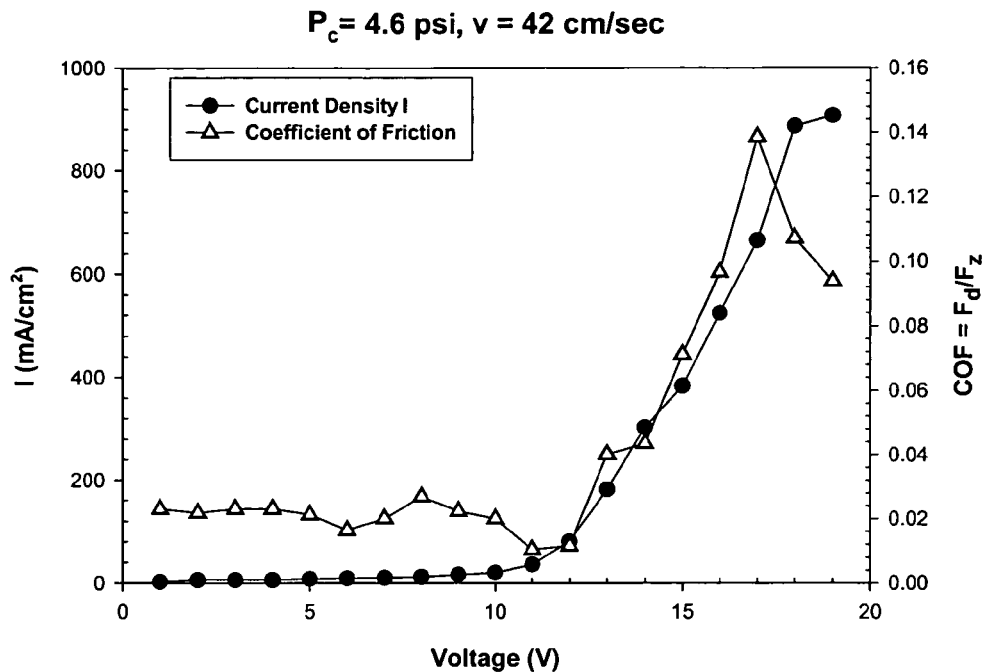
Figure 23C:
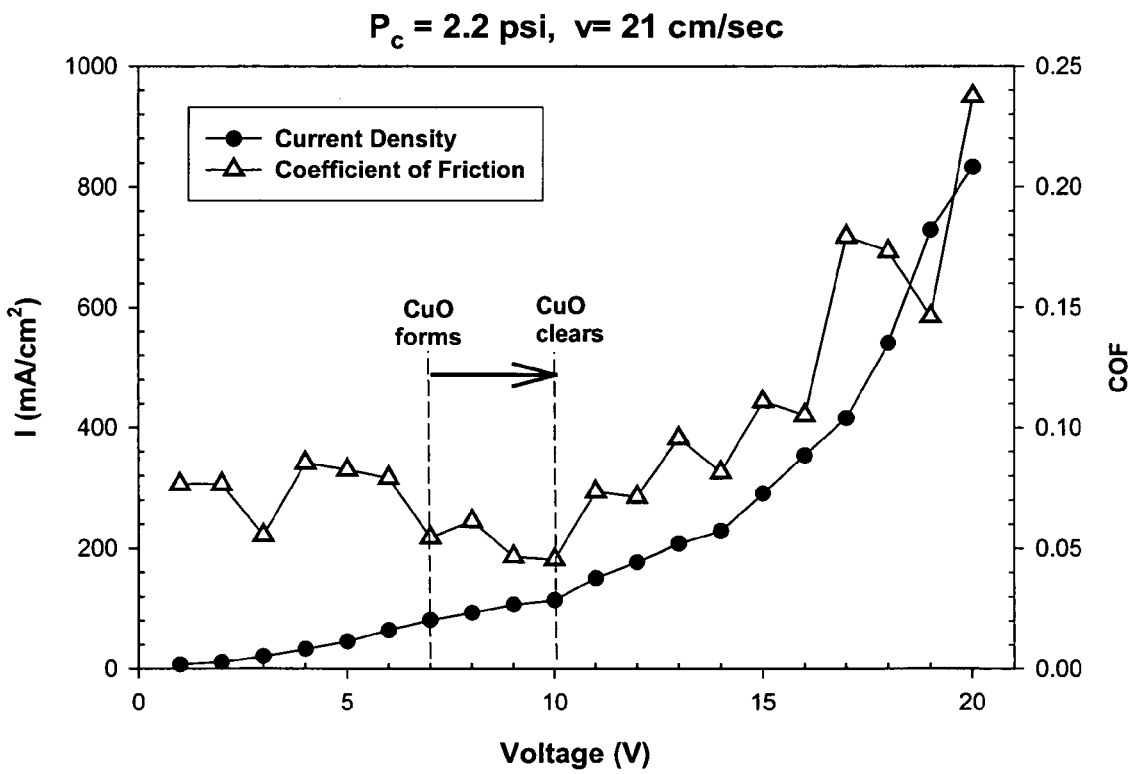

FIG. 10-A shows a bottom view of a single-window cathode half-cell, and FIG. 10-B shows a bottom view of a double-window cathode half-cell;

FIG. 11-A shows a schematic illustration of MMEP operating parameters;

FIG. 11-B shows an examples of a Cu coupon showing variations in elliptical contact areas obtained after static polishing at values of z ranging from 0 to −1.0 mm;

FIG. 11-C shows a schematic of approximate ionic conductivity and thickness for phases intervening between the anode (substrate) and the cathode, where for each indicated layer thickness, the resulting ohmic resistance is calculated for a 1 cm$^2$ contact area;

FIG. 12-A shows an exemplary schematic illustration of the relationship between contact area $A_c$ and process area $A_p$ for a single-window half-cell;

FIG. 12-B shows a graph of the effects of normal displacement z of an exemplary elliptical half-cell from the substrate, such as made the marks of FIG. 11-B, on the both the long and short axis of the ellipse, and on the area contacted $A_c$;

FIG. 12-C shows the effect of normal displacement z of an exemplary elliptical half-cell from the substrate on current density and removal rate at 10V, for v=55 cm/sec;

FIG. 13 shows the effect of interfacial motion of the membrane over the substrate surface (v=0 and v=19 cm/sec) on the variation in nominal current density with contact area, at a low "prior art" applied voltage of 7.00V;

FIG. 14-A shows the variation of nominal current density with voltage for a single-window half-cell using a N117 Nafion® membrane with a thickness of 7 mil, at a variety of interfacial velocities from 19 to 56 cm/sec;

FIG. 14-B shows the variation of nominal current density with voltage for a single-window half-cell using an e-PTFE/Nafion® membrane with a thickness of 2 mil, at a variety of interfacial velocities from 12 to 64 cm/sec;

FIG. 15 shows the variation of nominal current density with voltage for a single-window half-cell using a 2 mil experimental Nafion®-type membrane supported on an expanded PTFE web, at a variety of interfacial velocities from 12 to 64 cm/sec;

FIG. 16-A shows the dependence of removal rate (RR) and stoichiometric number (n) on current density for single-window N117 Nafion® membrane half-cell at z=−0.40 mm, $A_c$=0.29 cm², $A_p$=9.9 cm², and v=55 cm/sec;

FIG. 16-B shows the dependence of I and n on voltage for the single-window half-cell experiment of FIG. 16-A;

FIG. 16-C shows the variation of removal rate and current density versus voltage for the single-window half-cell experiment of FIG. 16-A where $A_p$=9.9 cm²;

FIG. 17 shows the copper removal rate and stoichiometric number n of the single window half-cell experiment of FIG. 16 ($A_c/A_p$=0.029) and the same copper removal rate and stoichiometric number n from a dual-window half-cell experiment at z=−0.25 mm, $A_c$=0.617 cm², $A_p$=10.5 cm ($A_c/A_p$=0.059), normal load ~320 g, and v=55 cm/sec;

FIGS. 18-A, 18-B, and 18-C show an instrumented MMEP tool adapted for use on a 200 mm base and showing a cathode half-cell mounted on dual cantilever fixture, wherein displacements of the first cantilever are proportional to the z-axis (normal) force on the work piece, while displacements of the second cantilever are proportional to the interfacial drag force;

FIG. 19 shows measurements of normal and drag forces as a function of interfacial velocity for a single half-cell window where the static contact corresponds to z=−0.56 mm, and $A_c$=1.05 cm²;

FIG. 20-A shows the variation in the distance from a sensor on the half-cell to the substrate surface with normal load and hydrostatic pressure $P_h$ of the electrolyte;

FIG. 20-B shows the variation in contact area $A_c$ with normal load and hydrostatic pressure $P_h$ of the electrolyte;

FIG. 21 shows MMEP polarization data at various interfacial velocities with a N117 Nafion® membrane (⅞" round window) at $P_c$=8.2 psi, and $A_c$=0.319 cm²;

FIG. 22 shows MMEP polarization data at various $P_c$ with a N117 Nafion® membrane (⅞" round window) at v=40 cm/sec;

FIG. 23-A shows the effects of electrochemical polarization and mechanical parameters on the normal force and drag force of a membrane having a contact pressure of 4.6 psi and a velocity of 42 cm/sec, where the normal force $F_z$ was set at about 100 grams, and then the voltage was increased from 1 V to 19V;

FIG. 23-B shows the current density I and the coefficient of friction $F_d/F_z$ for the experiment shown in FIG. 23-A; and FIG. 23-C shows the effects of electrochemical polarization and mechanical parameters on the current density I and the coefficient of friction $F_d/F_z$ for an experiment run at contact pressure of 2.2 psi and velocity of 21 cm/sec.

DEFINITIONS

The following abbreviations are used extensively throughout the disclosure.

$P_c$, in psi, is the contact pressure $F_z/A_c$;

n, in e⁻/Cu, is the number of electrons consumed by the process to polish an atom of copper from a substrate surface;

i, in amps, is the current between the cathode and the substrate

I, in amps/cm², is the current density equal to $i/A_c$;

V, in volts, is the voltage applied between the cathode and the substrate;

v, in cm/sec, if the velocity of the membrane relative to the substrate surface;

dwell time, in milliseconds, is the average width of the contact area $A_c$ measured in the direction of v, divided by the velocity v;

$P_T$, in psi, also called the tool pressure, is the force exerted by the cathode half cell normal to the wafer divided by the total area to be polished, equal to $F_z/A_p$;

$P_h$, in psi, is the hydrostatic pressure of the electrolyte within the cathode half-cell, which is approximately equal to $P_c$;

$P_c$, in psi, is the normal force exerted by the cathode half-cell on the substrate per unit area of contact, equal to $F_z/A_c$.

$A_c$, in cm², is the contact area between the membrane and the substrate surface;

$A_p$, in cm², is the total polished area of the substrate surface;

z, in mm, is the displacement of the half-cell body from the substrate surface, where at z=0 corresponds to the limit at which the membrane first contacts the substrate surface;

$F_z$, in gm, is the normal force exerted by the membrane on the substrate;

$F_d$, in gm, is the drag force exerted by the membrane on the substrate;

COF is the coefficient of friction, COF=$F_d/F_z$;

RR, in nm/min, is the metal removal rate resulting from the membrane mediated electropolishing process, averaged over the entire polished area;

Δm, in g, is the mass lost from the substrate for any given period of polishing;

ρ is the density, which for Cu is 8.92 g/cm³;

$V_m$, in cm³/mole, is the molar volume, which for Cu is 7.135 cm³/mole;

F is Faraday's constant (9.65×10⁴ coulomb/mole); and

Q, in coulombs, is the total amount of charge passed for a given period of polishing.

DETAILED DESCRIPTION OF THE INVENTION

The various embodiments of the invention are described herein with reference to the Figures, as appropriate. No Figures are needed to convey the invention, but the Figures are provided for illustrative purposes.

Method Of Membrane Mediated Electropolishing: In one embodiment, the invention comprises a method of membrane-mediated electropolishing of a work piece (8) having a surface comprising a metal, the method comprising or consisting essentially of:

A) providing the work piece (8) covered with a low-conductivity fluid (9), wherein the work piece is in electrical contact with a first outlet of a substantially DC electrical power source having first and second power terminals (not shown);

B) substantially and movably contacting the work piece covered with a low-conductivity fluid with a first side of an ion-conducting membrane (4), wherein a second side of the ion-conducting membrane contacts a conductive electrolyte composition (5);

C) electrically contacting the conductive electrolyte composition (5) with a cathode (6), wherein the cathode is electrically connected to the second outlet of the substantially DC electrical power source; and D) imposing an electric current between the work piece and the cathode, wherein the current flows through the conductive electrolyte composition, the membrane, and the low-conductivity fluid, thereby electropolishing metal-containing ions from the surface of the work piece, and wherein at least a majority of metal-containing ions pass through the ion conductive membrane and into the conductive electrolyte composition.

The necessary difference between the low-conductivity fluid and the conductive electrolyte is the conductivity, and therefore the concentration of ionic species within each fluid. Advantageously, the conductive electrolyte composition has a conductivity equal to or greater than about 5 mS/cm, preferably equal to or greater than about 30 mS/cm, and the low-conductivity fluid has a conductivity equal to or less than about 500 µS/cm, preferably equal to or less than about 100 µS/cm. Advantageously, in every embodiment of the invention described herein, the conductive electrolyte composition does not contact the work piece. This implies that the ion conductive membrane is substantially impermeable to the ions in the electrolyte, regardless of whether the conductive electrolyte is solubilized in a fluid similar to or the same as the low-conductivity fluid.

Advantageously, the voltage is varied for various metals, but the voltage range between 1V and 50V is useful. Current densities between 50 and 4000 mA/cm$^2$, preferably 200 to 2500 mA/cm$^2$, are commercially useful. At high current densities, a high value of n is advantageously maintained, e.g., n is greater than 3.5 moles of electrons per mole of copper electropolished when the current density is above about 500 mA/cm$^2$. Lower values of n, e.g., can be advantageous at lower current densities, e.g., n is between about 2 to about 3 moles of electrons per mole of copper electropolished when the current density is below about 400 mA/cm$^2$.

Advantageously, in every embodiment of the invention described herein, there is no ion exchange material disposed between the cathode and the work piece that substantially captures the metal-containing ions. As used herein, the term "ion exchange material" means a material that captures metal ions, releasing other ions such other metals (other than the ions captured) or H$^+$. Ion exchange material, as is known in the art, has a limited capacity to captures the metal ions, and can become saturated with the ions. In contrast, the ion-conducting membrane used in preferred embodiments of this invention allows selected ions to migrate therethrough, but does not substantially capture and hold these ions. Thus, the quantity of metal ions removed in embodiments of the invention may be more than 1000 times greater than the exchange capacity of the membrane used.

Advantageously, in most embodiments of the invention described herein, there is an inlet and an outlet on the cathode half cell allowing the conductive electrolyte composition to be circulated through the cathode half cell, and optionally but advantageously a method and apparatus to de-gas the electrolyte composition, remove particulates from the electrolyte composition, add or remove selected constituents of the electrolyte composition which may be generated, exhausted or accumulated during electropolishing to adjust temperature, and/or control the pressure within the cathode half cell.

Advantageously, in most embodiments of the invention described herein, there is source and a flow path (not shown) for introducing low-conductivity fluid between the work piece and the membrane during electropolishing, and also optionally of pretreating the low-conductivity fluid to de-gas the low-conductivity fluid, remove particulates from the low-conductivity fluid, and/or to control the rate of flow of the low-conductivity fluid.

Advantageously, the method includes providing low-conductivity fluid at the interface of contact of the membrane and the work piece, wherein preferably the source of low-conductivity fluid supplies low-conductivity fluid both outside contact area between the membrane and the work piece, and within the contact area between the membrane and the work piece.

In some embodiments of this invention, there may be a plurality of membranes and an accompanying plurality of electrolyte compositions within the half cell, so long as the electrolyte is in electrical contact with the cathode and with the membrane.

In most embodiments of this invention, the ion-conducting membrane is a charge-specific ion-conducting membrane adapted to allow transport therethrough of positively charged ions or negatively charged ions, but not both.

In a more detailed embodiment, the invention comprises a method of membrane-mediated electropolishing comprising or consisting essentially of:

providing a cathode half-cell comprising or consisting essentially of:

a fully or partially enclosed volume, cavity or vessel;

an electrolyte solution or gel which partially or essentially fills the enclosed volume, cavity or vessel;

a cathode in contact with the electrolyte solution or gel;

a connector electrically connecting the cathode to a DC power source;

a charge-selective ion-conducting membrane which seals one surface of the enclosed volume, cavity or vessel in such a way that the internal surface of said membrane contacts the electrolyte solution or gel and the external surface is accessible to contact the metal work piece and a low-conductivity solvent or solution; and optionally a pump connected to an inlet and an outlet of the half cell and adapted to circulate the electrolyte composition between the enclosed volume, cavity or vessel and a second apparatus, wherein the second apparatus is adapted to change one or more of the temperature of the electrolyte composition, the composition of the electrolyte composition, or the pressure of the electrolyte composition within the enclosed volume, cavity or vessel;

substantially covering a surface of a metal work piece with the low-conductivity solvent or solution;

providing a source of DC electrical power connected to the cathode and to the work piece, e.g., with the positive terminal connected to the metal work piece and the negative terminal connected to the cathode in the half-cell; and movably contacting the metal work piece with at least a portion of the external surface of the membrane, thereby causing an electrical current to flow between the work piece and the cathode, and metal ions to be electropolished from the work piece.

In another embodiment, the invention comprises a method of membrane-mediated electropolishing of a work piece having a surface comprising a metal, e.g., a semiconductor substrate, said method comprising or consisting essentially of:

providing the work piece, wherein the work piece comprises a metal-containing surface, and wherein said surface is electrically connected to a first terminal of an electrical power source and is substantially covered with a low-conductivity fluid;

providing a cathode half-cell comprising or consisting essentially of:

a cathode electrically connected to a second terminal of an electrical power source and also electrically connected to a conductive electrolyte composition;

a charge-selective ion-conducting membrane having first and second sides, wherein the second side contacts the electrolyte composition and the first side is adapted to movably contact the work piece and the low-conductivity solvent or solution;

optionally a pump connected to an inlet and an outlet of the half cell and adapted to circulate the electrolyte composition between the enclosed volume, cavity or vessel and a second apparatus, wherein the second apparatus is adapted to change one or more of the temperature of the electrolyte composition, the composition of the electrolyte composition, or the pressure of the electrolyte composition within the enclosed volume, cavity or vessel; and providing a source of low-conductivity fluid adapted to continuously add low-conductivity fluid between the membrane and the work piece;

providing a source of DC, pulsed, or reversible electrical power from the electrical power source with a sufficient voltage to electropolish the work piece surface, such that at least a portion of the metal removed from the work piece surface migrates through the charge-selective ion-conducting membrane and into the electrolyte composition.

Advantageously the source of low-conductivity fluid supplies low-conductivity fluid outside the contact area such that this fluid is carried into the contact area by translation of the contact area, or by contacting by creating new areas between non-contacting areas, and/or by diffusion of fluid from the periphery of the contact area. This above embodiment also allows for a plurality of membranes and an accompanying plurality of electrolyte compositions within the half cell.

In a another embodiment, the invention comprises a method of membrane-mediated electropolishing of a work piece having a surface comprising a metal, e.g., a semiconductor substrate, said method comprising or consisting essentially of:

providing a cathode half-cell comprising or consisting essentially of:

a cathode electrically connected to a terminal, e.g., the negative terminal, of an electrical power source and electrically connected to a half-cell fluid, wherein the half-cell fluid is adapted to carry electrical current between the cathode and a semipermeable membrane and to remove metallic ions from the membrane; and a semipermeable membrane having first and second sides, wherein the first side contacts the half-cell fluid and the second side is adapted to movably contact or be placed in very close proximity to a work piece and a low-conductivity fluid;

providing the work piece comprising a work piece surface comprising a metal, wherein said work piece surface is electrically connected to another terminal, e.g., a positive terminal, of the power source, wherein the work piece surface is substantially covered with the low-conductivity fluid and is in movable contact or in close proximity to the second side of the semipermeable membrane, and wherein the low-conductivity fluid is adapted to carry electrical current to the work piece by dissolving metallic ions from the work piece and carrying them through the semipermeable membrane; and providing a source of DC, pulsed, or reversible electrical power from the electrical power source with a sufficient voltage to electropolish the work piece surface, such that at least a portion of the metallic ions removed from the work piece surface migrates through the semipermeable membrane and into the half-cell fluid.

The term "half cell-fluid" for this last particular embodiment encompasses for example liquids, suspensions, gels, solutions, emulsions, and specifically includes low viscosity and higher viscosity compositions, and any mixtues thereof. The term semipermeable means the membrane is permeable to metal-containing ions generated from the work piece but is substantially impermeable to at least one component of the half-cell fluid. Advantageously, the half-cell fluid has a higher conductivity than does the low-conductivity fluid, for example at least a factor of 100 greater conductivity.

One advantage of MMEP over EP is its superior ability to reduce roughness and to planarize a surface. As detailed above, for features of large lateral dimensions ($\lambda$>10 microns) the planarization efficiency of MMEP is intrinsically much greater than that of EP under typical conditions with convected electrolyte, and is also much greater than for an ideal EP process with no convection. Moreover, convection is essential for most applications of EP because in the absence of convection, polishing is too slow and non-uniform to be of practical value. Moreover, under certain conditions MMEP is capable of planarizing Cu damascene wafers featuring humps and dishing in the plated topography without the use of additional means such as masking, or mechanical abrasion. At the same time, MMEP provides the advantage over EP and electromechanical polishing processes in that no strong acid electrolytes, metal salts, or abrasive particle contact the wafer.

MMEP is useful for polishing and planarizing work pieces of various compositions, including both pure metals and alloys. Accordingly MMEP has utility for many of the same metal finishing applications currently addressed by conventional EP. Moreover, MMEP can provide several practical advantages over EP for those applications and also for other applications such as planarization of copper damascene wafers where conventional EP suffers from intrinsic limitations as previously discussed.

For example, in MMEP, anodic dissolution occurs only at locations in contact with, or in close proximity to the cathode half-cell membrane so that polishing can be easily restricted to selected portions of the work piece. MMEP also requires only a small volume of electrolyte sufficient to fill the cell, and this may be much smaller than the volume required to polish an equivalent area of work piece by coating or immersion in conventional EP. Moreover, the work piece in MMEP never directly contacts the electrolyte solution, and essentially all metal ions produced by anodic dissolution are transferred across the membrane and into the half cell. Thus the work piece remains free of contamination by toxic and/or corrosive chemicals typical of EP electrolytes.

Under suitable operating conditions, virtually all of the metal ions generated in MMEP are captured by the cathode half-cell and plated onto the cathode, so that the amount of metal salts in the electrolyte remains constant. Consequently, MMEP consumes little or no chemicals and generates virtually no waste products.

Apparatus For Membrane Mediated Electropolishing: The invention also includes the apparatus adapted to perform the invention, the requirements of which are easily determined from the method. For example, for the first detailed method embodiment, this invention also provides an apparatus for use in membrane-mediated electropolishing of a metal work piece, comprising:

an electric, e.g., substantially DC, power source;
a means for electrically connecting the work piece to the positive terminal of the substantially DC electric power source, e.g., a connector;
an electrolyte composition, e.g., solution or gel;
a low-conductivity fluid, e.g., solvent or solution, which is in contact with the membrane and the work piece;
an ion-conducting, e.g., a charge-selective ion-conducting, membrane which seals one surface of the enclosed volume, cavity or vessel in such a way that the internal surface of said membrane contacts the electrolyte solution or gel and the external surface is accessible to contact the metal work piece and a low-conductivity solvent or solution;
a cathode which is in contact with the electrolyte solution or gel;
a means for connecting the cathode to the negative terminal of the DC electric power source, e.g., a connector; and
a means for moving the membrane in contact with the work piece and the low-conductivity solvent or solution along the surface of the work piece.

The above apparatus can optionally include a pump connected to an inlet and an outlet of the half cell and adapted to circulate the electrolyte composition between the enclosed volume, cavity or vessel and a second apparatus, wherein the second apparatus is adapted to change one or more of the temperature of the electrolyte composition, the composition of the electrolyte composition, or the pressure of the electrolyte composition within the enclosed volume, cavity or vessel. The above apparatus can optionally include a low-conductivity fluid source adapted to provide low-conductivity fluid between the membrane and the work piece. Such a source can be steady state, pulsed, or some combination thereof.

Cathode Half Cell: This invention also provides a cathode half-cell for use in membrane-mediated electropolishing. With respect to FIG. 3, the half cell comprises:

a fully or partially enclosed volume, cavity or vessel (5);
an electrolyte solution or gel which partially or substantially fills the enclosed volume, cavity or vessel (not shown);
a cathode (6) which is in contact with the electrolyte solution or gel;
a charge-selective ion-conducting membrane (4) which seals at least one surface of the enclosed volume, cavity or vessel, wherein the internal surface of the membrane is in contact with the electrolyte solution or gel; and
optionally inlet and outlet (7) for circulating the electrolyte solution or gel. The base may comprise a backplate (1), sides (3), a compression element (2) adapted to compress, hold, and seal the membrane (4) against the sides (3). The work piece (8) is substantially covered with low-conductivity fluid (9).

Another aspect of the invention relates to a new type of EP process whereby, in one embodiment, the work piece is physically separated from the electrolyte and cathode by a charge-selective ion-conducting membrane, wherein the membrane is essentially impermeable to the electrolyte solutes (and acids) but permeable to the ions produced by anodic oxidation of the work piece. Optionally, a layer of low-conductivity fluid also separates the work piece from the membrane. However, the thinner this layer is, the greater the efficiency of the process, and in some embodiments of the invention it is believed that the layer of low-conductivity fluid exists primarily within the pores of the membrane. This membrane-mediated electropolishing process (MMEP) is distinguished from conventional EP in that the work piece does not contact the electrolyte. Moreover, for planarizing surface features with lateral dimensions >10 microns, MMEP has proven to be much more efficient than EP and also much more efficient than a theoretically ideal EP process, as described by C. Wagner, *J. Electrochem. Soc.*, 101, 225 (1954), because MMEP is apparently governed by a different mechanism than EP.

For use in the first embodiment of this invention, a cathode half-cell is provided which can be a fully or partially enclosed volume, cavity or vessel. The half-cell contains a cathode in contact with an electrolyte solution or gel, and is sealed on at least one surface with a charge-selective ion-conducting membrane. Preferably, the electrolyte in the half-cell is maintained at a hydrostatic pressure greater than ambient atmospheric pressure, and the membrane is sufficiently flexible to expand under the influence of this pressure to establish a convex external surface (a "bulge" or "blister") extending beyond adjacent surfaces of the half-cell to contact work piece. A source of DC electrical power. is connected between the work piece (which functions as the anode) and the cathode in the cell (which functions as the cathode). Polishing is accomplished when a portion of the external surface of the ion-conducting membrane is brought into contact with a portion of the work piece otherwise covered by the low-conductivity solvent, and this area of contact is moved across the surface of the work piece. It is to be understood that in many applications of this process, the work piece can be held stationary and the membrane moved across its surface, or the half-cell can be held stationary and the work piece moved, or both the work piece and the half-cell can be in motion, provided that the area of contact is not static. Movement may consist of rubbing, sliding, or rolling the surface of one component over that of the other component. When a suitable voltage is applied between the anode and cathode under these conditions, some of the metal becomes oxidized to form solvated metal ions that migrate across the membrane into the half-cell.

Figure 3:
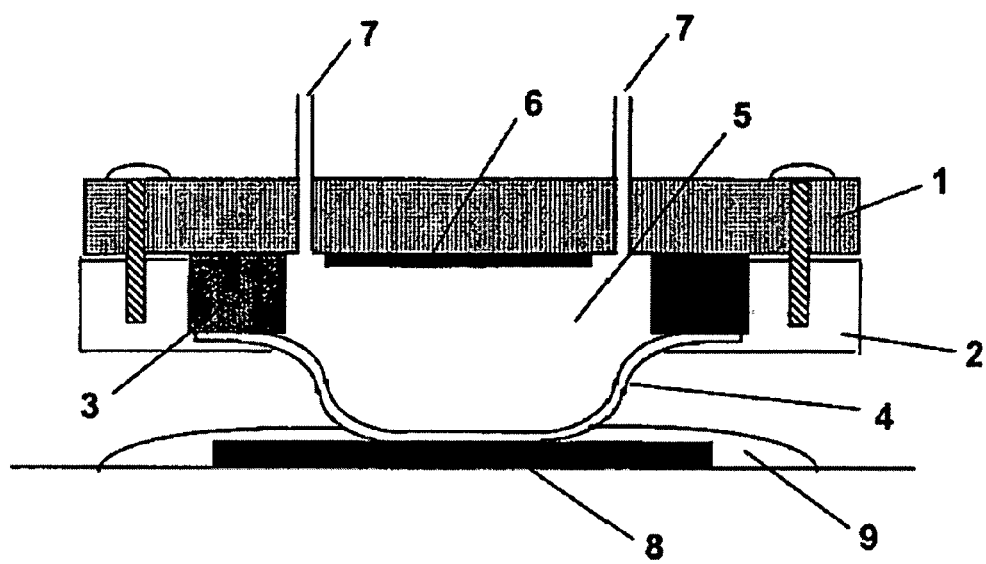
FIG. 3 is a schematic cross-section of an MMEP cathode half-cell in contact with a work piece immersed in a low-conductivity solvent.

A representative configuration of cathode half-cell and work piece is illustrated schematically in FIG. 3 and described in Example 1. FIG. 3 represents only one of many possible configurations that can be used in the process of this invention.

Low-conductivity Fluid: In every embodiment of the invention, a low-conductivity fluid is used to contact, e.g., cover, the work piece. The low-conductivity fluid serves to solvate the metal ions and facilitate their transport through the membrane, and also to limit the anodic dissolution reaction to areas of the work piece in contact with, or in close proximity to, the membrane. Electrical current flow between a cathode in the half cell and the work piece is a function of the resistances between the cathode in the half cell and the work piece. As described in U.S. Pat. No. 6,653,226, if the distance between a charged body and the work piece is both small and is filled with a low-conductivity fluid, then the distance will be a determinative guide to current flow.

Conductivity of the Low-conductivity Fluid: To so limit the anodic dissolution reaction, the electrical conductivity of the low-conductivity fluid advantageously is low, for example less than 1200 μS/cm, preferably less than 500 μS/cm, more preferably less than 200 μS/cm. Generally, the planarization efficiency of an MMEP process increases as the conductivity of the low-conductivity fluid decreases. The electrical conductivity of the low-conductivity fluid can be as low as 0.1 μS/cm, e.g., or the conductivity of ultrapure water. There is a tradeoff, however, as extremely low conductivity implies higher voltages and power consumption, and accompanying problems with gas generation and arcing. In one preferred embodiment, the electrical conductivity of the low-conductivity fluid is between about 0.5 μS/cm and about 150 μS/cm, for example between about 1 μS/cm and about 10 μS/cm if the λ is greater than 10 microns, and between about 11 μS/cm and about 50 μS/cm if the λ is between 1 and 10 microns. While very low-conductivity fluid is useful for embodiments where λ is less than 10 microns (even less than 1 micron), such low conductivity is not essential to achieve commercially acceptable planarization efficiency. In another embodiment, the low-conductivity fluids have a conductivity of about 200 μS/cm or lower, for example between about 50 μS/cm and 200 μS/cm, alternatively between about 5 μS/cm and 50 μS/cm. In another embodiment, the low-conductivity fluid resistance is greater than about 0.4 M-ohm-cm. For example, the low-conductivity fluid resistance may be greater than 2 M-ohm-cm, e.g., between about 6 to about 18 M-ohm-cm.

The low-conductivity fluid must have a conductivity sufficient to conduct the required current density, but the thickness of the layer of low-conductivity fluid between the membrane and the work piece is kept low, e.g., about 0.01 to about 2 microns, so that the very low-conductivity fluids are operative. For example, at a conductivity of 10 μS/cm, areas more distant from the membrane than 100 microns would be effectively "protected" by a kilo-ohm of resistance relative to areas that are in contact. This is sufficient to suppress the rate of oxidation of Cu at <10 V over potential.

Generally, the conductivity of the low-conductivity fluid can change substantially if dissolved carbon dioxide is present. For this reason it is preferred that the low-conductivity fluid be de-gassed and/or purged with an inert gas such as nitrogen. Maintaining a nitrogen atmosphere in the MMEP apparatus prevents air and other undesirable gases from entering therein, and at the same time prevents undesirable contaminant particulates from entering the polisher.

Solvating Capacity Of The Low-conductivity Fluid: To satisfy the solubility condition, the solvent or some component of the solution must be capable of solvating or otherwise coordinating the metal ions produced at the anode to create an ionic complex that is soluble and mobile within the membrane. The nature of the anode reaction may also be influenced by the composition of the low-conductivity solvent in other ways. For example, when MMEP is used to polish Cu in contact with deionized water, dissolution occurs via 2-electron oxidation to $Cu^{+2}$. However, when the same process is repeated using aqueous acetonitrile (and/or propionitrile and/or butyronitrile), which is known to stabilize $Cu^{+1}$, the amount of Cu removed per coulomb of charge passed increases by a factor of 2 indicating 1-electron oxidation to $Cu^{+1}$.

Generally, the viscosity of the low-conductivity fluid is between about 0.3 centipoise (cp) to about 100 cp, for example between about 0.8 cp to about 3 cp. More viscous compositions can inhibit ion transfer from the surface of the work piece to the membrane, allowing build-up of metal ions. This is not typically desirable, especially such build-up of ions in the low-conductivity fluid present in depressions in the work piece, as the conductivity of the low-conductivity fluid will increase or may result in the precipitation of oxidization products.

In one embodiment the low-conductivity fluid comprises, consists essentially of, or consists of water, acetonitrile, ethylene carbonate, propylene carbonate, glycol, ethylene glycol, propylene glycol, diethlyene glycol, or mixtures thereof. In one variant of the embodiments of the invention, the low-conductivity fluid used in MMEP that contacts both the anode (work piece) and the external surface of the membrane can be a composition comprising one or more of water, selected solvents, and less than 300 ppm surfactants and/or viscosifying agents. The surfactants can include "passivating" surfactants or surface-active agents. Such agents may tend to deposit onto the surface of the work piece, inhibiting electropolishing at these locations, e.g., in depressions within the surface. Such a surfactant or surface active agent must be compatible with contacting the membrane, e.g., must not plug the membrane, and should be readily swept away by contact with the membrane. In another embodiment the low-conductivity fluid can be a gel.

Generally, the pH is determinative of the metal-ion solvating capacity of the low-conductivity fluid. In some instances, it is preferable to use a very dilute aqueous acid solution as the low conductivity solution rather than deionized water, to prevent precipitation of for example copper ions or other metals which may form in the presence of water at neutral or basic pH. Many metals ions are soluble in an acidic environment, so in another embodiment the low-conductivity fluid further comprises acid sufficient to maintain for example a pH of between 2 and 6.5, for example about 3 to about 6 or about 4 to about 5. For many preferred embodiments of this invention, a pH of between 4 and 6.9 is useful, for example between 6 and 6.5. If the pH is too low, the conductivity of the composition increases. Acids can include for example phosphoric acid, pyrophosphoric acid, carboxylic acids, or mixtures thereof. For various metals, sulfuric acid, hydrochloric acid, nitric acid, phosphoric acid, pyrophosphoric acid, carboxylic acids, or mixtures thereof may be the acid of choice. Generally, the metal ions electropolished from the work piece should be stable in the acid, e.g., not form precipitates. Other acids are specified for selected metals as discussed infra.

However, it is also known in the art that some metals (or metal complexes) are more stable in basic compositions, and for these metals the low-conductivity fluid further comprises base sufficient to maintain for example a pH of between about 7.1 to about 12, for example between about 7.5 to about 9. Useful bases include ammonium hydroxide, halide hydroxides, ammonium sulfate, amines or salts of carboxylic acids.

In an alternate embodiment the low-conductivity fluid further comprises a buffer sufficient to maintain a pH during electropolishing of within about 0.2 pH units of the initial pH. In an alternate embodiment the low-conductivity fluid further comprises a chelator.

Water-Based Low-conductivity fluid: In a most preferred embodiment the low-conductivity fluid comprises, consists essentially of, or consists of water. In another embodiment this low-conductivity fluid further comprises acid sufficient to maintain for example a pH of between about 3.9 to about 6.5, for example between about 4.5 to about 6. Acids can include for example phosphoric acid, pyrophosphoric acid, carboxylic acids, or mixtures thereof. In an alternate embodiment this low-conductivity fluid further comprises a buffer sufficient to maintain a pH during electropolishing of within about 0.2 pH units of the initial pH.

In one embodiment the low-conductivity fluid comprises, consists essentially of, or consists of, water and at least one of acetonitrile, proprionitrile, butyronitrile, glycol, an alcohol having from 1 to 8 carbon atoms, ethylene glycol, propylene glycol, diethlyene glycol, proplylene glycol monomethyl ether, propylene carbonate, ethylene carbonate, and dimethylformamide. In another embodiment this low-conductivity fluid further comprises acid sufficient to maintain for example a pH of between about 3.9 to about 6.5, for example between about 4.5 to about 6. Acids can include for example phosphoric acid, pyrophosphoric acid, carboxylic acids, or mixtures thereof. Other acids are specified for selected metals as discussed infra. In an alternate embodiment this low-conductivity fluid further comprises a buffer sufficient to maintain a pH during electropolishing of within about 0.2 pH units of the initial pH. In an alternate embodiment this low-conductivity fluid further comprises a chelator.

Specific examples of preferred water-based low-conductivity fluids include 1) pure, very low conductivity water, 2) pure water having less than about 0.001 weight percent acid such as sulfuric acid, phosphoric acid, nitric acid, organic acid, or combination thereof, 3) pure, very low conductivity water having from 0.1% to 70% acetonitrile, and optionally having less than about 0.001 weight percent acid such as sulfuric acid, phosphoric acid, nitric acid, organic acid, or combination thereof.

In one preferred embodiment of the above described composition, the low-conductivity fluid comprises, consists essentially of, or consists of water and acetonitrile. In a more preferred embodiment the amount of acetonitrile is sufficient to give an electropolishing efficiency of between one metal atom, e.g., one copper atom, per 1 to 1.99 electrons of current flow.

In another embodiment of the above described composition, the low-conductivity fluid comprises, consists essentially of, or consists of water and glycols, wherein the term glycols includes for example glycol, ethylene glycol, propylene glycol, diethlyene glycol, proplylene glycol monomethyl ether, or mixtures thereof. In another embodiment of the above described composition, the low-conductivity fluid comprises, consists essentially of, or consists of water and a nitrile-containing solvent such acetonitrile, a copper-coordinating solvent such as ethanolamine or ethylene diamine, ethylene carbonate, propylene carbonate, In an alternate embodiment this low-conductivity fluid further comprises a chelator. In the above embodiments chelators can optionally be added. In other embodiments, the low-conductivity fluid is substantially free of chelators, except for acetonitrile or other substantially non-polar complexing agents, or small quantities, e.g., 0.005% to 0.2%, of one or more of dicarboxylic acids or citric acid. In some cases, the chelators and/or chelated metal complexes have an electrical charge which helps the complex migrate toward the membrane, so long as the overall conductivity constraints of the low-conductivity fluid are met. However, the chelator-metal complex is advantageously able to either release the metal ion to the membrane, or must be able to pass through the membrane. Chelators include those chelators normally found in the art, e.g., EDTA, DTPA, citric acid, di-functional organic acids including for example di- or multi-hydroxybenzene-type compounds, e.g., such as catechol, butylated hydroxytoluene ("BHT"), and the like; dicarboxylic acids such as oxalic acid, malonic acid, succinic acid, glutamic acid, adipic acid, maleic acid, fumaric acid, phthalic acid, isophthalic acid, terephthalic acid and the like; tricarboxylic acids such as citric acid, aconitic acid, trimellitic acid and the like; hydoxycarboxylic acids such as glycolic acid, gallic acid, lactic acid, 2-hydroxybutyric acid, tartaric acid, malic acid, salicylic acid, and the like; ketocarboxylic acids, such as acetoacetic acid, ketoglutaric acid and the like; aminocarboxylic acids such as aspartic acid, glutamic acid and the like; aminopolycarboxylic acids such as EDTA, DTPA, and the like; aminocarboxylic acids; diamines, e.g., such as ethylene diamine; or a combination of any such chelating agents. Generally, if chelators are present, it is preferred that the chelator-metal complex be able to pass through the membrane, or that the chelator readily release the metal ion to allow the metal ion to pass through the membrane. Of course, any acidic chelator can be present partially or completely as a salt, e.g., an ammonium salt. In some embodiments the chelator comprises one or more of salicylic acid, gallic acid, glycolic acid, citric acid, or mixture thereof. Additionally or alternatively, in any of the above embodiments, viscosifying agent which are typically polymeric, or viscosity reducers such for example 0.01% to 20% by weight of a small quantity a low molecular weight alcohol, can also be included.

Non-Water-Based Low-conductivity fluid: It should be noted, however, that the invention contemplates the use of low-conductivity fluids that are substantially free of water. Generally, it is necessary for some component in the low-conductivity fluid to coordinate with and solvate the metal ions.

In one embodiment, the low-conductivity fluid comprises, consists essentially of, or consists of acetonitrile, proprionitrile, butyronitrile, or mixture thereof. In another embodiment, which is especially useful for copper, the low-conductivity fluid comprises, consists essentially of, or consists of acetonitrile, proprionitrile, and/or butyronitrile, one or more alkanolamines, such as ethanolamine, diethanolamine, triethanolamine, isopropanolamine, ethylene diamine, or mixtures thereof. In another embodiment the low-conductivity fluid can further comprise ammonia. Surprisingly, in those formulations having sufficient soluble nitriles, ammonia, alkanolamines, and/or diamines, the value of n may be less than 2 electrons per metal atom, though efficiencies between about 2.5 to 4.5 electrons per metal ion generated is more common. These complexing solvents can stabilize a single-charged copper complex, i.e., Cu(I). In a preferred embodiment the amount of these nitrogen-containing solvents in the low-conductivity fluid is sufficient to give a electropolishing efficiency of between one copper atom per 1 to 1.99 electrons of current flow. By this it is meant that at least 1% of the normally doubly charged metal ions, e.g., copper, are polished from the substrates in the $Cu^{+1}$ form. In a more preferred embodiment, the low-conductivity fluid and the electrolyte solvent each independently comprise, consist essentially of, or consist of acetonitrile, proprionitrile, butyronitrile, or mixture thereof, wherein the amount of acetonitrile is sufficient to coordinate and stabilize metal single-charged ions, e.g., $Cu^{+1}$, give a electropolishing efficiency of between one metal atom, e.g., one copper atom, per 1 to 1.99 electrons of current flow. In an experiment using pure acetonitrile as the low-conductivity fluid and a mixture of acetonitrile and tetramethylammonium hexafluorophosphate as the electrolyte, the electrolyte being separated from the low-conductivity fluid by a Nafion® membrane, the unit passed current to the work piece, electropolished metal therefrom, and solvated the polished metal. This has utility especially if the work piece comprises materials that are adversely affected by water, though the current density was low and adhesion, presumably due to "dehydration or "de-solventation" of the membrane, was severe.

In one embodiment the low-conductivity fluid comprises, consists essentially of, or consists of an alcohol having from 1 to 8 carbon atoms and at least one of acetonitrile, glycol, ethylene glycol, propylene glycol, diethlyene glycol, proplylene glycol monomethyl ether, propylene carbonate, ethylene carbonate, N,N-dimethlyacetamide, N-methylpyrolidone and dimethylformamide.

In one embodiment the low-conductivity fluid comprises, consists essentially of, or consists of a glycol and at least one of acetonitrile, proplylene glycol monomethyl ether, propylene carbonate, ethylene carbonate, and dimethylformamide. In one embodiment this low-conductivity fluid comprises, consists essentially of, or consists of a glycol and acetonitrile.

In one embodiment the low-conductivity fluid comprises, consists essentially of, or consists of propylene carbonate, ethylene carbonate, or mixture thereof.

In one embodiment the low-conductivity fluid comprises, consists essentially of, or consists of a non-polar organic solvent and at least one of acetonitrile, glycol, ethylene glycol, propylene glycol, diethlyene glycol, proplylene glycol monomethyl ether, propylene carbonate, ethylene carbonate, and dimethylformamide.

In one embodiment the low-conductivity fluid comprises, consists essentially of, or consists of a polar organic solvent. Generally, an amount of any component is a function of the solvating capacity, lubricating qualities, and conductivity of that component. Examples of polar organic solvents include substituted sulfoxides including dimethyl sulfoxide; glycols including glycol, ethylene glycol, diethlyene glycol, triethlyene glycol, ethylene glycol alkyl ether, diethylene glycol alkyl ether, triethylene glycol alkyl ether, propylene glycol, dipropylene glycol, propylene-ethylene glycols, and propylene glycol alkyl ether, e.g., proplylene glycol monomethyl ether, N-substituted pyrrolidone such as N-methyl-2-pyrrolidone (NMP), sulfolanes, substituted sulfones including 2,4-dimethylsulfone, substituted amides including dimethylacetamide, or any combination thereof. We found that certain solvents, e.g., tolulene and dichloromethane, were inoperative. However, it is anticipated that these solvents can be used if combined with a sufficient quantity of other solvents and with acetonitrile or other R-nitrile group that is miscible with the non-operative organic solvents. In another embodiment the low-conductivity fluid comprises a polar organic solvent and at least one of acetonitrile, propylene carbonate, ethylene carbonate, and dimethylformamide.

In one embodiment, the low-conductivity fluid comprises, consists essentially of, or consists of a fluid that is substantially immiscible in the electrolyte. For example, the low-conductivity fluid may comprise a non-polar organic solvent, or a solvent with a substantial non-polar character, such as an alkyl-benzene, or an alcohol with greater than 8 carbon atoms. Advantageously, this organic-based low-conductivity fluid has a sufficient capacity to solubilize the metal ions. Alternatively, this low-conductivity fluid further comprises one or more compounds to coordinate with the metal ions, wherein said compound or compounds are present in an amount sufficient to solubilize the metal ions removed from the work piece. One example of such compounds is surfactants, such as alkyl sulfonates where the alkyl group comprises for example more than six carbon atoms. Acetonitrile, proprionitrile, butyronitrile, and/or any R-nitrile (where R is a C1 to C9 alkyl or aryl moiety) compatible with the membrane and the work piece, are another example. Other chelators soluble in the organic-based low-conductivity fluid can be included. An advantage of this embodiment is the membrane can more readily keep the electrolyte within the cathode half-cell, as the electrolyte can be selected to have negligible solubility in the organic-based low-conductivity fluid. Another advantage of the organic-based low-conductivity fluid is that such fluids can have resistivities greater than even relatively pure water.

In one embodiment, the low-conductivity fluid and the electrolyte solvent can be only slightly miscible one with another. For example, 2,4-dimethylsulfolane is only slightly miscible with water and for such an embodiment, the electrolyte solvent can comprise or consist of 2,4-dimethylsulfolane and the low-conductivity fluid can comprise or consist essentially of water, or the electrolyte solvent can comprise or consist of water and the low-conductivity fluid can comprise or consist essentially of 2,4-dimethylsulfolane. Similarly, butyronitrile is only slightly miscible with water. The combination can comprise 2 or more nitrites, e.g., acetonitrile in one fluid and butyronitrile in the other fluid, for example.

In the above embodiments chelators can optionally be added. Alternatively, the low-conductivity fluid can be substantially free of chelators. In some cases, the chelators and/or chelated metal complexes have an electrical charge which helps the complex migrate toward the membrane, so long as the overall conductivity constraints of the low-conductivity fluid are met. Again, it is preferred for low-conductivity fluids to use chelators with low holding coefficients, e.g., dicarboxylic acids and the like. The chelator-metal complex is advantageously able to either release the metal ion to the membrane, or must be able to pass through the membrane. Chelators include those chelators normally found in the art, e.g., EDTA, DPTA, citric acid, di-functional organic acids including for example di- or multi-hydroxybenzene-type compounds, e.g., such as catechol, butylated hydroxytoluene ("BHT"), and the like; dicarboxylic acids such as oxalic acid, malonic acid, succinic acid, glutamic acid, adipic acid, maleic acid, fumaric acid, phthalic acid, isophthalic acid, terephthalic acid and the like; tricarboxylic acids such as citric acid, aconitic acid, trimellitic acid and the like; hydoxycarboxylic acids such as glycolic acid, gallic acid, lactic acid, 2-hydroxybuteric acid, tartaric acid, malic acid, salicylic acid, and the like; ketocarboxylic acids, such as acetoacetic acid, ketoglutaric acid and the like; aminocarboxylic acids such as aspartic acid, glutamic acid and the like; aminopolycarboxylic acids such as EDTA, DPTA, and the like; amino-carboxylic acids; diamines, e.g., such as ethylenediamine; or a combination of any such chelating agents. Generally, if chelators are present, it is preferred that the chelator-metal complex be able to pass through the membrane, or that the chelator readily release the metal ion to allow the metal ion to pass through the membrane. Of course, any acidic chelator can be present partially or completely as a salt, e.g., an ammonium salt. In some embodiments the chelator comprises one or more of salicylic acid, gallic acid, glycolic acid, citric acid, or mixture thereof.

Additionally or alternatively, in any of the above embodiments, between about 0.001% to 0.1% of viscosifying agents, which are typically polymeric, can be added. Alternatively, to reduce the viscosity, a low molecular acid may be added, for example. Very little is required to reduce viscosity of water, so for example 0.001% to 0.1% by weight of a small quantity a low molecular weight alcohol, can also be included.

Additionally or alternatively, in any of the above embodiments, a surfactant can also be included at for example 0.001% to 0.03% by weight. Specifically preferred are surfactants which coat and passivate the surface of the work piece not contacted by the membrane.

The application generally discusses the embodiment including the electropolishing of copper, which is advantageously (but not necessarily) done in an acidic environment. Of course, some other metals, as is known in the art, require a basic pH to be stably electropolished and solvated by the low-conductivity fluid and/or electrolyte composition. In each of these cases, where acids are suggested, a base may be used. Useful bases include ammonium salts, as well as soluble halide hydroxides, and useful ranges of pH are between about 8 and about 12.

Cathode: The term "cathode" is used universally herein to describe the electrode residing within the half cell, called the "cathode half cell."

The cathode can be made from any electrically conductive material that is chemically stable in the electrolyte. For many typical anode compositions suitable for use in MMEP, corresponding suitable choices for cathode and electrolyte compositions can be found in "Electroplating Engineering Handbook", $4^{th}$ Edition, pp. 100-120, by D. E. Ward, L. J. Durney, Ed., Van Nostrand Co., NY, 1984. In one embodiment the cathode comprises the metal on the anode work piece. For example, a copper cathode is useful for polishing copper, as copper ions reduced to metal at the cathode will typically stably plate onto such cathode. If the electrolyte contacting the cathode has a low resistivity, then the plated material adhering to the cathode will have little effect on current flow to the membrane.

In an alternate embodiment, the cathode is a material which has poor adherence to the plated material can be used. In such a case, the metal ions removed from the work piece are reduced to metal at the cathode, but this metal readily falls off the cathode and is advantageously carried from the half-cell by the electrolyte. Non-plating cathode can comprise tantalum, titanium, 304 stainless, 306 stainless, chromium, or other non-depositing metal, so that the metal ions produced from the anode will not adhere to the cathode.

Generally, the shape of the cathode is a plate extending in a plane roughly parallel to the membrane. In preferred embodiments, the cathode is planar and comprises a plate or screen, and the cathode extends over substantially an entire area equal to, or greater than, and laterally displaced from the "membrane contact area", defined as the area in which the membrane substantially contacts or is kept in close proximity to the work piece. For highly conductive electrolytes, the shape of the cathode is less important. For example, with electrolyte compositions having a resistivity less than about 0.01 M-ohm-cm, one cathode embodiment comprises a flat plane extending over the "membrane contact area", and is disposed less than 300 microns from the membrane, e.g., less than about 100 microns or between about 10 and about 50 microns from the membrane, but does not contact the membrane.

In embodiments where the electrolyte has high conductivity, then the resistance between the cathode and the membrane is usually negligible. In embodiments where the electrolyte is itself of lower conductivity, for example having a resistance greater than about 0.1 M-ohm-cm, then the shape and the distance between the work piece and the cathode becomes critical. In alternate embodiments the cathode comprises a flat plane extending over the "membrane contact area", and is disposed less than 10 microns from the membrane, e.g., less than about 5 microns or between about 1 and about 3 microns from the membrane. In such embodiments, maintaining the distance at a stable amount becomes important, and non-conducting support structures extending from cathode to the membrane may be employed.

In some embodiments, the cathode comprises holes therethrough adapted to allow electrolyte flow from the back of the cathode and through said holes to the volume between the cathode and the membrane. Alternatively or additionally, in some embodiments the cathode may comprise channels adapted to facilitate flow of electrolyte across the surface of the cathode. Such flow is advantageously maintained to remove gas that may form on the cathode, as well as to remove one or more components of the electrolyte.

Electrolyte: In every embodiment of the invention, an electrolyte solution is disposed between, and conducts current between, the cathode and the interior surface of the membrane.

Generally, the electrolyte comprises an electrolyte solvent, and one or more additives (typically additives which dissociate to form charged species) including for example acids and/or buffers, salts, e.g., metal salts, ionized compounds, chelators, surfactants, and/or viscosifiers. For many typical anode compositions suitable for use in MMEP, corresponding suitable choices for cathode and electrolyte compositions can be found in *Electroplating Engineering Handbook*, $4^{th}$ Edition, pp. 100-120, by D. E. Ward, L. J. Durney, Ed., Van Nostrand Co., NY, 1984.

The electrolyte is chosen to provide high solubility for the metal ions or coordinated metal ions produced by oxidation of the anode. The capacity of the electrolyte to solubilize the metal ion/coordinated metal ion will depend on the targeted polishing rates and the effective migration rates from the membrane to the cathode.

The electrolyte carries current between the cathode and the membrane. Preferred electrolyte compositions have sufficiently high conductivity to carry current densities up to several hundred $mA/cm^2$ without introducing significant voltage drop or heating. Conductivities of electrolytes is advantageously at least 30 mS/cm, and conductivities of at least 100 mS/cm, for example at least about 1000 mS/cm, alternatively between about 1000 mS/cm and about 10000 mS/cm, are preferred. For these higher conductivity electrolytes, the voltage drop from the cathode to the membrane is substantially negligible, greatly simplifying the cathode half-cell design.

Generally, the viscosity of the electrolyte is between about 0.4 centipoise (cp) to about 100 cp, for example between about 0.8 cp to about 3 cp.

Examples of suitable electrolytes include metal salts of poly(acrylic acid), poly(methylacrylic acid), poly(styrene sulfonic acid), lightly cross-linked derivatives and copolymers thereof. Light cross-linking refer to a low percentage of the monomers of one backbone linking to other polymer backbones or monomers with the same backbone for example from about 0.001% to about 5%, alternatively from about 0.001% to about 1%, alternatively from about 0.01% to about 2%. The polymers are advantageously ay least 30% neutralized, for example at least 60% neutralized, with metal, e.g., with ions of the metal being polished.

Acid-Water Electrolyte Compositions: The most common standard electropolishing electrolytes are concentrated aqueous solutions of strong acids. Examples 1-5 illustrate the use of various strong acid electrolytes for MMEP. The cathode can be made from any electrically conductive material that is chemically stable in the electrolyte. Chloride ion has been found to be effective in maintaining the solubility of $Sn^{+2}$ and $Al^{+3}$; a few representative examples of electrolytes that can be used for MMEP are listed in Table 2.

In one embodiment, however, the invention encompasses electrolytes made with sufficient, i.e., at least 3%, preferably at least 10%, e.g. at least 20%, of an acid, and is substantially free of added salts. In one such embodiment, the electrolyte consists essentially of water and an acid such as phosphoric acid, nitric acid, sulfinuric acid, strong organic acids, e.g., acetic acid, hydrochloric acid, or mixture thereof. In another embodiment, the electrolyte consists essentially phosphoric acid, nitric acid, sulfuric acid, strong organic acids, e.g., acetic acid, hydrochloric acid, or mixture thereof. These electrolyte solvents can provide sufficient conductivity between a cathode and a membrane, and also provide sufficient solvating capability for most metals that are electropolished from the work piece.

The electrolyte composition will of course contain metals that are electropolished from the work piece, but this concentration can be small, e.g., less than 0.01 molar, for example. Electrolysis with low metal ion concentration will result in hydrogen production at the cathode. This dissolved hydrogen can react with metal ions to precipitate metal particles. Therefore, it is highly advantageous to include plate-able metal ions in the electrolyte composition, in the form of soluble metal salts, metal complexes, metal-neutralized hydrophilic polymers such as metal-neutralized polyacrylates, or combinations thereof. It is preferred that the electrolyte comprise between 0.01M and 2.5 M of metal ions. More metal ions is not deleterious but may not be necessary. While the metal concentration may exceed 2.5 M, it need not all be readily reduced at the cathode. For example, some metal in a metal-neutralized hydrophilic polymer may not be readily reduced at the cathode. Simple dissociated salts are the most readily reducible metal ions, and therefore it is preferred that at least 0.1 M of metal ions, preferably at least 0.5 M of metal ions, are substantially dissociated salts in the electrolyte that are easily reduced at the cathode. A high concentration of metal ions is maintained in the electrolyte to suppress hydrogen generation and prevent formation of metal particles.

Solvents For The Electrolyte Composition: The various electrolyte solvents can not, with the exception of a few strong acids, support the desired current flow. The electrolyte is typically a composition comprising at least a solvent, e.g., water, an acid, or mixture thereof, and one or more ionic compounds dissolved therein the increase the conductivity of the electrolyte. Preferably, the salts and acids do not react with the metal ions entering the electrolyte solution through the membrane. The electrolyte solvent typically comprises or consists essentially of water, an acid as listed above, a polar organic solvent, a solvent such acetonitrile, ethylene carbonate, propylene carbonate, and/or a glycol, or a mixture thereof. In most preferred embodiments of this invention, the electrolyte composition comprises water as a solvent. In one embodiment of the invention, molten salt containing no solvent is used instead of the solvent.

Of course, the various components of the electrolyte composition must be compatible, though compatibility of various combinations is usually predictable by of one of ordinary skill in the art with little or no experimentation. Additionally, the cathode can be made from any electrically conductive material that is chemically stable in the electrolyte.

Typically, one or more non-acid, ionizable compounds are added to the electrolyte composition. Again, even so, the most common embodiments of this invention include concentrated aqueous solutions of strong acids in addition to added salts. Again, Examples 1-5 illustrate the use of various strong acid electrolytes for MMEP. Chloride ion has been found to be effective in maintaining the solubility of $Sn^{+2}$ and $Al^{+3}$; a few representative examples of electrolytes that can be used for MMEP are listed in Table 2.

One class of charged compounds typically added are acids, preferably wherein the acids have high dissociation constants for at least one hydrogen to provide substantially dissociated acid. Acids can include for example phosphoric acid, pyrophosphoric acid, nitric, hydrochloric, sulfuric, carboxylic acids, or mixtures thereof. In an alternate embodiment the charged compounds further comprises a buffer sufficient to maintain a pH during electropolishing of within about 0.1 pH units of the initial pH. With the benefit of this disclosure, the selection of the appropriate acid(s) is well within the skill of one with ordinary skill in the art of electropolishing.

As discussed herein, the invention as discussed is designed to polish copper, and an acidic pH is preferred. Of course, the invention is applicable to a wide variety of metals, and some metals, as is known in the art, require a basic pH to be stably electropolished and solvated by the low-conductivity fluid and/or electrolyte composition. In each of these cases, where acids are suggested, a base may be used. Useful bases include ammonium salts, as well as soluble halide hydroxides. Useful pH ranges include 7.5-10.5 for the low-conductivity fluid and 8 to greater than 14 for the electrolyte.

In one embodiment, the solvent of the electrolyte composition is substantially the same as the solvent in the low-conductivity fluid. This allows, for some embodiments, the membrane to be at least semipermeable to the solvent/low-conductivity fluid, without creating undesirable concentration gradients and without being permeable to the ionized portion of the electrolyte composition. This embodiment excludes, obviously, those cases where the electrolyte solvent comprised high concentrations of acid, as the conductivity of such a liquid is too high for use as a low-conductivity fluid.

The following embodiments can be used when the electrolyte solvent is the same as the low-conductivity fluid, and of course can also be used when the low-conductivity fluid is different than the electrolyte solvent.

In one embodiment the electrolyte solvent comprises or consists essentially of water, acetonitrile, ethylene carbonate, propylene carbonate, glycol, ethylene glycol, propylene glycol, diethlyene glycol, or mixtures thereof. Optionally, there can be a small amount of acid, e.g., an amount sufficient to give pH 2 to pH 7. MMEP polishing of Cu in water requires an acidic environment at the surface of the anode because at pH>4 $Cu^{+2}$ precipitates from water as CuO. In another embodiment the electrolyte solvent comprises, consists essentially of, or consists of water and at least one of acetonitrile, a glycol, an alcohol having from 1 to 8 carbon atoms, ethylene glycol, propylene glycol, diethlyene glycol, proplylene glycol monomethyl ether, propylene carbonate, ethylene carbonate, and dimethylformamide, and again, optionally, a small amount of acid, e.g., an amount sufficient to give pH 2 to pH 7.

In one preferred embodiment, electrolyte solvent includes water, acetonitrile, proprionitrile, butyronitrile, or mixture thereof. In one preferred embodiment of the above described composition, the electrolyte solvent comprises, consists essentially of, or consists of water and acetonitrile. In a more preferred embodiment, the low-conductivity fluid and the electrolyte solvent each independently comprise, consist essentially of, or consist of acetonitrile, wherein the amount of acetonitrile is sufficient to give a electropolishing efficiency of between one metal atom, e.g., one copper atom, per 1 to 1.9 electrons of current flow.

In one embodiment the electrolyte solvent comprises or consists essentially of a polar organic solvent. Examples of polar organic solvents include substituted sulfoxides including dimethyl sulfoxide; glycols including glycol, ethylene glycol, diethlyene glycol, triethlyene glycol, ethylene glycol alkyl ether, diethylene glycol alkyl ether, triethylene glycol alkyl ether, propylene glycol, dipropylene glycol, propylene-ethylene glycols, and propylene glycol alkyl ether, e.g., proplylene glycol monomethyl ether, N-substituted pyrrolidone such as N-methyl-2-pyrrolidone (NMP), sulfolanes, substituted sulfones including 2,4-dimethylsulfone, substituted amides including dimethylacetamide, or any combination thereof. In another embodiment the electrolyte solvent comprises a polar organic solvent and at least one of acetonitrile, proprionitrile, butyronitrile, or any compatible R-nitrile where R is a $C_3$ to $C_9$ alkyl or aryl group, propylene carbonate, ethylene carbonate, and dimethylformamide. In one embodiment, a solvent of pure acetonitrile was found to work when a soluble ionic species (complex-able metal ions and/or other ions such as tetramethylammonium hexafluorophosphate or the like) were added thereto to achieve the desired conductivity.

In one embodiment, the low-conductivity fluid and the electrolyte solvent are selected so that they are substantially immiscible. For example, 2,4-dimethylsulfolane is only slightly miscible with water, and for such a combination, the electrolyte solvent can comprise or consist of 2,4-dimethylsulfolane and the low-conductivity fluid can comprise or consist essentially of water, or alternatively the electrolyte solvent can comprise or consist of water and the low-conductivity fluid can comprise or consist essentially of 2,4-dimethylsulfolane.

Salts For The Electrolyte Composition: The various electrolyte solvents cannot, with the exception of a few strong acids, support the desired current flow. The electrolyte is typically a composition comprising at least a solvent, e.g., water, an acid, or mixture thereof, and one or more ionic compounds dissolved therein the increase the conductivity of the electrolyte. We will next discuss examples of the one or more non-acid, ionizable compounds that can in various preferred embodiments of this invention be added to the electrolyte composition.

Generally, these non-acid, ionizable compounds are added to aqueous acid or aqueous/acetonitrile formulations. In one embodiment the invention encompasses electrolytes made with sufficient, i.e., at least 3%, preferably at least 10%, e.g., at least 20%, of an acid such as phosphoric acid, nitric acid, sulfuric acid, strong organic acids, e.g., acetic acid, hydrochloric acid, or mixture thereof.

While electrolytes useful in standard electropolishing (EP) can be used, some specialized electrolytes provide additional advantages. During polishing one or more reduction reactions may occur at the cathode. For example, aqueous acids these may include electrolysis of water to liberate hydrogen and the reduction or plating of metal ions derived from the anode. In order to minimize hydrogen evolution relative to plating, various additives such as for example metal salts, e.g., $CuSO_4$, can be included in the electrolyte. In conventional EP, where the work piece is totally immersed in electrolyte, metal salts generally are not added because the cost of formulating, recovering and/or disposing of such large volumes of material, would be prohibitive. Additionally, the high concentration of metal salts would introduce contamination to the work piece. By contrast, a single MMEP cathode half-cell contains only a few ml of electrolyte and can be used to polish work pieces many times larger in volume.

One side reaction intrinsic to electropolishing is the electrolysis of water, which can produce molecular hydrogen, molecular oxygen, or both. As discussed infra, in some embodiments it is preferred to operate at high rates and high values of n, e.g., n greater than 3, usually greater than 4, so that a sufficient amount of hydronium ions are formed to solvate the electropolished metal ions and prevent deposition of metal oxides, hydroxides, and/or carbonates. These operating conditions and this reaction will produce undesired molecular oxygen, which is a trade-off for eliminating precipitates at higher polishing rates.

However, there is no circumstances where the generation of hydrogen gas at or near the cathode has favorable consequences. In prior art EP, the amount of metal ions in the electrolyte was generally kept low to minimize metal ion contamination of the substrate. Further, if metal ions react with dissolved hydrogen, they are reduced to metallic particles which could damage the substrate. We have found that it is very advantageous in any form of electropolishing to maintain a high enough concentration of reducible ("plateable") metal ions in the electrolyte in the vicinity of the cathode to substantially reduce the formation of hydrogen gas, wherein this reducible-metal-containing electrolyte (and any metallic particles that may form on reduction of the metal ions at the cathode) do not contact the work piece. Generally, the reducible-metal-containing electrolyte can be kept separate from the work piece even in traditional EP by use of an ion-selective membrane, and/or by maintaining a quasi-steady-state barrier of metal poor electrolyte fluid between the reducible-metal-containing electrolyte and the work piece surface.

Therefore, a unique additional invention is an apparatus adapted to electropolish or electro-mechanically polish Cu damascene wafers wherein the solution contacting the cathode contains a sufficient concentration of reducible-metal salts to substantially suppress the formation of molecular hydrogen at the cathode, but where the electrolyte or fluid contacting the work piece has substantially less reducible-metal salts. By "reducible-metal salts" we mean any salt of a reducible transition metal that has sufficient solubility in the electrolyte and that can be reduced to metallic form a the cathode. As discussed infra, the metal salts in the electrolyte near the can comprise or consist essentially of the metal being polished. Generally, divalent metals are preferred over monovalent metal salts. Preferred reducible-metal ions are $Cu(I)$, $Cu(II)$, $Ni(II)$, $Ag(I)$, $Fe(II)$, $Cr(III)$, and/or complexes of these ions. The most preferred reducible-metal ions are $Cu(I)$ and $Cu(II)$. A preferred reducible metal salt is a copper salt, where the anion is the same as the anion of the acid component of the electrolyte, e.g., copper sulfate. By "substantially reduce the formation of hydrogen gas" we mean that at least one metal ion is reduced for every hydrogen molecule generated by the electrolysis of water at or near the cathode. Preferably, the amount of reducible metal ions in the "reducible-metal-containing" electrolyte contacting the cathode is sufficient so that 2 or more metal ions are reduced, more preferably 4 or more metal ions are reduced, and most preferably 8 or more metal ions are reduced, for example 15 to 100 metal ion are reduced, for every hydrogen molecule generated by the electrolysis of water at or near the cathode. By "substantially less reducible metal salts" we mean the molar concentration of reducible metal in fluid contacting the work piece is less than about 50% of the molar concentration of reducible metals in the electrolyte fluid contacting the cathode, and preferably is less than 10%, more preferably is less than about 1%, for example is less than about 0.1%, of the molar concentration of reducible metals in the electrolyte fluid contacting the cathode. Depending on the current density, generally a concentration of between 0.001 M to about 1 M of a reducible-metal salt is sufficient, and in preferred embodiments the electrolyte contacting the cathode comprises about 0.01 M to 0.5 M, for example about 0.05 M to about 0.3 M, alternately from about 0.1 M to about 0.3 M, of a reducible-metal salt.

The same criteria apply to any of the above-mentioned MMEP apparatus, and in MMEP the reducible-metal-containing electrolyte solution or gel is rigorously kept away from the work piece. Therefore, in preferred embodiments of any of the above described MMEP apparatus, the conductive electrolyte solution or gel comprises a reducible-metal salt, wherein the amount of reducible-metal salt is sufficient to substantially reduce the formation of hydrogen gas. A preferred variation of any of the above-mentioned MMEP apparatus includes the embodiment wherein the conductive electrolyte solution or gel comprises water, an acid, and a reducible-metal salt, and wherein the amount of reducible metal salt is sufficient to substantially reduce the formation of hydrogen gas. Another variation of any of the above-mentioned apparatus includes the embodiment wherein the conductive electrolyte solution or gel comprises from about 0.001 M to about 1 M, preferably about 0.01 M to 0.5 M, for example about 0.05 M to about 0.3 M, or alternately from about 0.1 M to about 0.3 M, of reducible-metal salt. Yet another variation of any of the above-mentioned apparatus includes the embodiment wherein the conductive electrolyte solution or gel comprises water, an acid, and from about 0.001 M to about 1 M, preferably about 0.01 M to 0.5 M, for example about 0.05 M to about 0.3 M, or alternately from about 0.1 M to about 0.3 M, of reducible-metal salt.

In one embodiment the electrolyte composition comprises one or more metal salts, wherein at least one metal salt comprises the metal that is being removed from the anode work piece. The concentration of these metal salts can range for example from 0.001 M to 5 M, or typically from 0.05 M to 2.5 M. The salts can be selected by one of ordinary skill in the art having benefit of this disclosure. By metal salts we mean the commonly known dissociable (soluble) metal salts as well as metal salts of acidic polymers, e.g., polycarboxylic compounds such as polyacrylates and polysulfonates. We have found that higher metal salt concentrations in the electrolyte reduce electrolysis of water and make the system more efficient. The following are exemplary, and most will benefit from additional salts.

For polishing silver, an aqueous nitric acid is preferred, having for example 0.1 M to 4 M nitric acid in water, e.g., 1 M to 2 M nitric acid in water. Other electrolyte ions such as sodium nitrate and/or silver nitrate may be added in an amount between 0.001 M to 1 M, or typically from 0.05 M to 0.3 M.

For polishing nickel, an aqueous sulfuric acid is preferred, having for example 5% to 50% sulfuric acid in water, e.g., 10% to 30% sulfuric acid in water. Other electrolyte ions such as sodium sulfate, copper sulfate, and/or nickel chloride or the like may be added in an amount between 0.001 M to 1 M, or typically from 0.05 M to 0.3 M.

For polishing cobalt, an aqueous sulfuric acid/acetonitrile composition is preferred, having for example 3% to 30% sulfuric acid/10% to 50% water/40% to 75% acetonitrile is useful. Other electrolyte ions such as sodium sulfate, copper sulfate, and/or cobalt chloride or the like may be added in an amount between 0.001 M to 1 M, or typically from 0.05 M to 0.3 M.

For polishing tin, an aqueous sulfuric acid/hydrochloric composition is preferred, having for example 0.5 M to 5M HCl/10% to 40% sulfuric acid/40% to 80% water is useful. Other electrolyte ions such as sodium sulfate, copper sulfate, and/or tin chloride or the like may be added in an amount between 0.001 M to 1 M, or typically from 0.05 M to 0.3 M.

For polishing tantalum, small amounts of HF may be beneficial. For polishing tungsten, chelators may be particularly beneficial.

For polishing steel (type 316 SS), an aqueous sulfuric acid composition is useful, having for example 5% to 50% sulfuric acid/50% to 90% water is useful. Other electrolyte ions such as sodium sulfate, copper sulfate, and/or ferrous sulfate or the like may be added in an amount between 0.001 M to 1 M, or typically from 0.05 M to 0.3 M.

For polishing aluminum, an aqueous sulfuric acid/hydrochloric composition is preferred, having for example 1 M to 6M HCl/5% to 30% sulfuric acid/60% to 90% water is useful. Other electrolyte ions such as sodium sulfate, copper sulfate, or the like may be added in an amount between 0.001 M to 1 M, or typically from 0.05 M to 0.3 M.

In preferred embodiments of the invention, the MMEP electrolyte comprises metal ions equivalent to those generated at the anode, and at a concentration sufficient to allow metal ions to be plated onto the cathode at a rate equal to the rate of metal removal from the work piece, such that a steady state is maintained and the salt content of the electrolyte remains constant. It should be noted however that solvent (usually water) typically is transferred across the membrane by osmosis, electro-osmosis, and/or pervaporation, causing the salt concentration of the electrolyte to vary with time unless this solvent is removed. Adjustment for such variations may be readily made by adding or removing the appropriate amount of pure solvent. When the rate of production of new metal ions from the anode is exactly balanced by the rate at which the metal ions in the electrolyte composition migrate toward and are reduced at the cathode, then no hydrogen is generated and, in principle, the same quantity of electrolyte can be re-used indefinitely. If the process is operated at high current density and high n, then in addition to metal ions, substantial quantities of protons and solvent (water) will pass through the membrane. Therefore, there will be a gradual decline in the ratio of dissolved metal salt to acid in the electrolyte. It may be necessary to monitor or routinely adjust the electrolyte composition, though some fairly straightforward actions like having the electrolyte be in equilibrium with one or more solid metal salts may sufficiently stabilize the electrolyte composition that no more action need be taken.

In another embodiment the electrolyte can comprise one or more metal salts, wherein the metal salts comprise metal other than those metals that are being removed from the anode. The concentration of metal salts that comprise metal other than those metals that are being removed from the anode work piece can range for example from 0.001 M to 1 M, or typically from 0.05 M to 0.3 M.

In some embodiments, the counter-ion of the metal salt is identical to the counter-ion in the acid. This is not necessary, however, and any counter-ion can be selected so long as the counter-ion does not form a precipitate with metal electropolished from the anode work piece. Counter-ions can be sulfates, phosphates, halides, e.g., chlorides, an organic acid salt such as acetate, salicylate, benzoates, citrates, and the like, provided the metal salt produces charged ions capable of facilitating current flow.

Preferably, the salts do not react with and thereby cause the metal ions entering the electrolyte solution through the membrane to precipitate. The salts can be selected by one of ordinary skill in the art having benefit of this disclosure.

In one embodiment, metal ions from metal salts comprises a charge of at least positive two, for example an ion having a charge of positive three or positive four. Exemplary ions include aluminum and iron ions. The highly charged ion will allow current flow with less ions.

Generally, the metal ions must be stable in the electrolyte, and must be reducible at the cathode. However, in other embodiments, at least a portion of the metal ions from the metal salts are not reducible at the cathode. The advantage is that while these salts provide conductivity, they do not plate on and contaminate a cathode. Exemplary salts include halides of alkali metals, e.g., sodium or potassium ions, which will not tend to be reduced at a voltage where for example a copper ion is reduced. The disadvantage is that if an insufficient concentration of reducable metal ions are at the cathode, there may be electrolysis of the solvent, e.g., the water.

Inasmuch as substantially all of the metal removed from a work piece may be plated onto the cathode, it is desirable to recover this metal in a form and state of purity suitable for reuse in other applications. For example, the recovered cathode may be used to fabricate sputtering targets or plating anodes for the production of copper damascene wafers. Advantageously, the cathode may therefore be made of highly pure copper metal. Advantageously, the electrolyte in the cathode half-cell may comprise a conventional or commercial electroplating solution containing acids and metal salts and including various additives such as brighteners, levelers and surfactants known in the electroplating art to improve the integrity, smoothness and/or uniformity of electrodeposition on the cathode.

In another embodiment of the MMEP process, the metal ions in the electrolyte are partially, substantially, or fully complexed with one or more chelators. Chelators include those chelators normally found in the art, e.g., EDTA, DPTA, citric acid, di-functional organic acids including for example di- or multi-hydroxybenzene-type compounds, e.g., such as catechol, butylated hydroxytoluene ("BHT"), and the like; dicarboxylic acids such as oxalic acid, malonic acid, succinic acid, glutamic acid, adipic acid, maleic acid, fumaric acid, phthalic acid, isophthalic acid, terephthalic acid and the like; tricarboxylic acids such as citric acid, aconitic acid, trimellitic acid and the like; hydoxycarboxylic acids such as glycolic acid, gallic acid, lactic acid, 2-hydroxybuteric acid, tartaric acid, malic acid, salicylic acid, and the like; ketocarboxylic acids, such as acetoacetic acid, ketoglutaric acid and the like; aminocarboxylic acids such as aspartic acid, glutamic acid and the like; aminopolycarboxylic acids such as EDTA, DPTA, and the like; amino-carboxylic acids; diamines, e.g., such as ethylenediamine; or a combination of any such chelating agents.

In one embodiment, in an electrolyte composition having chelators present, it is preferred that if the complexed metal is one that is beneficial to be reduced at the cathode, then the chelator-metal complex must be able to release the metal ion at the cathode, or otherwise permit the metal ion to be reduced. However, if the complexed metal ion is of a type where reduction at the cathode is not desired, then a stronger chelator can be used, and the complexing agent can inhibit the ability of the cathode to reduce those metal ions.

In one embodiment, for example, a source of strong base or cyanide ion can be used in the electrolyte or in the low-conductivity solution in an anodic generation of complex metal anions such as $Al(OH)_6^{-3}$ or $Fe(CN)_6^{-3}$. Generally, bases are discouraged in an aqueous environment, as the metal ions passing through the membrane may form undesirable precipitates at the membrane. Similarly, cyanide can create handing problems, even within the small confines of a cathode half cell. As discussed infra, other preferred complexing compounds are acetonitrile, and less preferably propionitrile, or a mixture thereof.

Large chelating moieties have an adverse affect that they reduce, relative to un-complexed metal ions, the rate of the complexed ion migration toward the cathode. However, such chelators can also prevent ion migration through selected membranes, for example by size exclusion. For this reason, in some embodiments of the invention, the electrolyte comprises one or more larger yet releasing chelators, including for example salicylic acid, benzoates, naphthanoates, and the like. Such a large metal-complex will not readily diffuse through a membrane, and the membrane can act by means of ion exclusion, size exclusion, or a combination thereof.

Specific, i.e., metal-specific, large chelating materials, in particular crown ethers and nitrogen analogues thereof, including hydrophilic derivatives thereof, can be used in combination with certain electrolyte solvents. For example, for copper, the chelator that forms copper phthalocyanine (or a hydrophilic derivative thereof such as copper phthalocyanine tetrasulfonate), or the chelator that forms cupromeronic blue can be used in the electrolyte. Various crown ethers are known to one of ordinary skill in the art, e.g., a 12-crown-4 is specific for lithium ions. As crown ethers and analogues and derivatives can hold certain metal ions tenaciously and not allow reduction thereof at the cathode, so embodiments that use such crown ethers to chelate metal electropolished from the surface may have the electrolyte be circulated in the half-cell so that the complexed metal ions can be extracted from the electrolyte outside the cathode half-cell.

Of course, if the electrolyte solvent is not water, some salts may have special counterions to enhance solubility. For example, if pure acetonitrile is the solvent electrolyte, tertramethylammonium hexafluorophosphate is soluble enough to provide at least minimally sufficient conductivity. In addition, the polymeric backbone of any metal-neutralized polymer can be modified from for example polyacrylate to instead incorporate hydrophobic or aromatic moieties, using monomers known in the art, to achieve sufficient solubility of the metal-neutralized polymers in the non-aqueous solvent.

Continuous Treatment Of Electrolyte Composition: The half cell can be a closed system, but generally problems such as contamination, gas generation, heat generation, declining ratio of metal to acid, and/or dilution can be dealt with by circulating the electrolyte composition in and out of the half cell and treating the electrolyte. Such circulation can be accomplished by for example a closed pump. While the electrolyte material is outside of the half cell, it can be treated as necessary. Electropolishing generates heat, so the electrolyte may be cooled as necessary to maintain the desired temperature. The reaction at the anode may result in gas generation, for example from the electrolysis of water. The system can include a separator or scrubber to remove gas. The electrolyte may carry entrained particulates, e.g., precipitates or reduced metal. Filtering is generally sufficient to remove these particulates. The polishing process may consume one or more components of electrolyte composition, and these components can be added to rejuvenate the electrolyte composition. As previously noted, during polishing solvent may be lost from or gained by the electrolyte due to transport across the membrane. Appropriate adjustments to electrolyte concentration may be made by addition or removal of solvent from the pumping reservoir. Finally it is desirable to maintain a small positive pressure in the half cell, and the electrolyte fluid can be added or withdrawn in a manner to maintain the desired pressure.

Plurality Of Electrolyte Compositions: Finally, of course, embodiments can comprise two or more electrolyte solutions within the half-cell, which for example are separated by a membrane. Such a system may be desirable if, for example, a first electrolyte composition is desirable at the cathode, and a second electrolyte composition is desirable at the interface of the membrane contacting the work piece. For example, the electrolyte contacting the membrane adapted to contact the work piece may be designed to contain very little of dissolved or solvated metal that is being electropolished from the work piece, for example to further limit potential contamination in the event of a membrane failure. The electrolyte solution contacting the cathode may have a considerable quantity of dissolved or solvated metal that is being electropolished from the work piece, to allow reduction of that metal, forming a steady state. In such case, it is advantageous to have the two electrolytes be separated by for example an interior ion-selective semipermeable membrane. In another embodiment two different electrolytes may be formulated from two mutually immiscible solvents, such as, for example dichloromethane (with other components to increase conductivity and metal solubility) and water. In that case, the less dense electrolyte may contact the one member of the half cell (membrane or cathode) while the more dense electrolyte contacts the lower member of the half cell (cathode or membrane, respectively). It will be understood that, in order to pass current across the liquid-liquid interface, at least one ionic constituent must be mutually soluble in both solvents.

Optional Window Frame-like Structure: In some embodiments of the invention, a partially protective, substantially permeable structure is disposed between the charge-selective ion-conducting membrane and the work piece, wherein the protective coating has holes of sufficient size to allow sensible contact between the membrane and the work piece surface. Such an optional structure may be extremely thin, e.g., on the order of about 0.01 microns to about 2 microns thick, for example between about 0.1 and 0.5 microns thick, such that the holes through which the membrane protrudes need not be large. This optional structure may contact the substrate, but it does not need to do so. Thicker optional structures can be used, but the size of the holes through which the membrane must protrude must be increased accordingly. The optional structure most beneficially comprises a large plurality of openings there-through so that the membrane can substantially contact. The optional structure generally extends over the entire lateral extent of the contact area between the charge-selective ion-conducting membrane and the work piece. The optional structure can be separate from or laminated to the charge-selective ion-conducting membrane. The optional structure can be attached to or separate from the cathode half cell. The optional structure can have the appearance of a window frame, honeycomb, or the like, providing support between the charge-selective ion-conducting membrane and the work piece, but not completely covering the charge-selective ion-conducting membrane and the work piece. In one such embodiment, the protective covering can have the appearance of a thin mesh. The structures may be solid or hollow. Generally, the optional structure is formed from plastic and may incorporate a halocarbon polymer, e.g., a fluorocarbon polymer, providing chemical inertness and a slidable surface. Any optional structure that is substantially inert and tough will suffice. The optional structure can be designed to have several functions.

The optional structure can facilitate distribution of low-conductivity fluid between the work piece and the charge-selective ion-conducting membrane contacting the work piece, either via providing channels for fluid to flow, by providing a reservoir of low-conductivity fluid at all points, or some combination thereof. As discussed infra, the membrane generally exhibits a curved shape, for example like a blister, in part resulting from internal pressure. A protective structure, for example a non-woven porous sheet 0.4 microns thick that has the appearance of a very loosely woven screen or cloth, will result in parts of the membrane being held substantially 0.4 microns from the surface of the work piece, and will provide channels or pathways for low-conductivity fluid to be introduced between the membrane and the work piece.

The optional structure can provide one or a plurality of electrodes which may contact the surface of the substrate. One limiting factor in MMEP is that it will become progressively more difficult to provide sufficient current to the thin layer of metal, e.g., copper, on the surface of the substrate being polished. If the electrical connection is only along an edge, the current will result in increasing voltage drop as the thickness of the conductor continues to decline. This can result in uneven polishing. Having a plurality of slidable electrical contacts can help mitigate this problem. Such contacts must be non-scratching, and may be formed of noble metals, e.g., gold, conductive polymers, or both.

Also, the optional structure can provide either an abrasive action or increased convection, as the textured surface of the optional structure is swept across the surface of a work piece in a "squeegee-like" manner. This may be particularly useful if surface-passifying surfactants are added to the low conductivity formulation. Finally, of course, the optional structure can at least partially protect the charge-selective ion-conducting membrane from wear caused by contacting rough areas of the work piece. The optional structure can provide a low-friction contact.

Additionally or alternatively, the optional structure can be designed to gather and remove oxygen, which will be generated if n is substantially greater than 2. depending on the current density and on the value of n, oxygen generation can be a rate-limiting problem. Generally, larger flow channels such as would normally bring low-conductivity fluid in from the outer boundaries of the membrane-substrate contact area will also be removing gaseous oxygen, either via 2 phase flow, or by having a supply of low-conductivity fluid flowing in a direction to help sweep water away from the contact area, or both, will be sufficient to remove oxygen for a membrane with a small area of contact.

Alternatively, the apparatus of this invention can have no protective covering disposed between the charge-selective ion-conducting membrane and the work piece.

Exterior Membrane: Every embodiment of membrane-mediated electropolishing requires the use of a membrane which separates the electrolyte solution from the low-conductivity fluid and from the work piece. The membrane is a critical component of the MMEP process. Generally, the preferred membranes are charge-selective ion-conducting membranes, described below. These are preferably formed of fluoropolymers, for example, which contribute to membrane inertness and to reduced friction coefficient of the membrane over the work piece. They can be any nominal thickness, for example from about 1 to about 10 mils thick, e.g., from about 2 mils to about 7 mils thick, or what is particularly preferred from a cost standpoint is having the membrane be the thickness which Nafion® membranes are commercially sold.

Charge-Selective Ion-Conducting Membranes: In most of the preferred embodiments of this invention, the exterior membrane comprises a membrane that is at least partially permeable to 100 or more the metal ions electropolished from the work piece, but is substantially less permeable, e.g., a factor of preferably a factor of 1000 or more, to the oppositely charged ions in the electrolyte. The metal ions constitute one of the charged species in the electrolyte. That is, in order to maintain the low-conductivity of the solvent or solution covering the anode, if the metal ions are positive then the membrane must be essentially impermeable to all negative ions in the electrolyte. On the other hand, in order to maintain electrical circuit required for the polishing process, the membrane must, in preferred embodiments of this invention, be permeable by the solvated or complexed metal ions produced in anodic oxidation of the work piece. One class of membranes that meet this criteria are charge-selective ion-conducting membranes.

In membrane mediated electropolishing, ions must pass through the membrane. In contrast, if, as in the method taught in U.S. Pat. No. 6,653,226, these metals solvated or complexed metal ions produced in anodic oxidation are reduced at the membrane, then undesired solids will scratch and damage the work piece.

In the preferred embodiments of this invention, substantially all of the solvated or complexed metal ions produced in anodic oxidation of the work piece pass through the membrane into the electrolyte. This condition, corresponding to a cation transference number of 1, can be achieved by assuring that no ions of opposite charge are capable of permeating the membrane. Most metals to be electropolished require the metal to be the anode, and the resulting ions, e.g., copper, iron, nickel, and the like, will have a positive charge. For the positively charged ions to pass through, then the membrane must be a cation-conducting membrane, as is the case in Examples 1-5. Similarly, anodic oxidation may also be carried out under basic conditions in the presence of negatively charged ligands such as $CN^-$. In that situation, the solvated metal ion may be a negatively charged complex anion and MMEP would require an anion-conducting membrane. Of course, the overall charge is the key, and charged ligands (if any) complexed with a metal can result in a negatively charged complex.

Charge-selective ion-conducting membranes generally consist of solid organic polymers that bear covalently bound ionic functional groups. The bound ions constitute fixed charges that are balanced by unbound, mobile counter-ions of the opposite charge. The latter may diffuse within the membrane or migrate under the influence of an electric field to carry electric current. Small ions in adjacent solutions with the same sign as the mobile counter-ions exchange readily with those in the membrane. By contrast, ions in adjacent solution with the same charge as the fixed ions in the membrane tend to be excluded from such membranes due to electrostatic repulsion. Thus, charge-selective ion-conducting membranes that allow passage of only anions or cations, but not both, if contacting on one side a low-conductivity fluid, will be more or less impermeable to electrolyte solutions (or at least to the ionic components therein) due to exclusion of ions that share the same sign as the fixed charges.

Suitable charge-selective ion-conducting membranes include film-forming ionic polymers that are stable under the conditions of the electropolishing process. A cation-conducting membrane, for example, preferably contains sulfonic acid groups bound thereto. Carboxylic acid groups are also functional. Generally, a carboxylic acid type membrane has a greater electric resistance when compared with the sulfonic acid type fluoropolymer membrane.

Methods for manufacturing suitable membranes without undue experimentation can be obtained by modifying the methods of, for example, U.S. Pat. Nos. 4,983,264, 4,545,889, and 4,909,912. These disclosures describe cation exchange membranes, with higher levels of polar moieties that allow the film to capture and hold ions. As discussed, the membranes of the current invention are distinguished from cation exchange materials in that the membranes of the current invention do not capture and hold ions insufficient quantity to provide a reservoir for the polishing process, but rather allow an ion to diffuse/be driven by gradients of electric and/or chemical potential to the other side of the membrane. Generally, this distinction has real operational differences. A cation exchange membrane more aggressively strips metals from a solution, but would as it absorbed metal ions gradually lose its effectiveness (thereby changing polishing efficiency with time) and will eventually need to be regenerated, after the cation exchange membrane is so depleted of active sites that metals do not absorb thereon but rather stay in solution or precipitate and contaminate the work piece.

A preferred class of membranes for electropolishing copper are cation-conducting membranes, especially those formed from polymeric ionomers functionalized with strong acid groups, with a pKa of less than 3. Sulfonic acid groups are preferred strong acid groups. Preferred polymeric ionomers are copolymers of fluorinated and/or perfluorinated olefins and monomers containing strong acid groups. In one embodiment the membrane is layered, and comprised fluoropolymer membrane comprising at least two integrally laminated layers including a first layer made of a perfluorocarbon polymer having carboxylic acid groups as its ion exchange groups, and a perfluorocarbon polymer having sulfonic acid groups as its ion exchange groups. Alternately, the layers can be separated with fluid therebetween. In another embodiment the membrane can be a single layer having both sulfonic and carboxylic groups, e.g., those made by the copolymerization of a carboxylic acid type monomer with a sulfonic acid type monomer, or by the copolymerization of a carboxylic acid type monomer with a sulfonic acid type monomer, or by impregnating a sulfonic acid type fluoropolymer membrane with a carboxylic acid type monomer, followed by polymerization. Another membrane can be formed from a blend comprising a sulfonic acid group-containing polymer and a carboxylic acid group-containing polymer, is laminated on a sulfonic acid group membrane, as described in U.S. Pat. No. 4,176,215.

Generally, toughness is desirable. Perfluorocarboxylate ionomer membranes or Nafion® perfluorosulfonate ionomer membranes (E.I. du Pont de Nemours, Inc., Wilmington, Del.) are composed of fluorocarbon chains bearing highly acidic carboxylic and sulfonic acid groups, respectively. On exposure to water, the acid groups ionize, leaving fixed sulfonate anions and mobile hydrated protons. The protons may be readily exchanged with various metal cations. Nafion® is particularly well suited for use in MMEP due to its strong common-ion exclusion, high conductivity, strong acidity, chemical stability and robust mechanical properties. MMEP polishing of Cu in water requires an acidic environment at the surface of the anode because at pH greater than 4, $Cu^{+2}$ precipitates from water as CuO or copper hydroxide. Nafion® provides the necessary acidic environment to solubilize $Cu^{+2}$.

An anion-conducting membrane, for example, preferably contains for example quaternary ammonium groups bound thereto. Tertiary or lower amino groups are also functional. Strongly basic styrenic ion-conductive membranes can be formed from for example crosslinked copolymers of styrene and divinylbenzene, to thereby synthesize a crosslinked polystyrene-divinylbenzene, then chloromethylating this crosslinked polymer using a Lewis acid and causing a tertiary amine or the like to add thereto. Such strongly basic resins can be used in ion-conductive membranes in the whole pH range and therefore are utilized in a wide range of applications. Methods for making anion-conducting membranes can be adapted from methods to make anion-conductive membranes with little experimentation. See, e.g., U.S. Pat. No. 6,646,083. Such membranes are commercially available.

To the extent that such charge-selective ion-conducting membranes transport only ions of one sign, this provides two unique advantages for MMEP over EP. Firstly, it prevents contaminating the work piece and low-conductivity solvent by electrolyte. Secondly, since the only source of mobile ions on the anode side of the membrane is the anodic oxidation reaction, all of the current will be carried by these ions. Consequently, these ions must be absorbed and transported through the membrane and removed from work piece at exactly the same rate as they are produced, thereby eliminating a second source of contamination. In processes where this functionality is not desired, the process can include both anion and cation conducting functionalities in a membrane, as described for example in International Publication No. WO 03/098676. For MMEP, however, such a dual function membrane is totally inoperative, as it would allow conductive ions to pass from the electrolyte, through the membrane, and into the low conductivity solution. In addition, the exceptional planarization efficiency of the MMEP process, which distinguishes this invention from other forms of electropolishing, apparently derives from the close relationship between the transport of solvent and anodically generated metal ions across the membrane. This valuable feature of the MMEP process may be severely compromised or lost if a significant fraction of the current is carried by other ions.

Supply Of Low-conductivity fluid: The low-conductivity fluid must generally wet the work piece. Most charge-selective ion-conducting membranes, including Nafion®, require hydration (or analogous solvation) to support ion conductivity, and conductivity decreases rapidly when the water content falls below a critical value. As metal ions migrate away from the interface they carry with them solvent molecules, thus creating a partially dehydrated (or de-solvated) boundary layer within the membrane. Results summarized in the Examples indicate that a thin, partially dehydrated boundary layer provides the highest planarization efficiency, but extreme dehydration can cause the current and polishing rate to decrease nearly to zero. MMEP was first attempted using a Cu work piece immersed in water under static contact with a Nafion® membrane (see Example 1). Under these conditions it was discovered that the membrane developed a strong adhesion to the work piece which persisted for as long as the current was allowed to flow and that the polishing process was largely restricted to the periphery of the contact area. Without being bound by theory, both of these effects are understood to be a consequence of electro-osmotic membrane dehydration. Since each $Cu^{+2}$ ion is solvated by at least four water molecules, transport of $Cu^{+2}$ ions also removes water from the membrane. (Additional water molecules may also be removed from the interface by electro-osmosis). In regions of the membrane near the center of the contact area, where diffusion of water from the surrounding bath is not sufficient to replenish the water supply, the membrane may become sufficiently dehydrated to stop carrying current. At the same time, the osmotic pressure gradient associated with this condition would account for the adhesive force. It was subsequently discovered that by constantly moving the area of contact across the surface of the work piece in a "sweeping" or "rubbing" motion, the efficiency of rehydration was improved sufficiently to avoid the development of strong adhesive forces and provide uniform polishing over the contacted area of the work piece.

Alternatively or additionally, one or more sources of low-conductivity fluid can be provided. One option is to pump the low-conductivity fluid through a channel along or through the membrane. The addition of a protective covering may provide additional protection against dehydration, as discussed infra.

In one embodiment, the polishing face contains low-conductivity fluid-permeable members or areas interspersed among the polishing membranes, wherein these low-conductivity fluid-permeable members have a pressurized source of low-conductivity fluid, e.g., water. The membrane can be similar to the screen or gauze-like protective coverings. Channels extending through the half cell can provide low-conductivity fluid to the interface between the membrane and the work piece, and additionally can provide a method of controlling temperature gain within the half cell.

Property-Selective Semipermeable Membranes: In other embodiments of the invention, the exterior membrane can separate the electrolyte from the low-conductivity fluid by some mechanism other than charge-exclusion. Two other mechanisms known to be useful are size exclusion and polar/nonpolar differentiation.

In size exclusion, generally, ions in the electrolyte composition must be large, while ions generated from the work piece and passing into the low-conductivity fluid must be small. One method of making ions large is, for example, to chelate or complex the ions with large chelator compounds. The use of metal-neutralized hydrophilic polymers such as polymers having carboxylate, sulphonate, and/or other acidic moieties attached to tha polymeric chain, is particularly amenable to size exclusion embodiments. Any common micro-porous membranes, such as those sold by Millipore, Pall, and the like, will be operable. In one embodiment, the size exclusion membrane may be treated to increase the acidity of the pores within the membrane, for example by impregnating the membrane with a small amount of fluid comprising an acidic low molecular weight polymeric material. Generally, size exclusion is less effective than the charge-exclusion membranes, however, as size of pores can change with stress.

Membranes are known in the art that keep separate polar liquids from non-polar liquids. To the extent the metal ions can be solvated in the non-polar liquids, such a separation of electrolyte from low-conductivity fluid can be maintained based on polarity difference, e.g., the lack of miscibility of the two fluids. Again, separation based on polarity is not preferred, however, as it is not robust, and as it is difficult to solvate metal ions in a non-polar fluid without using large chelators, e.g., crown ethers, hydrophillic polymers, and the like.

Plurality Of Ion-Conducting Membranes: In the preferred embodiments of the invention, there is only one membrane disposed between the cathode and the substrate being polished. As described infra, however, in some embodiments of this invention there are a plurality of ion-conducting membranes disposed between the cathode and the work piece. Generally, charge specific ion conducting membranes are preferred, but the internal membranes can be more specific. Generally, the external membrane, e.g., the membrane that contacts an electrolyte composition on one side and contacts the low-conductivity fluid/work piece on the other side, is permeable to all metals electropolished from the work piece.

Internal membranes that contact different electrolyte compositions on either side typically do not need to be as robust as exterior membranes. Internal membranes can be specific to one or more metals, excluding other metals. This is useful if a plurality of metals are being electropolished from a substrate, but some of these metals if they reduce at the cathode will poison a cathode. These metal-specific membranes are also useful if it is not desired to reduce one or more metals in the electrolyte for other reasons, for example the value of the metal or environmental difficulties associated with handling the metal. Internal membranes can be specific to hydronium ions, excluding all metal ions. This is useful, for example, where the electrolyte composition contacting the external membrane has very little of metals that are being electropolished from the work piece, e.g., the electrolyte composition comprises an aqueous solution of sulfuric acid but little copper sulfate, while the electrolyte composition contacting the cathode had a substantial quantity of added metal salts, e.g., an aqueous solution of sulfuric acid and copper sulfate. Generally, such an embodiment will substantially reduce metal ion leakage from the cathode half cell, but will also provide sufficient reducible metal ions, e.g., copper ions, at the cathode to prevent formation of hydrogen gas.

Power Supply: Generally, the power supply is substantially a DC power supply. Electropolishing only occurs when the work piece is an anode, and therefore a DC power supply would seem to be sufficient.

We have found that by interrupting the voltage, or varying the voltage between a first level and a second level, at suitable intervals during the MMEP process, it is possible to increase the planarization efficiency. The power supply is advantageously variable and reversible. It is therefore advantageous for the power supply to be able to supply short-lived variations or pulses in the supply voltage or current. In particular, reducing the voltage from the designed efficient voltage to a value near zero at regular but short-lived intervals increases planarization efficiency under certain polishing conditions. A variation of this apparatus includes the embodiment wherein the substantially DC electric power source provides a pulsed DC current alternating between a high current value and a low current value that is less than 50% of the high current value. For example, the substantially DC electric power source may advantageously provide a pulsed DC current alternating between a high current value and a low current value that is less than 50% of the high current value, wherein the low current value is maintained for a period of time between about 10 microseconds and about 2 seconds. A low current (or preferably no current) time $t_{off}$ less than 10 microseconds is probably dominated by charging current (capacitor effects), and a $t_{off}$ time greater than 2 seconds is simply wasteful as little effect is noted with increasing $t_{off}$ above a few seconds. The high current state can be advantageously maintained at an interval between about 10 microseconds and about 5 seconds. Again, times less than 10 microseconds are dominated by charging current and $t_{on}$ times greater than 5 seconds start approaching steady state behavior. In a preferred embodiment, the electrical power source advantageously provides a pulsed DC current alternating between a high current value and a low current value that is less than 50% of the high current value, wherein the low current value is maintained for a period of time between 50 microseconds and 0.1 seconds and the high current value is maintained for a period of time between about 100 microseconds and 0.2 seconds.

For example, an MMEP process using a continuously "pulsed" voltage comprising 0.2 seconds at 7 V, followed by 0.2 sec at 0 V, successfully planarized features on a Cu damascene wafer with λ=100 and $a_o$=1.0 micron. In this way, MMEP can be used to planarize large features on Cu damascene wafers to within typical industry specifications, without the need for specialized plating technology or mechanical polishing. However, in an example where the $t_{off}$=8 msec and the $t_{on}$=55 msec, more efficient planarization was noted. With times of 0.10 msec for both high and low voltage the process still works well and may be more selective than at longer times.

In some embodiments the "low current value" can even be made negative, e.g., by providing a short-lived reversal of the imposed voltage. For example, if the cathode is being supplied with negative 4 volts, relative to the work piece, a pulse can be provided by reducing the voltage to negative 2 volts, or negative 1 volt, or zero volts, for a short period of time. Without being bound by mechanisms or theories, this may be due to the influence of concentration gradients of protons, metal ions and/or water.

However, the short-lived voltage "reduction" can also be obtained by applying a reversed voltage, e.g., instead of reducing the voltage to 2 volts, 1 volt, or zero volts, the voltage can be set to provide a short-lived pulse of voltage negative 1 volts, for example. While in theory this may result in plating of metal on the work piece, there is little or no metal in the low-conductivity fluid that can be plated, and the time duration is such that no plating should occur. Operating with negative voltages is to be avoided generally as it can cause metal dentrites to grow in the membrane. However, because the current can be reversed for short periods of time without damage and in some instances beneficially, the electric power source need only be a "substantially DC electric power source," which is a power source adaptable to provide a DC current wherein the current is integrated over a sufficient time, and where that term encompasses a DC power source, a pulsable DC power source, and a pulsable DC power source wherein pulses may be of the opposite polarity.

The product of $t_{off}$ times the interfacial velocity represents the length of new surface brought into contact during the recovery period between polishing periods. This "rehydration length" was found to have a systematic effect on the stoichiometric number n. n is the number of electrons required to remove one Cu when Cu oxidation is the only anodic process then n=2. When excess water is present at the interface it can be anodically oxidized in competition with oxidation of Cu, resulting in n>2 electrons/Cu. As shown in Table 3 and FIG. 7, n was found to converge to 2 as the product of $t_{off}$ and interfacial velocity approached the width of the contact area. This indicates that the relative motion of work piece and membrane is the primary mechanism for rehydrating the interface during $t_{off}$ under pulsed operation.

The source of low-conductivity fluid can be modified to take advantage of this phenomenon. While the supply of low-conductivity fluid to the work piece surface can be uniform, for example pumped or a gravity feed system, it may be possible to pulse the source of low-conductivity fluid so that a short-lived excess is present during the $t_{off}$, allowing faster re-hydration of the membrane, and the supply of low-conductivity fluid can be reduced accordingly during the ton when partial dehydration of the membrane provides greater planarization efficiency. A pulsed source can be obtained from any pump providing a timed pulse, and the duration of the pulsed supply of low-conductivity fluid can be matched to the $t_{on}$ and $t_{off}$ of the electric power supply.

Similarly, the movement of the membrane against the work piece surface, while typically continuous, can be made somewhat more intermittent and also be timed to $t_{on}$ and $t_{off}$ of the substantially DC power supply. Such movement can be obtained for example by utilizing stepper motors to drive the movement mechanism. Finally, it may be advantageous to intermittently move the membrane away from the substrate surface and then back toward the surface Work Piece While this discussion generally centers on metal-coated work pieces, it is also useful for a variety of substrates where precise polishing is required (semiconductor vs. dielectric). It may also be advantageous to mechanically raise and lower the half-cell so as to control the contact time. The work piece can comprise any metals and metal alloys. Suitable metals include silver, nickel, cobalt, tin, aluminum, copper, lead, tantalum, titanium, iron, chromium, vanadium, manganese, zinc, zirconium, niobium, molybdenum, ruthenium, rhodium, hafnium, tungsten, rhenium, osmium, iridium, or alloys such as brass, lead/tin alloys, steel, and alloys thereof, compounds such as oxides and/or nitrides thereof, and mixtures thereof, e.g., more than one of the aforesaid metals or metal compounds. Preferred methods comprise polishing work pieces comprising silver, nickel, cobalt, tin, aluminum, copper, lead, and alloys such as brass, steel and/or lead/tin.

MMEP can be used to polish various different metals using strong acid electrolytes in a MMEP cell with a Nafion® membrane. Differences in the coordination chemistry and solubility of different metal ions may require the use of different electrolytes for different metals.

In another embodiment of the MMEP process, a source of strong base or cyanide ion can be used in the electrolyte or in the low-conductivity solution in an anodic generation of complex metal anions such as $Al(OH)_6^{-3}$ or $Fe(CN)_6^{-3}$. Under these conditions, MMEP would require an anion-conducting membrane instead of a cation-conducting membrane.

Alternate Polishing Methods

In a mode of electropolishing different than MMEP, the solvated or complexed metal ions produced in anodic oxidation of the work piece remain in the low-conductivity fluid, and a substitute ion, e.g., hydrogen ($H^+$), passes through the membrane into the electrolyte. This embodiment allows less stringent design criteria for the membrane, as hydrogen-specific membranes that have little or no permeability to metal ions are well known in the art and readily prepared. In such an embodiment, the $H^+$ must be provided by for example electrolysis of water or by an acid in the low-conductivity fluid. Advantageously, the conductive ions in the electrolyte solution comprise a reducible metal, as hydrogen reduction at the cathode is strongly discouraged. This electropolishing method is distinguished by the membrane permeability to an ion ($H^+$) controlling the electropolishing rate as ion migration through the membrane is essential to the electroplating. This method is not preferred because removing the solvated or complexed metal ions produced in anodic oxidation from the low-conductivity fluid is required. Generally, such a process will result in the metal ions that has been oxidized quickly combining with available oxygen to form metal oxides. For polishing to proceed, the metal oxides would need to be abraded from the surface of the substrate, as is done in chemical mechanical polishing. A chelator added to the low-conductivity fluid would help reduce metal ion contamination of non-metal portions of the work piece.

FIG. 10 shows cathode half-cells with one and two membrane "windows" for polishing 4"×4" metal wafer samples on a spin-polishing tool. In both cases, electrolyte solution is continuously circulated through the half-cell cavity by means of a peristaltic pump. Unless otherwise noted, most experiments were conducted at a recirculation pumping rate of 118 ml/min at a hydrostatic back pressure, i.e., pressure within the half-cell, of approximately 14 psi. The membranes were N117 Nafion® with a thickness of 7 mil. The windows are approximately 25×17 mm. The substrate (e.g., a Cu coupon) is mounted face-up on a rotating vacuum chuck and the cathode half-cell is mounted at a radial offset from the center of rotation so that the area of contact sweeps out a circular track. A continuous flow of low-conductivity fluid, e.g., de-ionized water, is delivered into the interface where the membrane is moving over the surface, such that some water is trapped between the advancing membrane and the substrate surface, i.e., in a very thin gap between the cathode half-cell and the work piece.

Method of Polishing Maintaining a High "n" Value

In the prior applications we showed that numerous fluids, mixtures, and/or gels could be used in the Membrane-Mediated Electropolishing process as electrolytes and as low-conductivity solutions. In a preferred embodiment of the Membrane-Mediated Electropolishing process, the anodically polarized Cu work piece is bathed in de-ionized water and undergoes oxidization when it contacts the cation-conducting Nafion® membrane separating it from the contents of the cathode half-cell (e.g., the electrolyte and the cathode). The cathode half-cell contains a cathode, typically a Cu cathode, in contact with electrolyte solution, e.g., an aqueous composition containing acid and a copper salt, for example 0.8 M $CuSO_4$, or $Cu(CN)_3^{-2}$, or mixture thereof, and 0.5 M $H_2SO_4$ in water. There is essentially no migration or diffusion of salts from the electrolyte to the low-conductivity solution, and as a result the work piece is not contaminated by acid or salts from the electrolyte.

Because Nafion® is highly permeable to cations and provides a barrier for anions, the Faradaic current "i" is carried exclusively by cations passing from the work piece into the electrolyte. The concentration of ions in the low-conductivity solution, e.g., in the de-ionized water, is far too low to support the current required for electropolishing when there is any appreciably thick intervening layer of low-conductivity fluid. When electropolishing copper using a low-conductivity solution that does not contain sufficient quantities of nitriles or specific amines which can stabilize $Cu^{+1}$ ions, such as water, the removed copper metal is substantially completely converted to $Cu^{+2}$ ions. Without being bound by theory, virtually all of the current-carrying cations are believed to be supplied by the following reactions:

$$Cu + 6H_2O \rightarrow Cu(H_2O)_6^{+2} + 2e^- \qquad (1)$$

$$9H_2O \rightarrow 2H_9O_4^+ + \tfrac{1}{2}O_2 + 2e^- \qquad (2)$$

Equation 1 shows the oxidation of copper, which in the ionic form is complexed with about 6 water molecules. Equation 2 shows the anodic oxidation of water to produce Oxygen gas and two protons in the form of solvated hydronium ions, such as $H_9O_4^+$ species, which also contains 4 water. The concentration of $Cu^{+1}$ is considered to be negligible because in the absence of stabilizing ligands, it is thermodynamically unstable with respect to disproportionation. Reaction 1 is the desired electropolishing process, and reaction 2 is a desired electrolysis of water.

It is possible to oxidize Cu at potentials low enough to avoid reaction 2. This will provide the greatest coulombic efficiency, i.e., the most copper oxidized and removed per unit of current flow. But planarization of Cu at high removal rates by the Membrane-Mediated Electropolishing process requires sufficiently high voltages that both reactions occur in varying degree. The relative extent of reactions 1 and 2 can be measured by comparing the total amount of charge passed Q with the weight of Cu removed Δm, expressed as the stoichiometric number n, namely: n=(Q/F×Δm)×(63.5 g/mole Cu). When n=2e−/Cu then reaction 1 is the only anodic process, whereas values of n in excess of 2 e−/Cu indicate a corresponding contribution from reaction 2.

In addition to cations, the faradaic current also transports water molecules across the membrane. Assuming the extents of cation hydration indicated in the above equations, then the total number of water molecules coordinated or consumed per electron by these combined faradaic reactions may be estimated at:

$$H_2O/e^- = (9n-6)/(2n) \qquad (3)$$

For n equals 4, water loss is about 3.75 molecules per electron, while at n equals 6, the water loss is about 4 molecules per electron. The water molecules lost per copper atom electropolished is estimated at $(9n-6)/2$, so 15 $H_2O$ are lost per Cu atom at n=4, and 24 $H_2O$ are lost per Cu atom at n=6. Coordinated water molecules migrate with the cations from the surface of the anode across the membrane and into the cathode half-cell by the process of electro-osmosis. Thus, the rate of dehydration of the interface between the substrate surface and the membrane, and possibly also the dehydration of the membrane itself, is determined by n and by the magnitude of current density $I=i/A_c$, where $A_c$ is the area of interfacial contact. Additionally, unless the electrolyte composition within the cathode half-cell has a mechanism for removing water, the above equation also provides an indication of the rate of dilution of the electrolyte composition within the cathode half-cell. It should be recognized that even in the absence of electrical current water may be carried into the cathode half-cell by simple osmosis, or may be forced out of the half-cell by the hydrostatic pressure (reverse osmosis).

Mechanical transport of water to the interface area between membrane and substrate by movement of the work piece with respect to the membrane appears to be the most important re-hydration process. In order to sustain a stable current and achieve effective polishing using the Membrane-Mediated Electropolishing process, electro-osmotic dehydration of the contact area should be balanced by diffusion of water through the membrane and by hydrodynamic transport from the reservoir of de-ionized water surrounding the contact.

An important consideration is the acidity of the reaction zone. The most preferred low-conductivity fluid is very pure water. In the absence of coordinating ligands such as by acetonitrile, ammonia, monoethanolamine, or the like, $Cu^{+2}$ has a very low solubility in water at pH 6 to 7. Aqueous $Cu^{+2}$ precipitates as CuO or $Cu(OH)_2$, according to the equilibrium reactions 4a and 4b.

The solubility of $Cu^{+2}$ in pure water is very low. Precipitation of CuO or $Cu(OH)_2$ is undesirable because solid particles may contaminate or abrade the surface of the work piece, or foul the membrane. The low solubility of copper ions limits mass transport and current density. The very low solubility of CuO and $Cu(OH)_2$ in un-buffered water also limits the flux of $Cu^{+2}$ to the cathode and therefore limits the current density which may flow through a water layer separating the surfaces of the work piece and membrane. For example, assuming that $Cu(OH)_2$ was the only precipitate and that the low-conductivity fluid was pure water having only $H^+$, $Cu^{+2}$, and $OH^-$ in equilibrium with $Cu(OH)_2$, then the net conductivity calculated from the limiting conductivities of all the ions (H+, $Cu^{+2}$, and OH—) would only be 0.2 μS/cm. De-ionized water exposed to an ambient partial pressure of $CO_2$ will commonly have a pH of ~5 and conductivity of ~1 μS/cm due to traces of dissolved carbonic acid and other factors. Under these conditions precipitation of $CuCO_3$ may further limit the solubility of $Cu^{+2}$.

The membrane itself has active sites which are normally acidic. Without being bound by theory, we believe that when the work piece contacts the membrane under conditions where only a fraction of the acid sites on the latter surface are exchanged by $Cu^{+2}$, then protons provided by the remaining sites can maintain a sufficiently low pH to dissolve more $Cu^{+2}$. However, when the acid sites on the membrane are fully exchanged with $Cu^{+2}$ ions the pH can increase. Under those circumstances $Cu^{+2}$ may precipitate as either CuO or $Cu(OH)_2$ according to the following equilibria, (M. Pourbaix, *Atlas of Electrochemical Equilibria in Aqueous Solutions*, Pergamon, London, 1966), where the symbol implies an equilibrium:

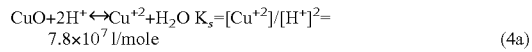

$$CuO + 2H^+ \leftrightarrow Cu^{+2} + H_2O \quad K_s = [Cu^{+2}]/[H^+]^2 = 7.8 \times 10^7 \text{ l/mole} \tag{4a}$$

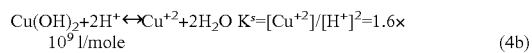

$$Cu(OH)_2 + 2H^+ \leftrightarrow Cu^{+2} + 2H_2O \quad K^s = [Cu^{+2}]/[H^+]^2 = 1.6 \times 10^9 \text{ l/mole} \tag{4b}$$

Thus, un-buffered water in equilibrium with CuO would have pH of about 7.25 and the copper ion concentration $[Cu^{+2}]$ of about $2.4 \times 10^{-7}$ mole/l, or if in equilibrium with $Cu(OH)_2$ then the pH would be about 7.64 and the copper ion concentration of about $8.5 \times 10^{-7}$ mole/l.

As we taught in our prior applications, in some embodiments of the invention it is preferred to use a very dilute aqueous acid solution as the low conductivity solution rather than deionized water, to help prevent precipitation of for example copper ions or other metals which may form in the presence of water at neutral or basic pH. Many metals ions are stable in an acidic environment, and we explained the benefits of having the low-conductivity fluid further comprise acid sufficient to obtain a pH of between 2 and 6.9, for example about 4 to about 6.5 or about 5 to about 6.5. Again, as we taught in prior applications, useful acids can include for example sulfuric acid, carbonic acid, hydrochloric acid, nitric acid, phosphoric acid, pyrophosphoric acid, carboxylic acids, or mixtures thereof. However, the low pH provided by acids is not as beneficial as generating protons by partial electrolysis of water. Addition of acid to the low-conductivity fluid causes an increase in conductivity which allows current to flow outside of the contact area. This results in etching and produced a rough surface. Also, the initial pH is not a sufficient criterion for avoiding CuO precipitation. If a fixed amount of acid is added at low concentration to the low-conductivity fluid, the acid will soon be locally depleted by reactions with CuO or $Cu(OH)_2$ and/or be transported through the membrane into the electrolyte. The use of acids is therefore not usually desirable. An un-buffered dilute acid at low pH 1) can only dissolve a minute amount of CuO or $Cu(OH)_2$ after which the pH will increase and more CuO or $Cu(OH)_2$ will precipitate, and 2) results in increased conductivity and a rougher finished surface, and 3) will tend to increase the amount of metal ions that remain in the low-conductivity fluid rather than be transported through the membrane.

The solubility of most metal ions, and copper ions in particular, increases substantially with decreasing pH. Generally, the pH is determinative of the metal-ion solvating capacity of an aqueous low-conductivity fluid. The pH required to avoid precipitation is dependent on the copper ion concentration, and at very high polishing rates (high removal rate) claimed here, it is necessary to maintain a pH of less than about 5, for example about 4 or below to avoid CuO or $Cu(OH)_2$ precipitation. When $Cu^{+2}$ is generated at the membrane/anode interface at a modest rate then the sulfonic acid groups on the Nafion® membrane ($P_f$—$SO_3H$) are only partially exchanged and remain sufficiently acidic to sustain solubility. But as the membrane becomes fully ion-exchanged to $P_fSO_3$ $Cu_{1/2}$ and/or $P_f$—$CO_2$ $Cu_{1/2}$, then the pH will increase well above the solubility limit. This situation may occur, for example, when the rate of $Cu^{+2}$ generation exceeds the rate of proton diffusion through the membrane from acid electrolyte on the opposite surface. CuO may passivate the surface of the work piece, thereby limiting the rate of oxidation. CuO may form on or in the membrane, thereby impairing the efficiency of the membrane in transporting the polished metal ions. Finally, CuO or $Cu(OH)_2$ are also a potential sources of particulate contamination and defects. It is therefore a high priority to avoid, or to severely limit the extent of CuO or $Cu(OH)_2$ precipitation.

However, the situation changes dramatically when protons are generated at the work piece by anodic oxidation of water. With increasing I, the rate of reaction 2 also increases and becomes an important source of protons to suppress CuO or $Cu(OH)_2$ formation. Equation 4 suggests one mole of CuO or $Cu(OH)_2$ may be dissolved for each two protons generated by the oxidation of water. Thus when n is equal to or greater than 4 $e-/Cu^{+2}$, the rate of proton generation is sufficient in most circumstances to completely suppress the precipitation of CuO, $Cu(OH)_2$, and/or $CuCO_3$, to increase the concentration of $Cu^{+2}$ in any interfacial water layer by maintaining a low pH, and/or replenish the acidic exchange sites in the membrane, thereby assisting in metal ion transport through the membrane. Moreover, the increase in current density due to this additional faradaic reaction also increases the rate of removal of water from the interface. Consequently the thickness and ohmic resistance of the water interlayer may also diminish, and the interlayer may vanish entirely allowing substantially direct contact between the membrane and work piece.

In our prior applications, we described how values of n equal to 2 to 3 were obtained in earlier experiments at <7V and 1<500 $mA/cm^2$. Under those conditions, it was not uncommon to find a thin layer of CuO over the surface or 2-5 µm dark particles presumed to be copper oxide embedded in the surface. By contrast, in the recent experiments at I>700 $mA/cm^2$ and n≧4, the surfaces appeared very clean with few particulate defects under the microscope. Apparently under these conditions where n≧4, the production of protons via water oxidation is sufficient to prevent significant CuO and/or copper hydroxide precipitation. Therefore, while it is possible to perform membrane mediated electropolishing where the value of n is very near 2, by making the value of n be about 4 (2 higher than the value needed to oxidize the metal on the substrate) a sufficient amount of protons are generated via water oxidation to prevent significant precipitation of CuO, $CuCO_3$, and/or $Cu(OH)_2$. Producing protons by electrolysis of water is a critical feature of the present invention, and the acid so generated functions differently than addition of an acid reagent to the low-conductivity solvent. This acid, formed by electrolysis, is formed in a ratio with the amount of copper ions formed, and thus the amount of protons generated is always sufficient to solubilize the copper. That is, at n=4 $e^-/Cu$, 2 protons are produced for each Cu atom oxidized, which is approximately the amount of protons required in an aqueous system to prevent CuO precipitation. The protons formed by electro-oxidation of water have no appreciable counter-ions, and therefore do not increase the conductivity of the low-conductivity fluid as much as would an equivalent amount of acid mixed with the low-conductivity fluid. Also in the absence of counter-ions the protons pass through the membrane, maintaining the acid balance in the membrane so the copper ions formed from oxidation of the substrate do no precipitate within the membrane. Finally, since both protons and $Cu^{+2}$ ions are produced electrochemically (without counter ions) and migrate through the membrane, the conductivity of the surrounding low-conductivity fluid (i.e., in regions where the membrane is separated from the substrate surface by a layer of low-conductivity fluid in an amount sufficient to inhibit copper oxidation) remains low.

Moreover, the resulting increased conductivity within the contact area can support a higher current density and removal rate. The very low solubility of CuO and $Cu(OH)_2$ in water is believed to limit the rate of transport of $Cu^{+2}$ through the low-conductivity fluid and through the membrane to the cathode. For example, assuming that $Cu(OH)_2$ was the only precipitate, then the net conductivity calculated from the limiting conductivities of all the ions (H+, $Cu^{+2}$, and $OH^-$) would only be 0.2 µS/cm, whereas the background conductivity of the de-ionized water used the examples was ~1 µS/cm. This in turn would limit the current density which may flow through a water layer separating the surfaces of the work piece and membrane. Lastly, the beneficial effect of electro-osmotic dehydration of the contact area is to make I more responsive to V, which we believe is a result of reducing the thickness of the low conductivity (e.g., water) layer. This effect is enhanced by the electrolysis of water since water is thereby removed more rapidly than by electro-osmotic transport via $Cu(H_2O)_6^{+2}$ alone. The thickness of the water interlayer will diminish with polishing and may substantially vanish, allowing direct contact between the membrane and work piece.

Removal of water from the layer between the membrane and the substrate can be excessive. If the water between the membrane and the substrate surface is completely depleted, the membrane will adhere to the substrate which may restrict movement and/or damage the membrane. Additionally, at I>2500 $mA/cm^2$ the surface appeared to develop some uniform microscopic roughening. The reason for this is not known, but is may reflect disruption of the interfacial water layer by excessive evolution of $O_2$ gas, and/or the results of the membrane locally dehydrating. If so, various combinations of membrane window size and design and of low-conductivity fluid delivery systems, to get a more uniform layer of fluid disposed between the membrane and the substrate surface, and higher velocity should reduce the roughening.

The stoichiometric value n was determined in the polishing processes that are described in Examples 20 and 21. The results are summarized in FIGS. 16-A, 16-B, 16-C, and 17. FIG. 16-A shows the dependence of RR and n on current density I, where the current density varied from about 600 $mA/cm^2$ to about 2800 $mA/cm^2$; FIG. 16-B shows the dependence of I and n on voltage for the single-window half-cell experiment of FIG. 16-A; and FIG. 16-C shows the variation of removal rate and current density versus voltage. FIG. 17 shows the data of FIG. 16-A, and also shows the dependence of RR and n on current density I for a dual window polisher described in Example 21.

FIG. 16-B shows that, at voltages between about 13 V and about 19 V, that the n value ranges between about 4 to about 6. Values of n between about 2 and 3 were obtained in earlier experiments at voltages below 7V and I below 500 $mA/cm^2$. The data from FIGS. 16-A and 16-B suggest that for this system n will be greater than 3.9 if either the current density is greater than about 1000 $mA/cm^2$, or if the voltage is greater than about 15 volts. Further, the data from FIGS. 16-A and 16-B suggest that for this system n will be greater than 5 if either the current density is greater than about 1500 $mA/cm^2$, or if the voltage is greater than about 16 volts. It is important to note that these experiments were run at an interfacial velocity of 55 cm/sec, which would provide a sufficient influx of water and a sufficiently low dwell time to minimize or eliminate any tendency for the membrane to dehydrate, which may be indicated by an audible squeak coming from the membrane.

FIG. 17 shows the stoichiometric number n increased with increasing I in both experiments. There was no difference in the n value when a dual window polisher was used, as compared to the n value when a single window polisher was used. FIG. 17 also shows the copper RR increases with increasing I for both the single and the double window polishers. The results suggest that the two windows did not substantially affect one another. However, because the RR is proportional to $A_c$, and $A_c$ for the dual window polisher was twice the Ac of the single window polisher, the magnitude and rate of increase of copper RR for the dual window polisher was about twice that observed for the single window polisher.

There is a small decline in n at the very highest voltages, which may reflect an insufficient water supply, much as the audible squeaking at high rates is believed to indicate an insufficient water supply. The lower plot shows that RR also increased with V, consistent with the expectation that RR should vary with the ratio (I/n).

For these many reasons, for a substrate metal requiring 2 electrons to oxidize metal into a stable ion, such as for example copper, preferably n is greater than 3.9, more preferably about 4.0 or greater, for example between about 4 and about 9.0 or alternately about 4.5 and about 8.0. Similar n values are preferred if the low-conductivity fluid comprises water and one or more ligands capable of stabilizing for example copper(I) ions. If a portion, e.g., at least a tenth, for example, of the copper polished from the surface of the substrate is stabilized as copper(I) ions, then preferred n values will be between that required for the above two scenarios.

The process described herein is limited to polishing copper, e.g., metal comprising more than about 50% by weight Cu, preferably more than 80% by weight Cu, and typically more than 95% by weight Cu. Other metals may also be on the substrate, and some of these metals may also be polished using the methods described here. The invention and parameters described here are for conciseness limited to polishing the copper portion of the substrate surface. It shall further be understood that many metal ions other than copper also exhibit increased solubility at low pH, so that the anodic oxidation of water would have similarly beneficial effects for membrane-mediated electropolishing of such metals.

Optionally the low-conductivity fluid comprises water and one or more acids in an amount sufficient to provide a low-conductivity fluid pH between about 2 and 6.9, preferably between about 4 and about 6.9, or between about 6.5 and about 6.9. More preferably, the low-conductivity fluid is water substantially free of acid, wherein protons are created via the electrolysis of water to provide a local pH between about 2 and 6.9, preferably between about 3.5 and about 6.5, or between about 4 and about 5. With the electrolytic formation of protons in the low-conductivity fluid, the ability of the low-conductivity fluid to dissolve and transport copper ions is increased, and the thickness of the layer of low-conductivity fluid between the membrane and the substrate surface is beneficially reduced.

In summary, anodic oxidation of water in parallel with the oxidation of Cu as reflected by $n \geq 3.5$, preferably if $n \geq 4$ e/Cu, should provide any or all of the following beneficial effects for the MMEP process with a Cu work piece: 1) suppress precipitation of CuO, $Cu(OH)_2$, and $CuCO_3$; 2) maintain acidic exchange sites in the membrane; 3) increase current density and removal rate at any given voltage, and 4) minimize the thickness of interfacial water layers. For aqueous systems where the copper(II) ion predominates in solution, advantageously n is greater than 3, preferably greater than about 3.5, more preferably greater than about 4, for example equal to or greater than about 4.5. However, it is not beneficial to increase the value of n without limit. For example, at very high n, the evolution of Oxygen bubbles at the surface of the substrate may be sufficiently great as to disrupt the interface causing non-uniform polishing. Similarly, with increasing n the resulting increase in I may ultimately give rise to heating and other undesirable effects. But most importantly, the removal rate RR is proportional to the ratio (I/n). Accordingly any change in conditions (such an increasing V) which increases n, will only increase RR if it also produces a proportionally greater increase in I. The optimum value of n will therefore be dictated by both fundamental and practical limitation.

In practice, we have found that MMEP on Cu can be usefully operated at high RR with values of n between 3.5 and 9. Beneficially, n is greater than 4, say for example between 4.1 and 8. The preferred n includes the number of electrons needed to oxidize the metal to the thermodynamically stable ion, and also the amount of protons needed to solubilize the metal ions in the low-conductivity fluid. For copper, this value is about 4. Higher n values may be more preferred, however, because the higher resultant flux of protons through the membrane may facilitate transport of the metal ions through the membrane.

Membrane mediated electropolishing of metal, for example copper, from a substrate surface including the steps of:

a) providing a substrate comprising a surface having metallic copper disposed thereon;

b) providing a low-conductivity fluid consisting essentially of de-ionized water to the area on the surface to be polished, so that the surface includes a layer of low-conductivity fluid disposed thereon;

c) movably contacting the substrate surface having the low-conductivity fluid disposed thereon with a cathode half-cell which includes:

i.) a cathode electrically connected to the negative terminal of an electrical power supply;

ii.) a conductive electrolyte composition maintained at a hydrostatic pressure Ph, wherein said cathode is in contact with the conductive electrolyte composition; and iii.) a cation-selective, ion-conducting membrane having two sides and situated so as to contact on a first side the conductive electrolyte solution and on the opposite side the surface of the substrate and layer of low-conductivity de-ionized water disposed on said surface, wherein the area of contact of the membrane to the surface ($A_c$) is greater than zero, wherein the membrane exerts a force $F_z$ which is greater than 0 on the substrate, and wherein the membrane moves relative to and substantially parallel with the surface at a velocity v which is greater than 0, thereby causing the membrane to polish an area $A_p$ of the surface; and d) electrically contacting the copper on the substrate surface to the positive terminal of the electrical power supply as the anode, thereby causing an electrical current of magnitude i to flow and copper to be removed from area $A_p$ of the surface at an average rate RR greater than about 700 nm/min.

In the above process, the current density I, defined as the current divided by the contact area between the membrane and the substrate ($i/A_c$), is advantageously greater than about 500 $mA/cm^2$, for example equal to or greater than 800 $mA/cm^2$, and the stoichiometric number n is between about 3.9 and about 10 electrons per atom of copper removed. The ratio $A_c/A_p$ is advantageously greater than or equal to about 0.02. The tool pressure $P_T$, defined as $P_T = F_z/A_p$, is advantageously less than or equal to about 2 psi. The above process is particularly useful to polish Cu interconnects on the surface of Cu-damascene wafer for the fabrication of integrated circuits.

Another aspect of the invention is a method of membrane-mediated electropolishing of a substrate surface having therein a metal containing copper, said method including:

a) providing the substrate having a surface comprising a metal, wherein the metal consists essentially of copper, wherein at least a portion of the metal on said surface is electrically connected to a positive terminal of a substantially DC electrical power supply, and wherein the surface is at least partially wetted with a low-conductivity fluid comprising water and having a conductivity of less than about $1 \times 10^{-3}$ S/cm;

b) providing a cathode half-cell comprising a cathode electrically connected to a negative terminal the power supply, a cation-selective membrane having interior and exterior sides, and a conductive electrolyte having a conductivity of greater than about $1 \times 10^{-1}$ S/cm in electrical contact with the cathode and with the interior side of the membrane, wherein the cation-selective membrane is adapted to allow metal ions to pass there-through but is substantially impermeable to anions in the conductive electrolyte; and c) movably contacting the wetted surface of the substrate with the exterior surface of the membrane while imposing a voltage V between the cathode and the substrate sufficient to form a current i between the cathode and the metal on the surface, thereby electropolishing metal on the substrate surface, wherein the RR is greater than or equal to about 700 nm/min, and wherein the stoichiometric number n is at least about 2 electrons per atom of metal greater than the minimum number of electrons needed to oxidize the metal. The stoichiometric number n is advantageously between about 4 and 11, preferably between about 4.5 to about 7.5 electrons per atom of copper electropolished from the substrate surface. Advantageously, the current density I is greater than about 1 A/cm², for example between about 1.5 A/cm² and 3.5 A/cm². Generally, to attain such a current density, the voltage V is 8 Volts or greater. The ratio $A_c/A_p$ is advantageously greater than about 0.02, preferably equal to or greater than 0.03, for example equal to or greater than about 0.05. The tool pressure $P_T=F_z/A_p$ is advantageously less than about 5 psi, for example about 2 psi or less. Advantageously, the slope of a polarization curve at the voltage V is at least twice the average slope of the polarization curve from 3 Volts to 7 Volts. Alternatively, the slope of the polarization curve has a positive second derivative at V.

A first aspect of the invention is a method of membrane-mediated electropolishing copper from a substrate at a removal rate of about 700 nm/min or more. In one aspect of the invention, the process variables are controlled so that the Membrane-Mediated Electropolishing process will provide a copper RR equal to or greater than 500 nm/min, preferably equal to or greater than 700 nm/min, for example equal to or greater than 800 nm/min.

In another aspect of the invention, the process variables are controlled so that the Membrane-Mediated Electropolishing process will provide a copper RR equal to or greater than 400 nm/min, wherein n is greater than 3.9, for example from about 4 to about 11.

In another aspect of the invention, the process variables are controlled so that the Membrane-Mediated Electropolishing process will provide a copper RR equal to or greater than 500 nm/min, preferably equal to or greater than 700 nm/min, wherein these polishing rates are realized at a nominal tool pressure $P_T=F_z/A_p$ less than or equal to 5 psi, preferably less than or equal to 2 psi, for example less than or equal to 1 psi, and wherein the drag force $F_d$ of the membrane moving over the wetted substrate surface is less than the normal force $F_z$, preferably less than one half the normal force, more preferably less than one quarter the normal force, for example less than one sixth of the normal force, exerted by the membrane on the substrate.

Figure 5:
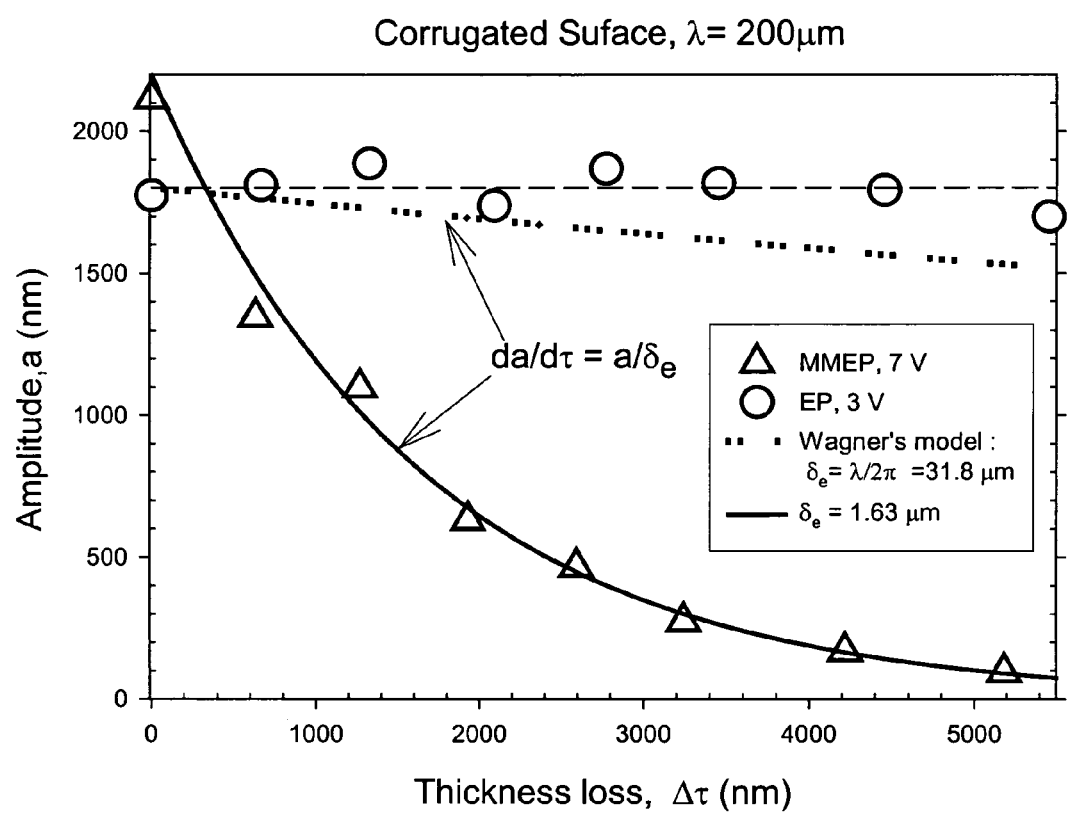
FIG. 5 is a comparison of planarization efficiencies for EP and MMEP under steady-state conditions.

In yet another aspect of the invention, the process variables are controlled so that the Membrane-Mediated Electropolishing process will be conducted at a voltage V and an interfacial velocity v wherein the current density I increases with an increase in the interfacial velocity v. For many polishing systems and parameters, at lower voltages increasing the velocity decreases the current density I, and at higher voltages increasing the velocity increases the current density. FIG. 5 shows a plot of I versus V at 0 velocity and at four different interfacial velocities ranging from 19 cm/s to 56 cm/sec. It can be seen that, for the particular system being used, at a voltage V below about 8 V, increasing the interfacial velocity v resulted in either a reduction in the current density I, or in essentially no change in the current density I. However, at voltages above about 12 V, an increase in velocity v tended to result in an increase in the current density I.

In an alternative to the above embodiment, there is often a voltage where the current density is relatively unaffected by small variations in the interfacial velocity. This voltage is near the point where at lower voltages increasing the interfacial velocity decreases the current density, and at higher voltages decreasing the interfacial velocity increases the current density I. For these systems, we can arbitrarily define a voltage $V_{cr}$ as the midpoint of the range where, at voltages of 3 or more volts below the lowest voltage in the range, an increase in the interfacial velocity v from 20 cm/sec to 40 cm/sec results in no change or in a decrease in the current density I, and where, at voltages of 3 or more volts above the highest voltage in the range, an increase in the interfacial velocity v from 20 cm/sec to 40 cm/sec results in an increase in the current density I. In the tests above and below the voltage range defining $V_{cr}$ that the parameters other than velocity and voltage, including contact pressure, area of the membrane being exposed to the substrate surface, and even the period, magnitude, and duration of voltage pulses if pulsing will be used during commercial use. With normal polishing apparatus, one can determine this velocity $V_{cr}$ with a series of tests requiring a minimum of experimentation. If in practice the interfacial velocity between the membrane and the surface will be outside the range of about 20 cm/s to about 40 cm/sec, it can be useful to determine a value $V_{cr}'$, where the velocities selected for the determination are about 5 cm/sec, preferably about 10 cm/sec, above and below the expected interfacial velocity that will be used for commercial applications, instead of the arbitrarily selected 20 cm/sec and 40 cm/sec used above. The value $V_{cr}'$ is then used in the same manner as $V_{cr}$.

Generally, one embodiment of this aspect of the invention is the membrane-mediated electropolishing of copper from a substrate wherein the voltage is near or above $V_{cr}$, for example from about 4 volts below to about 20 volts above $V_{cr}$. In another embodiment of this aspect of the invention, copper is polished from the substrate surface using voltage(s) in the range between about 3 volts below $V_{cr}$ to about 5 volts above $V_{cr}$, for example in the range about 2 volts below $V_{cr}$ to about 3 volts above $V_{cr}$. In this voltage range, there is very little effect of minor variations in the interfacial velocity v on the current density I. This can be beneficial when, for example, the operator wants the current density to be relatively constant despite minor variations in the interfacial velocity. In another embodiment of this aspect of the invention, copper is polished from the substrate surface using voltage(s) about equal to or greater than $V_{cr}$, for example from voltages of about 2 volts below $V_{cr}$ to about 25 volts above $V_{cr}$, alternately between about $V_{cr}$ to about 15 volts above $V_{cr}$. In this voltage range, the removal rate of the copper from the substrate is maximized. There is no real upper limit on the voltage, but in practice there will be upper voltage limits beyond which effective controlled polishing can not be performed, for example due to oxygen generation displacing low-conductivity fluid, to heat generation, to depletion of the low-conductivity fluid layer between the membrane and the substrate, and/or to safety concerns for equipment and personnel.

In another aspect of the invention, copper is polished at a voltage such that the slope of the polarization curve is greater than about 50 mA/cm² per volt, preferably greater than about 75 mA/cm² per volt, alternately greater than 50 mA/cm² per volt, for example between about 75 ma/cm² per volt and about 300 mA/cm² per volt. The polarization curves in the examples show that for most velocities, the slope of the polarization curve increases with increasing I, at least until a certain voltage is reached. In some tests, this change in slope abruptly reverses, and it is beneficial to polish at a voltage below the voltage where this phenomenon occurs.

There is usually a voltage $V_{sq}$ where an audible squeaking type sound is produced as the membrane moves across the substrate surface. Generally, as the voltage is increased above $V_{sq}$ there will be a point where the membrane sticks to the surface. In another aspect of the invention copper is polished from a substrate surface at voltage(s) below $V_{sq}$, for example from voltages of about 3 volts below $V_{cr}$ to about 1 volts below $V_{sq}$, alternately between about $V_{cr}$ to about 1 volts below $V_{sq}$, or between about 3 volts above $V_{cr}$ to about 3 volts below $V_{sq}$.

In another aspect of the invention, the Membrane-Mediated Electropolishing process when used to polish copper utilizes a voltage V of 10V or greater, preferably 14V or greater, for example from 16 to 20 V, wherein the process has the following characteristics:

1) a cathode being in electric contact with an electrolyte, the electrolyte typically having a conductivity of about 0.1 to about 2 S/cm, for example about 0.2 to about 0.8 S/cm, and a thickness (measured along a path of current flow) typically between about 1 mm and 100 mm, and/or providing a resistance typically between about 0.05 and about 50 Ω-cm², for example about 0.5 to about 5 Ω-cm²;

2) a membrane being in electric contact with the electrolyte on a first side and with the substrate surface wetted with a low-conductivity fluid on a second side, the membrane typically having a conductivity less than about $5 \times 10^{-3}$ S/cm in a dehydrated state, greater than about $5 \times 10^{-3}$ S/cm in a hydrated state and having copper ions therein, and about $5 \times 10^{-2}$ S/cm to about $5 \times 10^{-1}$ S/cm in a hydrated, fully protonated state, and a thickness (measured along a path of current flow) between about 20 μm and 500 μm, and/or providing a resistance typically between about 0.01 and about 50 Ω-cm², for example about 0.2 to about 20 Ω-cm², such that the total resistance between the cathode and the exterior surface of the membrane is between about 0.06 to about 100 Ω-cm² for example about 0.7 to about 25 Ω-cm², but preferably between about 0.06 to about 3 Ω-cm²; and 3) a layer of low-conductivity fluid comprising water being in electric contact with the membrane on a first side and with the substrate surface on a second side, the layer of low-conductivity fluid typically having a conductivity of about $10^{-7}$ to $1 \times 10^{-3}$ S/cm, for example about $10^{-6}$ to about $5 \times 10^{-5}$ S/cm, and a thickness (measured along a path of current flow) typically between about 0.01 to 1 μm, and/or providing a resistance typically between about 02 and about 100 Ω-cm², for example about 2 to about 5 Ω-cm².

In another preferred embodiment of the invention, the Membrane-Mediated Electropolishing process operates at a nominal current density, defined as total current divided by the area of contact between the membrane and the work piece surface, greater than about 0.5 A/cm², preferably greater than about 1 A/cm², more preferably greater than about 1.5 A/cm², for example between 1.5 A/cm and 3.5 A/cm², alternatively between 1.0 A/cm² and 2.5 A/cm². For many commercial uses, a value of I between 400 mA/cm² and 2 A/cm², more typically between 400 mA/cm² and 2 A/cm², will provide a user-specified metal removal rate. While no specific upper bound is anticipated by the invention, the ultimate upper bound on the current density is determined by specific physical, chemical, and mechanical details of the system. The metal removal rate is very high, and it may be desirable to reduce the metal removal rate as the endpoint of polishing is neared, to give more precise control. In addition, in typical semiconductor applications there may not be grounding vias, so the current must pass though a portion of the metal layer, e.g., copper, on said surface to where the metal layer contacts a connection to complete the circuit. The membrane mediated electropolishing process may be separated into two (or more) steps, with the first step being a mass removal at a high current density, e.g., greater than about 1 A/cm², more preferably greater than about 1.5 A/cm², for example between 1.5 A/cm² and 3.5 A/cm², alternatively between 1.0 A/cm² and 2.5 A/cm²; and one or more subsequent steps involving a lower current density, e.g., between about 0.05 and about 1.5 A/cm²; for example between 0.1 and about 0.5 A/cm².

The substrate comprises copper, which is typically but need not be greater than about 95% by weight pure copper. Advantageously the substrate being polished is a copper damascene wafer. Preferably n is greater than 3.9, preferably about 4.0 or greater, for example between about 4.0 and about 8.0. Optionally the low-conductivity fluid comprises water and one or more ligands capable of stabilizing a portion, e.g., at least a tenth, for example, of the copper polished from the surface of the substrate as copper(I) ions. Optionally the low-conductivity fluid comprises water and one or more acids in an amount sufficient to provide a low-conductivity fluid pH between about 2 and 6.9, preferably between about 4 and about 6.9, or between about 6.5 and about 6.9.

In another preferred embodiment of the invention, the Membrane-Mediated Electropolishing process operates at a nominal current density, defined as total current divided by the area of contact between the membrane and the work piece surface, greater than about 0.5 A/cm², for example greater than about 0.8 A/cm², preferably greater than about 1 A/cm², for example between 1 A/cm² and 3 A/cm², alternatively between 1 A/cm² and 2.5 A/cm².

Method of Polishing Maintaining High Current Density and High Removal Rate

One object of this invention is to provide the conditions wherein high polishing rates can be achieved. In preferred embodiments of the invention, the process variables are controlled so that the Membrane-Mediated Electropolishing process will provide copper RR equal to or greater than 400 nm/min, preferably equal to or greater than 600 nm/min, for example equal to or greater than 800 nm/min. This polishing rate is for the entire area of the substrate to be polished, and this rate depends on a variety of factors, not in the least of which is ratio of the area of contact to the area polished ($A_c/A_p$), I, and n. Where, moreover, I and n are functions of the voltage V, velocity v, and contact pressure $P_c$. Therefore one aspect of this invention is a method to membrane-mediated electro-polish a copper-containing substrate at a high current density and also at a high copper removal rate. A principal aspect of this invention is providing a method of MMEP where the nominal current density I is sustainable at greater than 1000 mA/cm², preferably greater than 1500 mA/cm², for example greater than 2000 mA/cm². The discussion above and the examples show that the primary considerations in obtaining a high current density are having sufficient voltage and having sufficient interfacial velocity. Additionally, tool pressure, contact pressure, and membrane area each have important, although secondary, effects. Under most conditions, the voltage necessary to maintain such a high current density, plus the conditions which will allow sufficient water to be present such that the membrane does not stick to the substrate surface, will also be sufficient to ensure than n is greater than 4, and is usually greater than 4.5.

To achieve a high removal rate, the process must maintain a high current density and must have a sufficiently high ratio of contacted surface area of the membrane to area polished by the process ($A_c/A_p$). The removal rate RR is calculated by measuring the mass loss $\Delta m$ for any given processing time t over a given area of polishing $A_p$:

$$RR = \Delta m / \rho A_p t \quad (5)$$

where $\rho$ is the density of Cu (8.92 g/cm$^3$). RR is related to process parameters as follows:

$$RR = V_m/F(I/n)(A_c/A_p) \quad (6)$$

where $V_m$ is the molar volume of Cu (7.135 cm$^3$/mole) and F is Faraday's constant (9.65×10$^4$ coulomb/mole). Equation 6 shows that RR is controlled by two ratios of process parameters. The ratio ($A_c/A_p$) is strictly geometric and subject to tool design. By contrast, the ratio (I/n) is intrinsically mechanistic and may vary systematically with operating parameters such as $P_c$, v, and V.

Tool design provides the most direct route to optimizing RR. We anticipate that a commercial MMEP tool would incorporate multiple membrane windows in order to optimize ($A_c/A_p$). In order to make reliable projections of the performance of such a tool it is important to confirm that each window can perform the same as a single window tool. FIG. 17 shows the results of a direct comparison of the performance of single and double-window half-cells operating in an overlapping region of I. At any given I, RR is seen to be roughly proportional to the total contact area. Most importantly, a removal rate of >800 nm/min was achieved with the double-window half-cell at a current density less than 2000 mA/cm$^2$.

While we have demonstrated current densities well above 3 A/cm$^2$, such high densities are not needed for most tool designs to realize the desired copper RR. For a tool design where $A_c/A_p$=0.06, the current density needed to achieve an RR of 700 nm/min is only 1.2 A/cm$^2$ at n=4, 1.6 A/cm$^2$ at n=6, and 2.1 A/cm$^2$ at n=8. For a tool design where $A_c/A_p$=0.1, the current density needed to achieve an RR of 700 nm/min is only 630 mA/cm at n=4, 950 mA/cm at n=6, and 1.26 A/cm$^2$ at n=8. We have previously shown that polishing head designs having a plurality of membrane windows are available where $A_c/A_p$=0.2, and such a tool would need a current density of about 400 mA/cm$^2$ at n=5 to achieve a metal RR of 700 nm/min, which is very easy rate to achieve at voltages between 12 V and 24 V. So, while we have shown that I can be sustained at rates greater than 2 A/cm$^2$, it is rare that we would need to reach such a high current density to achieve the removal rates specified by integrated circuit manufacturers for the next generation of polishers.

Figure 1:
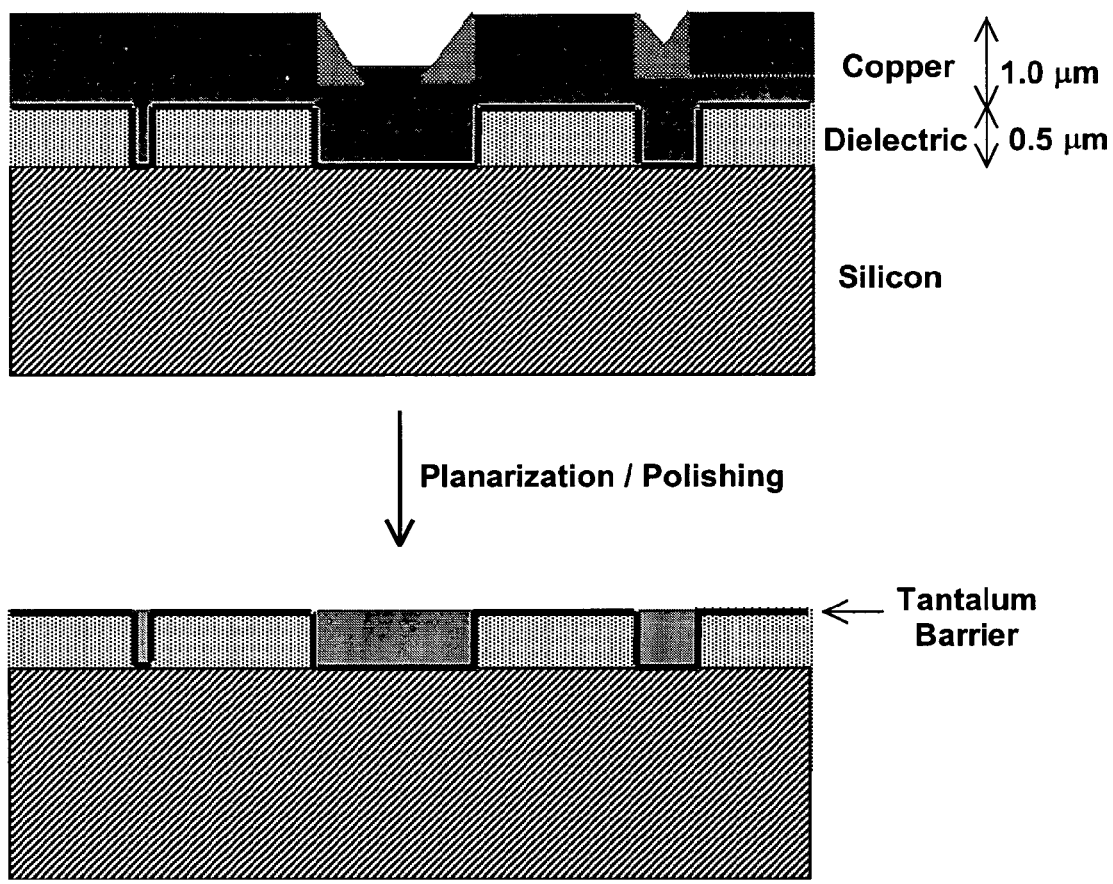
FIG. 1 is a schematic cross-section of a typical copper damascene wafer.
Figure 2:
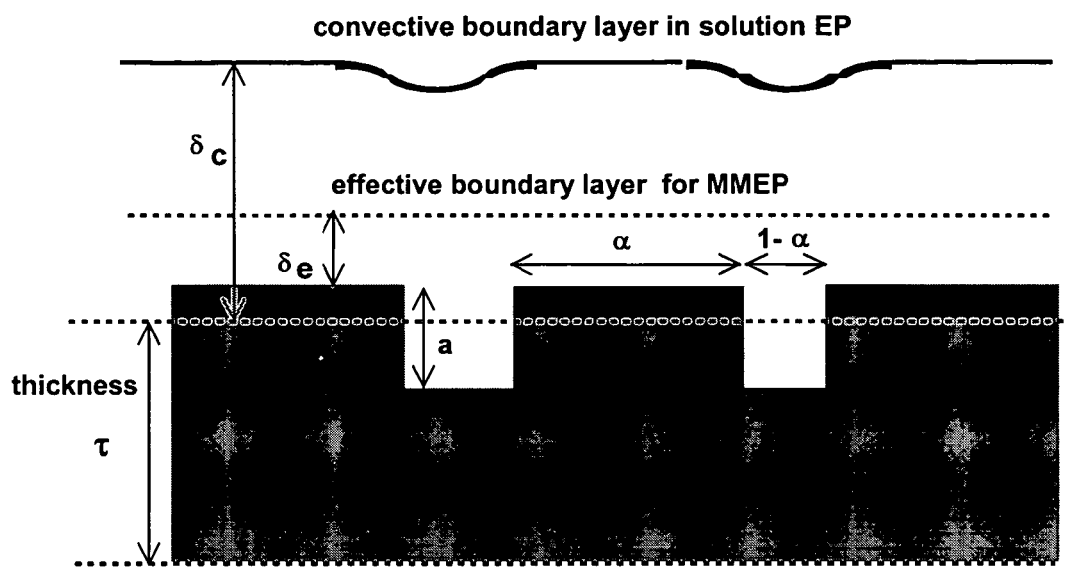
FIG. 2 is a schematic illustration of the various physical dimensions governing planarization efficiency for EP in a convected electrolyte solution versus MMEP.

A limiting value of I is achieved when the rate of electrochemical dehydration exceeds the rate of hydrodynamic water transport. The most compelling evidence for thinning of the interfacial water layer at high current density is the accelerating increase in I with V in this regime. FIG. 2-C shows a representative sequence of phases through which ions must travel to carry current from the anode to the cathode, and the ranges of ionic conductivity and thickness associated with each phase. It is assumed here that if any passivation layer is present it is too thin to introduce a significant ohmic resistance. The cathode is in electric contact with an electrolyte, the electrolyte typically having a conductivity of about 0.1 to about 2 S/cm, for example about 0.2 to about 0.8 S/cm, and 0.25 S/cm in FIG. 11-C, and a thickness (measured along a path of current flow) typically between about 1 mm and 100 mm, about 5 mm in FIG. 11-C. This will provide a resistance typically between about 0.1 and about 50 $\Omega$-cm$^2$, for example about 0.5 to about 5 $\Omega$-cm$^2$, and 1 $\Omega$-cm$^2$ in FIG. 11-C.

The membrane is in electric contact with the electrolyte on a first side and with the substrate surface wetted with a low-conductivity fluid on a second side. The membrane thickness (measured along a path of current flow) typically between about 20 μm and 500 μm, alternately from about 0.2 mm to about 20 mm. The membrane conductivity can vary greatly. Typically a membrane will have a conductivity of about 10$^{-2}$ S/cm to about 10$^{-1}$ S/cm in a fully protonated and hydrated state without copper ions. The conductivity of hydrated and fully protonated N117 Nafion® at 25° C. is 0.089 S/cm. The ionic conductivity of hydrated Nafion® fully exchanged with Cu$^{+2}$ is known to be about 10 times less than the fully protonated form, e.g., about 10$^{-2}$ S/cm in a hydrated state and having copper ions therein. However, for the 7 mil membranes typically used in MMEP, this effect would not introduce a significant ohmic resistance for MMEP. The conductivity of Nafion® decreases with decreasing water content, and when the last few waters of hydration are removed it becomes an extremely poor conductor. Typically a membrane will have a conductivity of about 10$^{-4}$ to 5×10$^{-3}$ S/cm in a dehydrated state. Thus a fully dehydrated boundary layer only a few μm thick would be sufficient to produce a series resistance of several ohms. Therefore, depending upon the extent of dehydration, the resistance of the membrane can typically vary between about 0.01 and about 50 $\Omega$-cm$^2$, for example between about 0.2 to about 20 $\Omega$-cm$^2$.

Our earliest experiments using a static contact (v=0) encountered two kinds of pathological conditions which are likely related to one another. As the current reached a steady-state it was found that the membrane began to adhere strongly to the surface of the work piece; so strongly that attempts to separate the two surfaces severely distorted or tore the membrane. However, the adhesion vanished as soon as the current was interrupted. Also, when extended electrolyses were carried out at v=0, Cu removal was primarily restricted to the periphery of the contact, with little or no polishing over the center of the contact area. Under these conditions, the current density is concentrated on the periphery of the contact area, and consequently when the "nominal current density" value defined by I=i/$A_c$ is measured at v=0 and constant V, I is found to decrease with increasing $A_c$.

This effect could account for the effects of interfacial movement on the distribution of current density. Around the periphery of a static interface, water can be replenished rapidly by diffusion from surrounding layer of DI water, whereas the center of the contact may become sufficiently dehydrated that current density is suppressed by ohmic resistance. Mechanical transport of water by movement of the work piece past the membrane provides a means to continuously re-hydrate the interface and maintain a uniform current density. This hypothesis can also account for the development of strong adhesion at static contacts. In the absence of water, the intrinsic interfacial attraction (molecular dispersion forces) between a dry, compliant polymer surface and a metal with high surface-energy is very high. In the present instance, osmotic pressure gradients across the membrane may also play a role in forcing the surfaces together.

By contrast, when the contact area is kept moving across the surface of the sample (v~20 cm/sec) the adhesive force is suppressed and, when i is measured as a function of $A_c$ at constant V, the nominal current density $I=i/A_c$ is found to be constant (see, e.g., data in Example 15 and in FIG. 13). This indicates that for a moving contact current density is substantially uniformly distributed over the contact area and is given by $I=i/A_c$. However, there may be some systematic variation in the current density over the contact area under some conditions. Without being bound by theory, we believe that adhesion and inhomogeneous distribution of current density at static contacts are both consequences of electro-osmotic dehydration of the membrane at its interface with the work piece, and that the interfacial motion functions to mediate this effect by transporting water into the contact area.

As shown in FIG. 11-C, there is usually a very small layer of low-conductivity fluid comprising water in electric contact with the membrane on a first side and with the substrate surface on a second side. The low-conductivity fluid typically has a conductivity of about $1 \times 10^{-7}$ to about $1 \times 10^{-4}$ S/cm, for example about $10^{-6}$ S/cm to about $10^{-5}$ S/cm. We believe the thickness (measured along a path of current flow) varies with time and position, but the thickness is expected to be less than about 1 μm. It can be seen, however, that the anticipated range of thickness and range in conductivity will result in a variable resistance, say for example between 1 and about 100 Ω-cm².

Movement of the membrane with respect to the substrate is an essential feature of MMEP, as this is the principal mechanism by which low-conductivity fluid is supplied to the area being polished. The apparent role of interfacial velocity in re-hydrating the membrane raises the question of whether this process introduces an actual layer of liquid water between the membrane and the work piece as indicated in Scheme 1. Hydrodynamic conditions in the vicinity of the membrane/substrate interface bear certain similarities with lubricated bearings and the hydroplaning of tires on wet surfaces, where under certain conditions hydrodynamic forces become sufficient to introduce a layer of fluid between two solid surfaces. Evidence for the presence of such a layer was obtained by measuring the effect of interfacial velocity on the current/voltage behavior and on the coefficient of friction.

With increasing interfacial velocity, steady-state currents could be sustained to I>2000 mA/cm², but the curves were shifted to higher V, consistent with an increase in ohmic resistance. The apparent resistance appears to reach a limiting value at velocities greater than about 40 cm/sec. Very similar behavior was obtained with membranes 2 mil or 7 mil thick respectively, indicating that contributions from the bulk conductivity of the membrane are negligible. At v=12 cm/sec, the 2 mil membrane developed sufficient adhesion at an applied voltage of about 2.4V to stop the rotor.

The most compelling evidence for thinning of the interfacial water layer at high current density is the accelerating increase in I with V in this regime. At velocities higher than about 21 cm/sec, there is a trend of increasing slope with increasing voltage. Again without being bound by theory, we believe the phenomenon of the water layer becoming thinner with increasing I is primarily responsible for the generally increasingly steep slope of I versus V at I>1000 mA/cm², because the low-conductivity fluid layer has become so thin (e.g. <100 nm) so as to not introduce any significant resistance. The effect seems to reach level off, or at least become less significant, at v>40 cm/sec.

Thinning of the interfacial water layer at high I should be reflected in a corresponding decrease in ohmic resistance. Thus the observed accelerating increase in I with V on approaching the limiting condition lends further support to this hypothesis. Our earlier MMEP experiments were mostly confined to I<600 mA/cm², where the polarization curve is relatively flat indicating that the hydrodynamic water layer is largely intact. This application describes process performance in the portion of the polarization curve where I≧1 A/cm and dV/dI≧10 Ω-cm², where high removal rates may be achieved, for example RR>700 nm/min, with a polishing half-cell providing $A_c/A_p$ between 0.02 and 0.1.

Provided that a sufficient layer of low conductivity water can be maintained such that the membrane does not dehydrate and stick to the substrate surface, MMEP can be carried out at I greater than 1 A/cm², for example greater than 1.5 A/cm², and even above about 2 A/cm². The data from Example 4 show that high current density, e.g., >1500 mA/cm², for a contact width approximately 1 cm, can be maintained if the interfacial velocity v exceeds about 20 cm/sec. This can be re-phrased as saying that the high current density, e.g., >1500 mA/cm², can be maintained if the velocity is such that the average time a portion of the substrate surface is covered by the membrane is less than about 0.05 seconds. A very high current density, e.g., >2000 mA/cm², for an approximately 1 cm circular membrane, can be maintained if the interfacial velocity v exceeds about 30 to about 40 cm/sec. This can be re-phrased as saying that the high current density, e.g., >2000 mA/cm², can be maintained if the velocity is such that the average time a portion of the substrate surface is covered by the membrane is less than about 0.025 seconds. However, it should be understood that hydrodynamic forces play a major role in determining the flux of water to the membrane interface and that these forces increase with interfacial velocity regardless of the "dwell-time." Consequently these dwell times do not, by themselves, provide completely reliable indications of the limiting current density.

The quantity of water maintained at the interface must reflect a balance between hydrodynamics of the moving contact and electro-osmotic removal of water. Considering that the stiffness of the membrane blister might play a role in the hydrodynamics, we investigated the effects of contact pressure on the polarization curve. The hydrodynamic forces should produce a thicker water layer with a softer, more compliant membrane blister. The polarization curve at the higher contact pressure tapers off, and the polarization curve of the intermediate pressure experiment also showed evidence of tapering off, compared to the curve exhibited by the half-cell run at the lower pressure.

Beneficially, the applied voltage is sufficient to be in the area of the polarization curve where I is highly dependent on V, that is, sufficient to provide a current (or voltage) within the range of current (or voltage) wherein the current density increases at a rate of at least about 50 mA/cm per V, more preferably within the region where the current increases at a rate of at least about 100 mA/cm² per V, and even more preferably within the region where the current increases at a rate of at least about 150 mA/cm² per V. When used to polish copper under conditions described in the examples, this may require a voltage of 9 V or greater, preferably 12 V or greater, for example from 13 V to 25V.

At I>2500 mA/cm², the surface of several polished samples appeared to develop a uniform microscopic roughening. We hypothesize that sticking occurs when the rate of electro-osmotic water removal exceeds the rate of supply, wherein the squeaking sound is due to sticking and stepwise movement of the membrane across the surface. In one embodiment of the invention the process parameters (e.g., I, $P_c$, and v) are controlled to avoid the non-continuous process parameter regimes. Increasing velocity and decreasing $P_c$ appear to increase the rate of water supply. Advantageously, to minimize the effects of sticking, squeaking, and the differential contact time different portions of the substrate surface encounter as the membrane passes over the substrate, it is often preferred that the average current density be maintained at a fraction of the value where sticking is encountered. For example, for small windows such as were described in our examples, keeping the current density below 0.9 times the current density where audible squeaking is heard may help ensure that the polishing will be smooth. In one embodiment, the maximum current density during polishing is controlled to between about 0.7 to about 0.85 times the current density where audible squeaking is heard.

In one preferred embodiment, the operating parameters include I is greater than or equal to about 1 A/cm$^2$, n is greater than or equal to about 4 electrons/Cu atom, and $A_c/A_p$ (contact area of membrane to surface versus area to be polished) is greater than or equal to about 0.02, for example greater than or equal to 0.03, preferably greater than or equal to about 0.05, more preferably greater than or equal to about 0.07. In another preferred embodiment, the operating parameters include I is greater than or equal to about 1500 mA/cm$^2$, n is between about 4.5 and about 8, and $A_c/A_p$ (contact area of membrane to surface versus area to be polished) is between about 0.03 and about 0.1. In yet a third preferred embodiment, the operating parameters include I is greater than or equal to about 2000 mA/cm$^2$, n is between about 5 and about 7, and $A_c/A_p$ (contact area of membrane to surface versus area to be polished) is between about 0.03 and about 0.1. In each of the above preferred embodiments, the contact pressure $P_c$ is preferably less than 15 psig, preferably less than 10 psig, for example between 0.5 and about 10 psig. In each of the above preferred embodiments, the interfacial velocity is preferably greater than 20 cm/sec, preferably advantageously sufficient such that the average time a portion of the substrate surface is covered by the membrane is less than about 0.2 seconds, for example about 0.1 seconds or less, for example about 0.05 seconds or less. Beneficially, where $P_c=F_z/A_c$, where $F_z$ is the normal force, then advantageously $P_c$ is less than or equal to about 10 psi, preferably is less than or equal to about 5 psi, more preferably is less than or equal to about 2 psi. Where the pressure in a half cell is maintained by a pump circulating an electrolyte against a backpressure, then the hydrostatic pressure ($P_h$) in the cathode half cell is related to $P_c$.

In preferred embodiments of the invention, the pressure inside the half-cell is maintained by a process wherein the contact pressure $P_c$ does not increase with contact area $A_c$. The data in the Figures and Examples shows that, for $A_c/A_p=0.059$, a copper removal rate greater than 900 nm/min at an average current density I=1500 mA/cm can be readily maintained. Preferred half-cell tool designs are such that $A_c/A_p$ is greater than about 0.03, preferably greater than about 0.05, more preferably greater than about 07.

In conventional chemical mechanical polishing, one method to achieve higher RR is to increase the tool pressure. For MMEP at a given contact pressure, increasing the contact area $A_c$ will increase the force $F_z$ applied by the membranes on the substrate. One advantage of MMEP, is that lower tool pressures are advantageously employed. In traditional chemical mechanical polishing, one method of increasing polishing rates is to increase the tool pressure which often referred to as the "down force." Generally, however, lower tool pressure is preferred. In chemical mechanical polishing, as in MMEP, only a fraction of the surface of the work piece or fraction of the polished area $A_p$ actually contacts the high-points or asperties on the surface of the polishing pad at any given instant.

Consequently the tool pressure or "down force," which represent the total force divided by $A_p$ is only an average of the instantaneous forces at each point on the surface. The force between the polishing surface and substrate can cause substrate failure in any one layer of the integrated circuit, and the failure may not be detectable until the product is fully manufactured. Additionally, the increasing use of new dielectric materials, i.e., relatively fragile or brittle low-K dielectric materials, also exacerbates the problem. In the above example, the normal force $F_z$ was independently measured to be 318 gm. Dividing the normal force by the total processing area $A_p$ gives a tool pressure of only 0.43 psi. The tool pressure used in MMEP is substantially lower than that used in conventional chemical mechanical polishing. In this example, the normal force divided by the contact area $A_c$ gives a contact pressure $P_c=7.3$ psi. For comparison, it has been estimated that for a conventional chemical mechanical polishing apparatus using a pad and slurry, a tool pressure of 5 psi corresponds to an actual contact pressure of 20 psi because only about 25% of the wafer actually contacts the pad surface at any given instant. On the microscopic scale, the colloidal abrasive particles that are essential components of chemical mechanical polishing exert even higher mechanical stresses. In summary, on both macroscopic and microscopic scales, MMEP exerts much less mechanical stress on the substrate than chemical mechanical polishing, especially when the two are operated at high removal rates.

For comparison with chemical mechanical polishing, an important variable is the tool pressure $P_T$ (also referred to as the "down force"), which is defined as the normal force exerted by the pad onto the wafer (substrate) divided by the area of the wafer. In terms of our experiments this is represented by $F_z/A_p=P_c(A_c/A_p)$. In polishing a copper wafer, we achieved a current density I=1376 mA/cm$^2$ at a stoichiometric number n=5, where the contact pressure was $P_c=2.5$ psi. For a tool design with $A_c/A_p=0.06$ this provides a removal rate of 733 nm/min and a tool pressure Pt of about 0.15 psi. This compares favorably to tool pressures normally encountered in conventional chemical mechanical polishing processes which typically range from 2 psi to 6 psi.

It is preferable when membrane mediated electro-polishing of wafer substrates that comprise low-k dielectric material that ($F_z/A_c$) be less than 10 psi, preferably less than 5 psi, and $P_T=(F_z/A_p)$ be less than 2 psi, preferably less than 1 psi. Alternatively, these high polishing rates may be achieved at contact pressure $P_c=F_z/A_c<15$ psi, preferably $P_c<10$ psi, for example $P_c<5$ psi, and a ratio of contact area to polishing area $A_c/A_p<0.10$, preferably area $A_c/A_p<0.08$, such that the nominal tool pressure $P_T=F_z/A_p$ is <1.5 psi, preferably $P_T<1.0$ psi, for example $P_T<0.5$ psi. This tool pressure is the total force exerted by the membrane on the substrate surface, divided by the total surface area to be polished. Additionally, it is preferred to use an interfacial velocity of at least 40 cm/sec, preferably at least 50 cm/sec, to reduce the drag forces exerted on the substrate.

Beneficially, the contact area is maximized to the extent that the membrane can be moved across a wetted substrate with a layer of low-conductivity fluid disposed between the membrane and the substrate surface, for example $A_c/A_p$ is at least 0.03, e.g., between about 0.04 and 0.2. It is generally beneficial to maximize the ratio of the area of contact of the membrane $A_c$ to the total polishing area $A_p$. However, the beneficial results may not be achieved simply by manufacturing and using very large membranes having large surface areas. As the membrane passes over a area of the wafer, a certain fixed thickness of water is trapped between the membrane and the substrate surface. We showed that at very high voltages (e.g., V>20 V) and/or very high current density (I>1500 mA/cm$^2$), the water loss due to electrolysis and due to transport through the membrane would be sufficient, at a given set of conditions, for the water layer to apparently be completely removed from between the membrane and the wafer surface. These experiments were done with a membrane window with dimensions of between about 1 and about 2.5 cm along each side, and the velocity of the membrane across the substrate surface was on the order of 15 to 30 cm/second. The "contact time" for a portion of the substrate to be contacted by a portion of the membrane can be estimated to be the contact area width (~1 cm) divided by the velocity (~20 cm/sec), which gives an average contact time of about 0.05 seconds. For this reason it may be beneficial to have the polishing apparatus consist of a plurality of windows, with space between each window such that each window appears to function independently of the other windows. In this manner, the ratio $A_c/A_p$ can be increased without utilizing overly wide membranes.

In one embodiment of the invention, the width of the membrane, defined as the length measured in the direction the membrane is advancing, is less than about 4 cm, for example less than about 2.5 cm, for example between about 0.5 cm and about 1.7 cm. This could be done by manufacturing small membrane windows. Alternatively, as was presented in our earlier applications, the use of a window-frame-like structure disposed between a membrane and a substrate surface can beneficially divide a larger membrane area into several smaller areas defined by the area in which the membrane projects through the "windows" formed by the window-frame-like structure. Advantageously, the window-frame-like structure can additionally be used to provide sources of water or other low-conductivity fluid to the region between the windows by incorporating or forming regions where the low-conductivity fluid can flow between the windows, and/or to provide surface contact electrical connections to help remove current from the surface, using soft inert metal connectors and/or conductive polymers as a part of the window-frame-like structure. The various embodiments of a window-frame-like structure were described in our prior filed applications, which are incorporated herein by reference.

Additionally, other methods of introducing low-conductivity fluid to the area within the contact area of the membrane and the substrate surface, which have been described in our previous applications, are incorporated herein by reference. Such methods can include for example a supply of low-conductivity fluid that extends through the membrane and introduces low-conductivity fluid to a small cavity that is, for example, substantially bounded by areas of contact of the membrane to the substrate surface. Such methods also include incorporating regions within the membrane area of contact where the flow of current is substantially blocked, for example where there is an insulator disposed between an area or areas of the membrane and the cathode. In our prior applications, we suggested a wide variety of fluids, especially polar organic fluids, which may be useful when admixed with the low-conductivity fluids. This is one of several methods we described which may affect the osmotic flow of water across the membrane. This material from our earlier filed applications is incorporated herein by reference. Various combinations of the above can be used, and it is anticipated that having the benefit of this disclosure one of ordinary skill in the art will be able to develop a variety of mechanisms that will introduce predetermined volumes of low-conductivity fluid to the region between the membrane and the substrate surface.

Advantageously, in another embodiment, the shape of the membrane is such that the contact time between a point on the substrate and a portion of the membrane is approximately equal to the contact time for any other point on the substrate that is contacted by other portions of the membrane. Alternatively, the product of the contact time and the current density for a region of the membrane are made to be approximately equal for various parts of the membrane or membranes. In prior applications, we discussed embodiments where different areas of a membrane had different cathodes, such that the voltage (or current) could be independently controlled. This material from our prior applications is also incorporated by reference here.

In one embodiment, the membrane window forms a circle or oval. For this purpose, a shape like an octagon is substantially circular, and a "FIG. 8" shape, such as shown in FIG. 10-B, is substantially oval. This shape is especially useful if both the polishing head holding the membrane and the wafer substrate are both independently rotating. Then, the difference in polishing rate, which will average out as a simple function of the distance from the center to the edge of the circular or oval contact area, can be readily estimated, and the polishing process can be controlled to make sure the entire surface has approximately the same contact time times current density.

While the highest RR achieved in these experiments, >800 nm/min, are certainly attractive for planarizing Cu interconnects, practical considerations such as heat dissipation may preclude operating at such high I for at least a portion of the polishing process. In such cases, it is preferred to increase the ratio $A_c/A_p$ to off-set a reduction in I while maintaining the same RR. When the polishing process is nearing an endpoint, then other considerations will generally result in the desirability of lower polishing rates. In particular, lower rates will allow better control and easier timing of the appropriate end point, and as the layer of metal becomes thin then high rate polishing may result in unacceptable heating of the substrate surface simply from current flowing along the metal layer to the connector, which is typically located along the edge of the substrate.

The $Cu^{+2}$ ions, the protons, and some water will migrate from the low-conductivity fluid to the electrolyte. The amount of water in the electrolyte may need to be monitored and controlled, though moderate dilution of the electrolyte is not generally viewed as a serious problem. Additionally, as one copper ion and two protons migrate through the membrane and into the electrolyte, positive ions must be reduced at the cathode to maintain the charge balance. The concentration of $Cu^{+2}$ in the electrolyte is intentionally maintained at a high value to supress the reduction of protons and evolution of $H_2$ and assure that $Cu^{+2}$ reduction (plating) is the only cathodic reaction. Consequently, more $Cu^{+2}$ is removed at the cathode than is supplied by the anode, so that $CuSO_4$ in the electrolyte is gradually converted to $H_2SO_4$. Therefore, the copper ion concentration in the electrolyte should be intermittently checked and replenished as needed.

Additionally, a more important, though not pathological issue is loss of $Cu^{+2}$ from the electrolyte when the rate of plating at the cathode is greater than the rate of anodic generation of $Cu^{+2}$, e.g., when n is greater than 2, due to anodic of water oxidation. This may require adjusting the $Cu^{+2}$ concentration in the electrolyte reservoir, most likely by means of an independent cell, for example a Cu anode/Air cathode cell. Other methods, including having a membrane with a water permeability sufficient to allow flow of water from the half-cell, are also envisioned. Such a membrane can, but need not, allow the water passing from the half-cell to be admixed with low-conductivity fluid. Less stringent control of ion migration is needed if the water leaving the half cell is not admixed with low-conductivity fluid. Reverse-osmosis (to remove excess water from the electrolyte) is driven by pressure, and if the half-cell pressure is not sufficient to drive the reverse osmosis process, the outlet pressure of an electrolyte-circulating pump may be used, by the simple expedient of locating the reverse osmosis membrane near the outlet of the pump.

It is clearly beneficial to control most of the variables in MMEP. FIG. 18 shows an instrumented MMEP tool that allows us to measure (and control) the normal force and drag force at the membrane/work piece interface during the course of the MMEP process. A preliminary measurement was made of the forces on a wet contact as a function of interfacial velocity in the absence of electrochemistry. The results, shown in FIG. 19, show a dramatic reduction in the drag force with increasing v for a contact area $A_c \sim 0.5$ cm$^2$ under contact pressure $P_c = 4$ psi. This response suggests a hydrodynamic lubrication effect where interfacial shear carries a layer of water between the surfaces, and the thickness and corresponding normal stress increase with the strain rate. These results are consistent with the foregoing analysis of the polarization curves and suggest that the contact mechanics of MMEP may be a much less aggressive than the abrasive mechanics of chemical mechanical polishing. We anticipate that the drag force will provide a sensitive measure of electrochemical dehydration of the interface in MMEP and may be exploited for process control.

EXAMPLES

While data from many experiments is discussed above, this section will present results of selected experiments that show specific aspects of the invention.

Nafion® PFSA membranes (N112, N115, N117, and NE1135, E. I. DuPont de Nemours and Company, Inc., Wilmington, Del.) are non-reinforced films based on Nafion® PFSA polymer, a perfluorosulfonic acid/PTFE copolymer in the acid (H+) form. Copper coupons (0.016" thick, 110 alloy, 99.9%) were obtained from McMaster-Carr Supply Co., P.O. Box 440, New Brunswick, N.J. 08903-0440. Examples of Cu damscene wafers 854 AZ and 954 AZ were obtained from International SEMATECH, 2706 Montopolis Drive, Austin, Tex. 7841. These comprised silicon wafers with 0.5 to 1.0 mm layer of oxide dielectric, covered by 200 nm barrier layer (Ta/N and Ta) and 1.0

Example 1

Membrane-Mediated Electropolishing of Cu Coupons

A cathode half-cell was constructed for membrane-mediated electropolishing (MMEP) whose cross-section is shown schematically in FIG. 3. The half-cell comprised a polypropylene base (1) bolted to a stainless steel faceplate (2) which framed an opening approximately 1.0 cm×2.5 cm. This opening was covered by a piece of Nafion® membrane (4) (NE1135, 3.5 mil thick) sealed against the faceplate by means of a silicone rubber gasket (3) approximately 0.5 cm thick. A piece of copper foil (6) was sealed to the base and electrically connected to a wire on the outside of the half-cell. The cavity (5) defined by base, gasket and membrane contained two ports (7) connected to Teflon® tubing (OD⅟₁₆") through which the electrolyte (0.2 M copper sulfate in 40% phosphoric acid) was continuously re-circulated by means of a peristaltic pump (not shown) from an external reservoir. Electrolyte was pumped through the half-cell at approximately 10 ml/min producing a positive pressure inside the half-cell that caused the membrane to expand (bulge) slightly, forming an liquid-filled elastic bubble or blister.

In operation, the copper foil served as the cathode and was connected to the negative terminal of the power supply (Princeton Applied Research Model 173 potentiostat/galvanostat, EG&G Instruments, P.O. Box 2565, Princeton, N.J. 08540). The work piece (8) consisted of a flat piece of copper sheet metal (⅕"×3") whose surface had been uniformly milled with 600 grit carborundum abrasive. The work piece was immersed in a shallow bath of deionized water and a voltage of 5.0V was applied between the anode and cathode. When the external surface of the half-cell membrane was brought into contact with the water bath only a small current was observed, zero to a few mA, depending on the distance from the work piece. By contrast, when the convex external surface of the membrane was brought into contact with the work piece, the current increased to at least 200 mA. Polishing was accomplished by rubbing the external (convex) surface of the membrane over a small area of the work piece (ca. 2 cm$^2$). During this process the current density converged to a steady value of approximately 150 mA and the surface of the work piece was observed to become smoother and brighter.

The total amount of copper removed from the work piece was determined by weighing the coupon before and after polishing. By comparing the weight loss with the total amount of charge passed it was computed that the number of electrons per Cu atom dissolved was 2.3±0.2, consistent with the production of $Cu^{+2}$ ions. (The slight excess over 2.0 may be tentatively ascribed to oxygen production). The change in thickness Δτ was calculated from the total charge passed per unit area (Q) and the density of copper (8.9 g/cm$^3$). The roughness of work piece was measured by means of profilometry (Model P15, KLA Tencor 160 Rio Robles, San Jose, Calif. 95035) before and after the polishing operation. For each data point, 0.4 mm profilometry scans were made at five different locations on the sample and the standard deviation roughness (R) was calculated. The results, summarized in Table 1, show a dramatic decrease in roughness with very little loss of thickness.

TABLE 1

Changes in roughness R (0.4 mm scans) on milled Cu coupons, before and after polishing using MMEP.

| Sample | Q coul/cm$^2$ | R nm | ΔR nm | Δτ nm | ΔR/Δτ |
|---|---|---|---|---|---|
| Milled | 0.0 | 310 | 0 | 0 | |
| 1A | 1.4 | 183 | 127 | 442 | 0.29 |
| 1B | 2.2 | 82 | 228 | 695 | 0.33 |
| Milled | 0.0 | 314 | 0 | 0 | |
| 1C | 3.0 | 53 | 262 | 948 | 0.28 |
| 1D | 3.1 | 41 | 274 | 980 | 0.28 |
| Milled | 0.0 | 300 | 0 | 0 | |
| 1E | 3.5 | 34 | 266 | 1106 | 0.24 |
| 1F | 3.7 | 8 | 292 | 1169 | 0.25 |

Example 2

Comparison of Membrane-Mediated and Conventional Electropolishing

Two copper coupons (1.5"×2.0") were milled as in Example 1 and then masked with tape so that only an area of 0.71 cm$^2$ was exposed. One of these coupons was polished by MMEP using the same procedure as in Example 1. The second coupon was polished by the conventional electropolishing (EP) method. For EP a silicone rubber gasket ⅜" thick was used to separate the work piece from a sheet of copper foil which served as the cathode. A cylindrical cavity in this gasket provided a volume between the work piece and cathode filled by electrolyte solution that was continuously pumped through cavity. The area of work piece exposed to electrolyte in the EP cell was the same as that polished by the MMEP process. The same electrolyte (0.2 M Copper sulfate in 40% phosphoric acid) and the same pumping rate was used in both sets of polishing experiments. The root-mean-square roughness $R_g$ was measured by profilometry and the results are summarized in FIG. 4. The polishing efficiency, represented by the ratio $\Delta R/\Delta \tau$ is seen to be much greater for MMEP (0.26) than for conventional EP (0.07).

We have found that at comparable polishing rates, MMEP can provide much higher planarization efficiency than EP. Moreover, for large features with $\lambda=200$ microns, the planarization efficiency of MMEP is much greater than that for the "ideal" EP process which would require extremely slow polishing with non-convected electrolyte.

Figure 4:
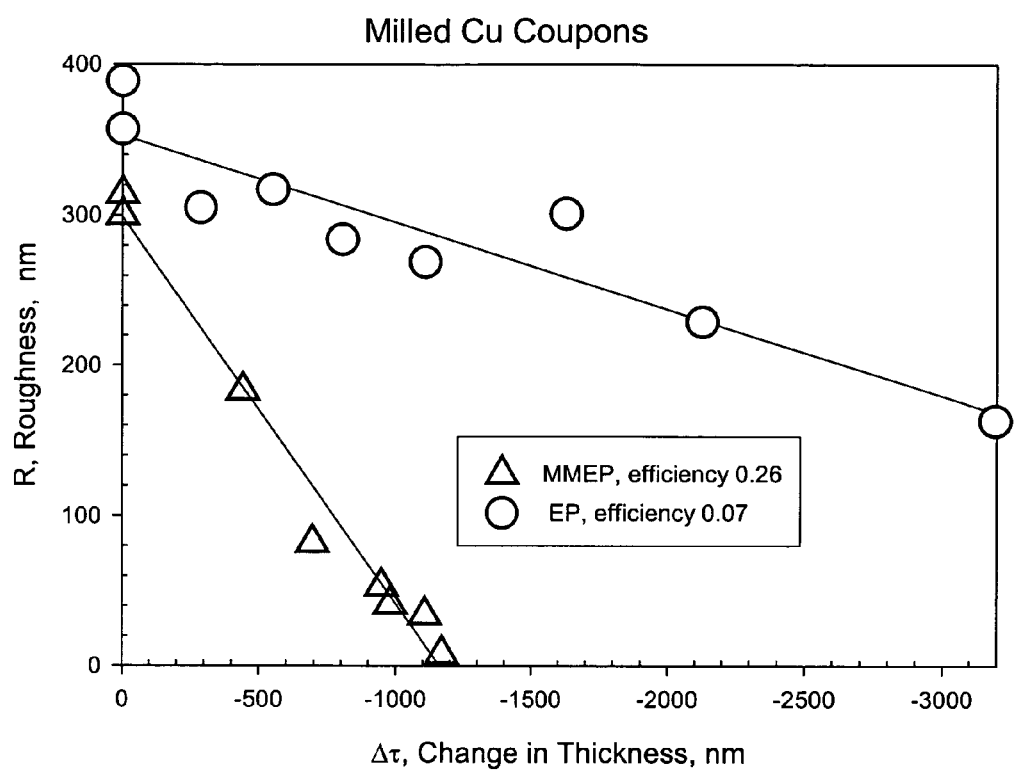
FIG. 4 is a graph comparing the polishing efficiencies of MMEP and EP.

FIG. 4 shows the decrease in surface roughness R obtained by polishing milled Cu coupons using EP (prior art) and MMEP. The same voltage, electrolyte composition and pumping rate were used for both processes, and the resulting current densities were comparable (0.1 to 0.2 mA/cm²). It is apparent that the planarization efficiency (reflected by the slope $\Delta R/\Delta \tau$), for MMEP is more than three times higher than for EP. Roughness R represents an average of the topographic amplitude a for many features with a wide range of lateral dimensions $\lambda$. FIG. 5 shows the results of polishing by EP (prior art) and by MMEP a work piece with corrugated surface topography consisting of 100 micron ridges separated by 100 micron trenches. The results for EP show no significant planarization, i.e., decrease in the topographic amplitude "a," consistent with Wagner's prediction for well-convected conditions, whereas the results for MMEP show a substantial decrease in "a" which conforms to the equation:

$$da/d\tau = a/\delta_e \quad (7)$$

where $\delta_e$ is an empirically determined parameter. It should be noted that equation 7 is of the same form as Wagner's "ideal" EP process ($da/d\tau=2\pi a/\lambda$), but also that the magnitude $\delta_e=1.63$ micron, which describes the MMEP results, is much smaller than that predicted for the "ideal" EP process, namely: $\lambda/2\pi=31.8$ micron (dotted line in FIG. 5). This demonstrates that the MMEP process is much more efficient than the "ideal" EP process for planarizing features of large $\lambda$ and is even capable of planarizing such features under well-convected conditions where EP is totally ineffective.

Example 3

Comparison of Membrane-Mediated and Conventional Electropolishing for Planarizing Surfaces with Large-$\lambda$ Features A copper coupon was polished to a mirror finish using jeweler's rouge, then laminated to a dry-film photoresist (Riston® 9415, E.I. Dupont de Nemours and Company, Inc., Wilmington, Del.). The photoresist film was covered with a lithographic negative patterned with 100 micron lines interspersed with 100 micron spaces, and then exposed and developed under conditions recommended by the manufacturer (DuPont Riston® Printed Circuit Materials, RD 1, New James St., Towanda, Pa. USA 18848-9784). The exposed areas on the coupon were etched for 1 minute in a 5% solution of sodium monopersulfate (Sigma-Aldrich, Milwaukee, Wis.), followed by conventional electropolishing at 2.0 V and 1.5 coul/cm² (as described in Example 2). The resist mask was then removed by soaking in dichloromethane, leaving a corrugated surface with alternating 100 micron trenches and 100 micron plateaus. The coupon was masked with tape leaving two circular areas (each 2.3 cm²) exposed. The amplitude of five corrugations in each of three different locations within each area was measured and averaged. One area was then polished via MMEP as in Example 1 at 7.0 V, and the other area was polished via conventional EP as in Example 2 at 3.0 V. Following each polishing session the amplitude of corrugations at the same location were re-measured and averaged. The results are plotted in FIG. 5. These data confirm that MMEP is capable of planarizing large-$\lambda$ features for which conventional EP is totally ineffective. For comparison, the dotted line represents Wagner's prediction for ideal (non-convected) EP when $\delta_c > \lambda$, and the dashed line shows Wagner's prediction for EP when $\delta_c < \lambda$. As expected for well-convected conditions, the data for EP conform to the latter limit. The solid line represents the best fit of the MMEP data to the function $a=a_o \exp(-\Delta \tau/\delta_e)$, wherein with $\delta_e$, the apparent boundary layer thickness, being 1.63 microns and $a_o$ being the initial topographic amplitude (2200 nm). See, e.g., FIG. 2. The close agreement between this function and the MMEP data demonstrate that MMEP is governed by a much smaller boundary layer than predicted by Wagner's model, and indicates that MMEP follows a qualitatively different mechanism than conventional EP.

Example 4

Selective Removal of Copper from a Damascene Wafer

A 3"×3" section was cut from a Cu damascene wafer (20 cm in diameter, Sematech 854 pattern 1-63D) which was obtained from EKC Technology (Dupont Electronic Technologies, Hayward, Calif.). This wafer had been coated with a 0.5 micron layer of dielectric material into which a circuit pattern consisting of lines and contact pads had been lithographically etched. The surface had then been uniformly coated with a thin (<0.1 micron) layer of tantalum followed by a thicker layer (~1 micron) of electroplated copper. Under the optical microscope the underlying circuit pattern remained visible due to variations in surface topography. Surface profilometry measurements across large circuit features (>10 microns in lateral dimensions) showed depressions of approximately 0.5 microns, indicating that the topography of the copper blanketing these features conforms roughly to that of the underlying etched dielectric layer.

Following the procedures described in Example 1, an area of approximately 1 cm² of this copper damascene wafer was polished via MMEP at 6.0 V. The process was stopped after passing a total charge of 2 coulombs, corresponding to removal of 0.67 microns of copper, averaged over the treated area. The sample was dried and inspected under the optical microscope. In some regions of the treated area, copper had been completely removed. In some regions, residual copper remained in the etched circuit elements and on top of the dielectric layer. In another region, copper was completely removed from the surface of the dielectric, but remained in etched circuit elements with lateral dimensions ranging from <1 micron to 100 microns. This demonstrates the utility of MMEP for selective removal of copper from a typical damascene wafer.

Example 5

Use of Membrane-Mediated Electropolishing for a Variety of Metals and Alloys This example demonstrates the utility of MMEP for polishing various different metals. Polishing was carried out using the same half-cell and methods described in Example 1 but the electrolyte composition and voltages were varied as indicated in Table 2. In all cases, the work piece consisted of a flat specimen of the metal whose surface was milled prior to polishing by abrasion with 600 grit sand paper producing an initial mean roughness of approximately 0.3 micron. The surface of the work piece was visually compared before and after MMEP polishing and the detailed surface textures were compared by differential interference contrast (DIC) microscopy (Nikon Optiphot, Optical Apparatus Co. Inc., 136 Coulter Ave., Ardmore, Pa. 19003). After anodic dissolution of approximately 0.8 microns of material (0.6 mg/cm$^2$) via MMEP, all but the deepest milling scratches have been removed.

While none of the conditions summarized in Table 2 represent optimized conditions, these data show that different electrolyte compositions and voltages were required for successful polishing of different metals with MMEP. For example, whereas a $CuSO_4/H_2SO_4$ electrolyte was found to be effective for polishing nickel, the same electrolyte produced a black deposit with cobalt. Under these conditions, the stoichiometric number, n, was close to 1 electron/Co. However, addition of acetonitrile to the electrolyte completely eliminated deposit formation and the resulting value of n increased to nearly 2 electrons/Co. It is presumed that the black deposit represents colloidal cobalt produced from disproportionation of $Co^{+1}$, whereas coordination by acetonitrile favors direct oxidation to $Co^{+2}$. Similarly, MMEP of tin using the $CuSO_4/H_2SO_4$ electrolyte produced a dark grey matte finish and resulted in precipitation of a white solid on the inside surface of the membrane that was presumed to be amorphous SnO. Addition of HCl to the electrolyte prevented formation of the precipitate and produced a mirror-like finish. MMEP of both nickel and 316 stainless steel using water as the low-conductivity solvent produced a mirror-like finish, but the very high values of n (26 and 29 electrons/metal atom) indicated that most of the current must be carried by an anodic process other than metal oxidation. Both of these metals exhibit some catalytic activity for oxidation of water, and in fact gas bubbles were observed to form in the water bath near the MMEP cell consistent with the anodic evolution of $O_2$.

It can be seen that the method is useful for a wide variety of metals.

Example 6

Ability of MMEP to Avoid Contamination of Work Piece

A copper coupon was immersed in a bath containing 100 ml of deionized water and polished via MMEP at 7.0 V under conditions otherwise as described in Example 1. After passing 30 coulombs of charge, the weight loss was 8.9 mg, corresponding to n=2.2 $e^-$/Cu. The conductivity of the bath was found to have increased from 1.0 to 31.2 µS/cm and the pH had decreased from 7.0 to 4.8. The metal content of the bath was analyzed via inductively coupled plasma spectroscopy and found to contain 0.25±0.05 mg Cu ($3.9 \times 10^{-5}$ mole/l) and 0.65±0.05 mg P ($2.1 \times 10^{-4}$ mole/l). The P concentration and increase of conductivity reflect the small amount of electrolyte permeation through the membrane into the bath. The much lower concentration of residual Cu ions represents only 2.8% of the total amount of Cu anodically dissolved. Since some of the residual Cu may also have originated from electrolyte permeation, it follows that the efficiency of the MMEP in removing anodized $Cu^{+2}$ from the work piece was at least 97.2%.

Example 7

Spin Polishing Tool for MMEP Planarization of a Cu Damascene Wafer

A 3"×3" section was cut from a Cu damascene wafer (20 cm in diameter, Sematech 854 pattern 1-63D) which obtained from EKC Technology (Dupont Electronic Technologies, 2520 Barrington Court, Hayward, Calif. 94545-1163). The section was mounted facing up on a rotating mechanical stage (Headway Research, Inc., 3713 Forest Lane, Garland, Tex. 75042-6928) and the copper blanket layer was connected to the positive terminal of the potentiostat by means of a strip of copper foil taped at one edge. A MMEP cathode half-cell similar to that of Example 1 was fitted with a Nafion® N117 membrane and filled with electrolyte comprising 0.55 M $CuSO_4$ in 2.2 M $H_2SO_4$ under positive pressure via a recirculating pump. The half-cell was mounted so that the external convex surface of the membrane was held in contact with

TABLE 2

Membrane-mediated Electropolishing of Various Metals and Alloys

| M | Electrolyte | Bath | V | I mA/cm$^2$ | n e/M | Comments |
|---|---|---|---|---|---|---|
| Ag | 2M $HNQ_3$ | $H_2O$ | 3.5 | 700-630 | 0.99 | mirror-like finish |
| Ni | 0.3M $CuSQ_4$ in $H_2SO_4$, $H_2O$, 1:2 | $H_2O$ | 8.0 | 500-580 | 26 | mirror-like finish $O_2$ evolution |
| Co | 0.3M $CuSQ_4$ in $H_2SO_4$, $H_2O$, 1:2 | $H_2O$ | 4 to 10 | 50-500 | 1.09 | black deposit, (colloidal Co?) |
| Co | 0.15M $CuSQ_4$ in $H_2SO_4$:$H_2O$:$CH_3CN$ 1.0:1.5:2.5 | $H_2O$ | 2.0 | 210-190 | 1.92 | bright, grainy |
| Sn | 0.3M $CuSQ_4$ in $H_2SO_4$, $H_2O$, 1:2 | $H_2O$ | 2.0 | 300-150 | 1.92 | dark grey matte |
| Sn | 0.2M $CuSQ_4$ 4M HCl in $H_2SO_4$, $H_2O$ 1:3 | $H_2O$ | 1.0 | 300-140 | 1.99 | mirror-like finish |
| S. Steel type 316 | 0.3M $CuSQ_4$ in $H_2SO_4$, $H_2O$ 1:2 | $H_2O$ | 7.0 | 900-250 | 29 | mirror-like finish $O_2$ evolution |
| Al | 0.15M $CuSQ_4$ 5M HCl in $H_2SO_4$, $H_2O$ 1:4 | $H_2O$ | 2 to 4 | 200-600 | 2.64 | hazy mirror-like | the surface of the wafer and the area of contact was flooded by a continuous flow of deionized water (approximately 20 ml/min). The wafer was rotated at 100 revolutions per minute so that the area of contact with the half-cell membrane defined a circular "track" approximately 1 cm in width and 5 cm in diameter. Polishing was carried out using a continuously repeating sequence of 0.2 seconds at 7 V interrupted by 0.2 seconds at 0V. During each cycle the current density varied between approximately 150 mA/cm$^2$ to 25 mA/cm$^2$ respectively. Polishing was stopped when careful visual inspection indicated small areas of the surface had become free of blanket copper. This condition was reached at a point where coulometry indicated that the average thickness of copper removed over the area of the polishing track was $\Delta\tau$=0.9 micron.

Inspection of the wafer by optical microscopy showed that most of the polished area still retained a continuous layer of blanket copper while in certain areas copper was retained only in the circuit features and had been completely removed from the surface of surrounding barrier-coated dielectric features. Profilometry measurements on un-polished areas of the original copper blanket over patterns of 100 micron circuit pads separated by 50 micron dielectric spaces showed an initial topographic amplitude of $a_o$=1.0 micron. Profilometry measurements on the same patterns in polished areas which still retained a thin layer of blanket copper showed a final topographic amplitude a<15 nm. By reference to equation 2, these results correspond to an apparent boundary layer thickness of $\delta_e$<220 nm.

A phenomenological model, illustrated schematically in FIG. 2, was found to be useful for analyzing MMEP planarization efficiency for surfaces with regular topographic features consisting of flat plateaus separated by trenches recessed by amplitude a. The mean-thickness of the sample is represented by $\tau$ and $\alpha$ is the fraction of surface area on the plateaus. For comparison, $\delta_c$ represents the convective boundary layer which governs the rate and efficiency of conventional EP in electrolyte solutions. In MMEP it is assumed that the fluxes for removal of metal respectively from plateaus and trenches are inversely proportional to the distance of those surfaces from an effective boundary layer which lies parallel to the sample at a distance $\delta_e$ from the high points. The following expression for planarization efficiency is derived from this assumption:

$$da/d\tau = a/(\alpha a + \delta_e) \quad (8)$$

or, after integrating over given change in thickness $\Delta\tau$:

$$a = a_o \exp(\Delta\tau/\delta_e - \alpha\Delta a/\delta_e) \quad (9)$$

where $a_o$ is the initial amplitude. Comparison of these equations with experimental data showed good agreement and provided a means to empirically determine the value of $\delta_e$ to within ±15 nm under various polishing conditions, as summarized in the following examples.

The fundamental differences between MMEP and conventional EP in liquid electrolytes are illustrated by the following comparison:

| | | |
|---|---|---|
| MMEP (eq. 8): | $\alpha a \gg \delta_e$, | $da/d\tau = 1/\alpha$ |
| EP (Wagner): | $a, \lambda \gg \delta_c$, | $da/d\tau = 0$ |
| MMEP (eq. 8): | $\alpha a \ll \delta_e$, | $da/d\tau = a/\delta_e$ |
| EP (Wagner): | $a, \lambda \ll \delta_c$, | $da/d\tau = 2\pi a/\lambda$ |

In the limit of large a, the MMEP model predicts perfect planarization, where material is removed exclusively from the plateaus such that $\Delta a = \alpha\Delta\tau$, regardless of $\lambda$. By constrast, conventional EP becomes completely ineffective in this limit because the convective boundary layer conforms to the surface topography. In the limit of small a MMEP efficiency is inversely proportional to $\delta_e$ but independent of the lateral dimension $\lambda$, whereas Wagner's "ideal" EP efficiency is inversely proportional to $\lambda$.

Experiments described in Examples 3 and 9 confirm these essential differences between the two processes. Example 8 describes how the MMEP processing conditions may be varied to minimize $\delta_e$ and thereby maximize the efficiciency of MMEP.

Example 8

Effects of Pulsed Voltage on MMEP Planarization Efficiency

Figure 6:
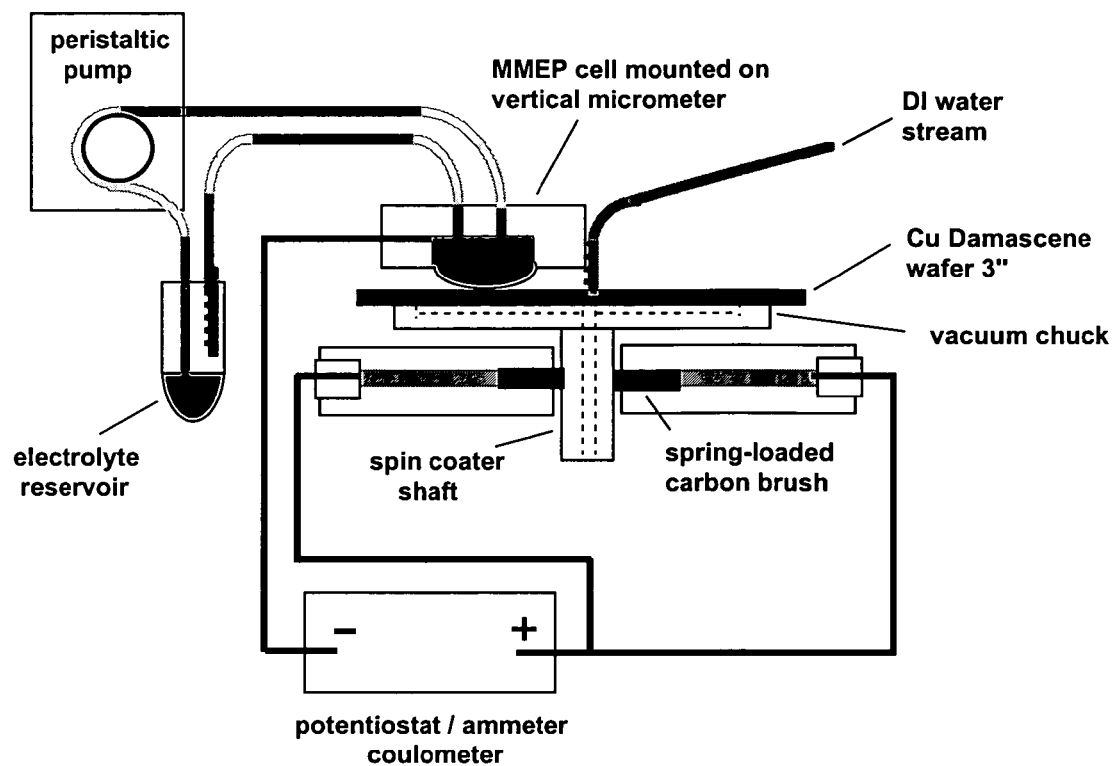
FIG. 6 is a schematic illustration of the typical components of a spin-polishing apparatus used for MMEP on Cu coupons and Cu damascene wafers.

Polished Cu coupons 3"×3" were lithographically patterned and etched as in Example 3 to provide corrugated surface topography consisting of 100 μm plateaus separated by 100 μm trenches with initial amplitudes $a_o$ ranging from 1 to 3 μm. Using the spin-polishing apparatus described in Example 7 and illustrated schematically in FIG. 6, each coupon was subjected to MMEP with variations in the operating parameters as summarized in Table 3. The applied voltage was 8V or pulsed between 0V and 8V for repeating time intervals indicated repectively by t(off) and t(on). Interfacial velocity was controlled by setting the angular velocity of the work piece and the radius of the track over which the membrane contacted the work piece. At regular intervals polishing was interrupted following passage of a given amount of charge Q, the mass of Cu removed m was measured and used to calculate the stoichiometric number n (e/Cu) and the change in thickness $\Delta\tau$. Amplitudes of corrugations were determined by profilometry at all four quadrants of the polishing area and averagered to generate a plot of a versus $\Delta\tau$. The value of $\delta_e$ in equation 2 was varied to obtain the best fit to the experimental data (see for example FIG. 5).

TABLE 3

Effects of MMEP operating parameters on stoichiometric number and planarization efficiency. The first entry represent a steady-state process in which the voltage was held constant at 8 V.

| Sample E106696- | velocity cm/sec | t (off) msec | t (on) msec | n e/Cu | $\delta_e$ nm |
|---|---|---|---|---|---|
| E106511-105 | 50 | 0 | ss | 2.1 | 1300 |
| 28B | 50 | 500 | 500 | 4.6 | 300 |
| 28A | 50 | 200 | 200 | 4.3 | 250 |
| 38B | 50 | 50 | 250 | 4.0 | 35 |
| 38A | 50 | 20 | 100 | 3.4 | 45 |
| 40A | 50 | 50 | 100 | 3.6 | 50 |
| 40B | 50 | 20 | 200 | 3.4 | 90 |
| 53B | 13 | 30 | 200 | 2.6 | 50 |
| 51A | 25 | 30 | 220 | 2.8 | 50 |
| 51B | 75 | 30 | 220 | 3.8 | 90 |
| 53A | 20 | 10 | 100 | 2.4 | 90 |

The pulsed voltage conditions are seen to provide much greater planarization efficiency (smaller $\delta_e$) and larger values of n than steady-state conditions. These effects can be explained by a mechanism in which the boundary layer consists of a partially dehydrated region of the membrane. Water is inevitably removed from the interface because hydrated $Cu^{+2}$ ions carry several molecules with them as they migrate across the membrane. Moreover, it has been shown by M. Legras, et al. (*Desalination*, 147, 351 (2002)), that the diffusion coefficient of water in Nafion® decreases more than 100 fold when the water content drops below a critical value. Consequently, when the faradaic flux of $Cu^{+2}$ ions is high enough in comparison with replenishment by diffusion of water into the membrane from surrounding areas, then a thin layer in the membrane may become sufficiently dehydrated that diffusion of water across this layer limits the overall rate. Since the membrane is constantly moving over the surface of the work piece the thickness of this dehydrated boundary layer is not affected by variations in topography in the way that a convective boundary layer is.

Figure 7:
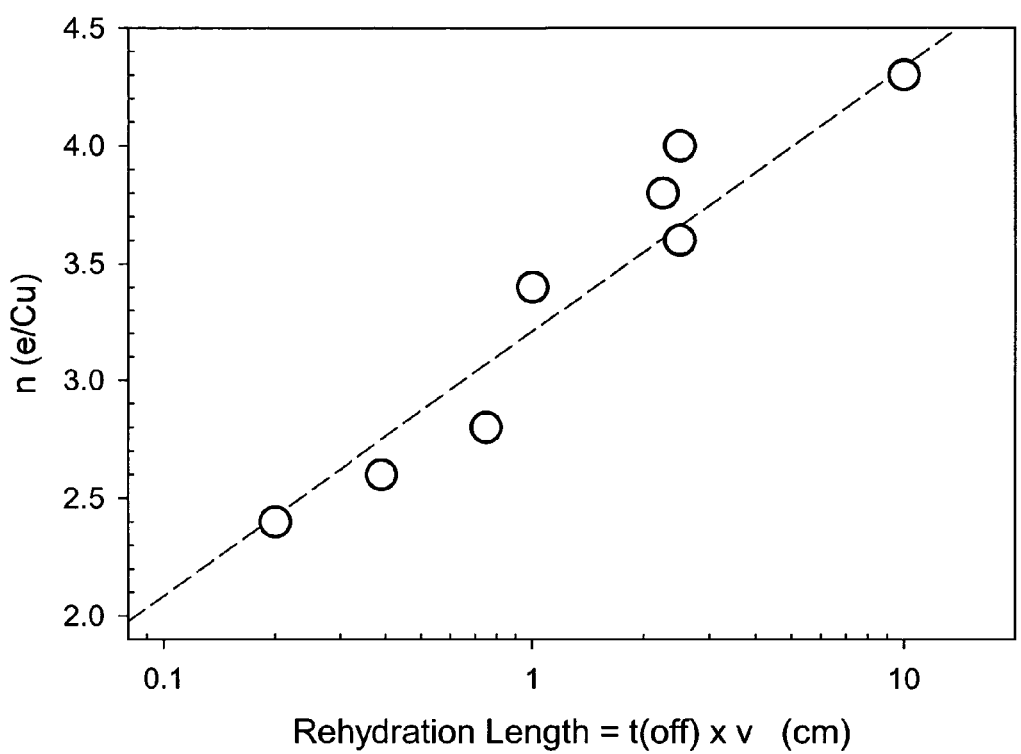
FIG. 7 shows the variation in stoichiometric number (n, electrons per metal atom polished) with MMEP process parameters $T_{off}$ and V, where the product is called the rehydration length, where the width of contact area is 0.2 cm.

The data for constant voltage indicate that the thickness of the boundary layer evolves to a steady-state thickness 1300 nm. However, when the current is interrupted by intermittent pulses <0.5 seconds, apparently the boundary layer cannot grow to its steady-state value, and the interface becomes partially rehydrated during the off-cycle. It is likewise consistent that $\delta_e$ decreased systematically to values <100 nm with decreasing pulse times. The variations in n provide further support for this explanation. When the only anodic process is oxidation of Cu to $Cu^{+2}$, the value of n should be 2 e/Cu. Values greater than 2 are due to parallel oxidation of water. Under conditions where n>3 the generation of Oxygen bubbles was visible during t(on). From Table 3 it is apparent that the amount of water electrolysis varies systematically with t(off) and with the infacial velocity v. FIG. 7 shows that the value of n increases logarithmically with the product v with t(off) which represents the length of surface covered by the contact during the rehydration period of the pulse program. This indicates that water is mechanically transported into the contact area by interfacial motion.

Example 9

Planarization of Cu Damascene Wafers with Pulsed Voltage Program

Cu damascene wafers with standard test patterns (Sematech 854AZ and 954AZ) were cut into 3"×3" sections. These wafers feature patterns of contact pads and circuit lines of various dimensions etched into a dielectric layer (500 to 1000 nm thick), coated with a thin barrier layer followed by ~800 nm of electroplated Cu. The samples were polished by MMEP using the apparatus described in Examples 7 and 8, and illustrated schematically in FIG. 6. A pulse program was employed to maintain $\delta_e$<100 nm. Polishing was interrupted at various intervals to measure the loss of Cu and changes of topographic amplitude a for several circuit features distributed over all four quadrants of the sample.

Figure 8:
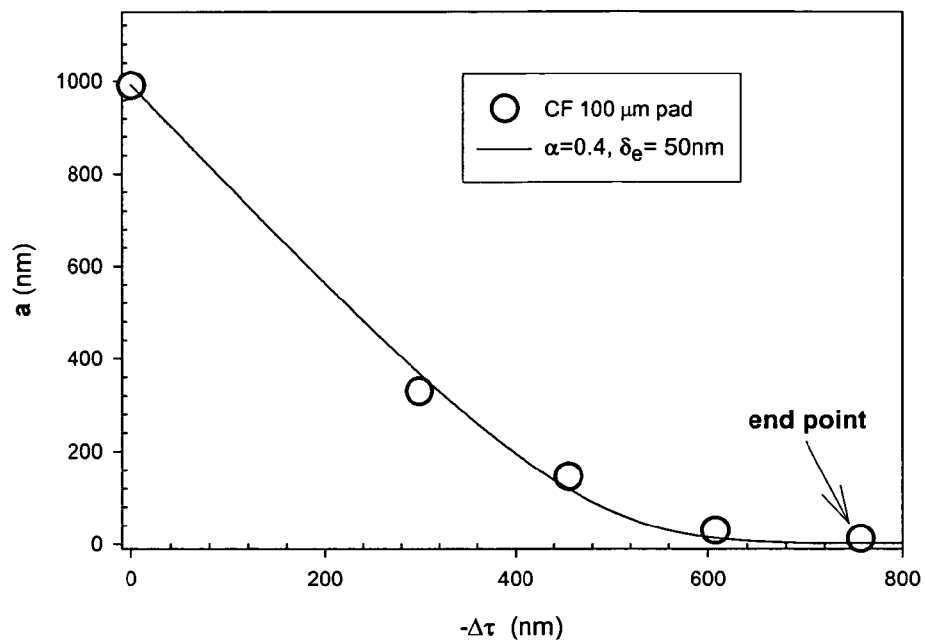
FIG. 8 shows results of MMEP spin-polishing of Cu damascene wafers.
Figure 8:
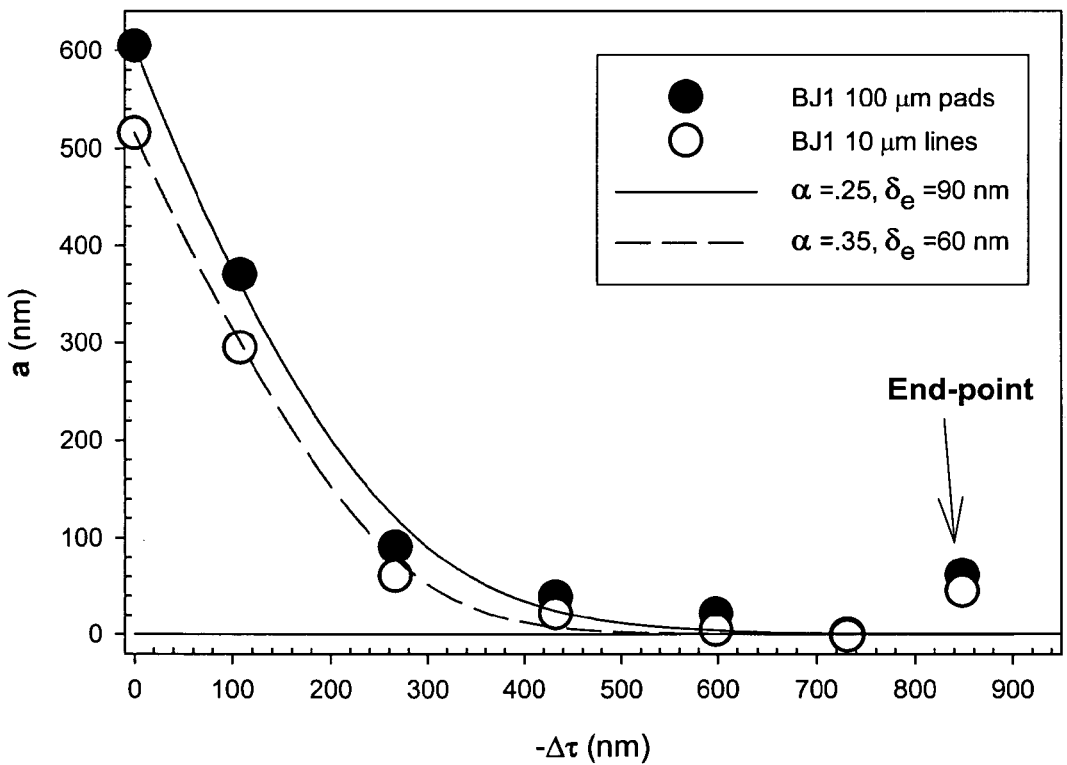

Two sets of results are shown in FIG. 8. The upper plot shows the planarization of circuit pads approximately 100 μm in width on a 954AZ wafer. The initial amplitude $a_o$=1000 nm was comparable to the dielectric thickness. The voltage was pulsed between 0V, t(off)=8 ms, and 8V, t(on)=55 ms. The end-point was reached at a mean change of thickness $-\Delta\tau$=760 nm leaving the Cu-filled circuit pads recessed by a=46 nm below the surrounding Cu-free barrier layer. The results agree with the MMEP model with a boundary layer thickness=50 nm. The lower plot shows results for 100 μm circuit pads and 10 μm lines/spaces on a 854AZ wafer which has a thinner dielectric. In this experiment the amplitude of both lines and pads was reduced to a <1 nm prior to reaching the end point at $\Delta\tau$=−720 nm. After the end-point was reached, at $\Delta\tau$=−850 nm, the pads and lines were recessed by a=62 and 46 nm respectively below the surrounding Cu-free barrier layer. Despite a 10-fold difference in lateral dimensions for the pads and lines the planarization efficiencies were nearly the same for both features within experimental error. This further demonstrates the qualitative differences between MMEP and conventional EP, and the practical advantages of the former.

Example 10

A Low-Profile MMEP Half-Cell with Polymeric Electrolyte

Figure 9:
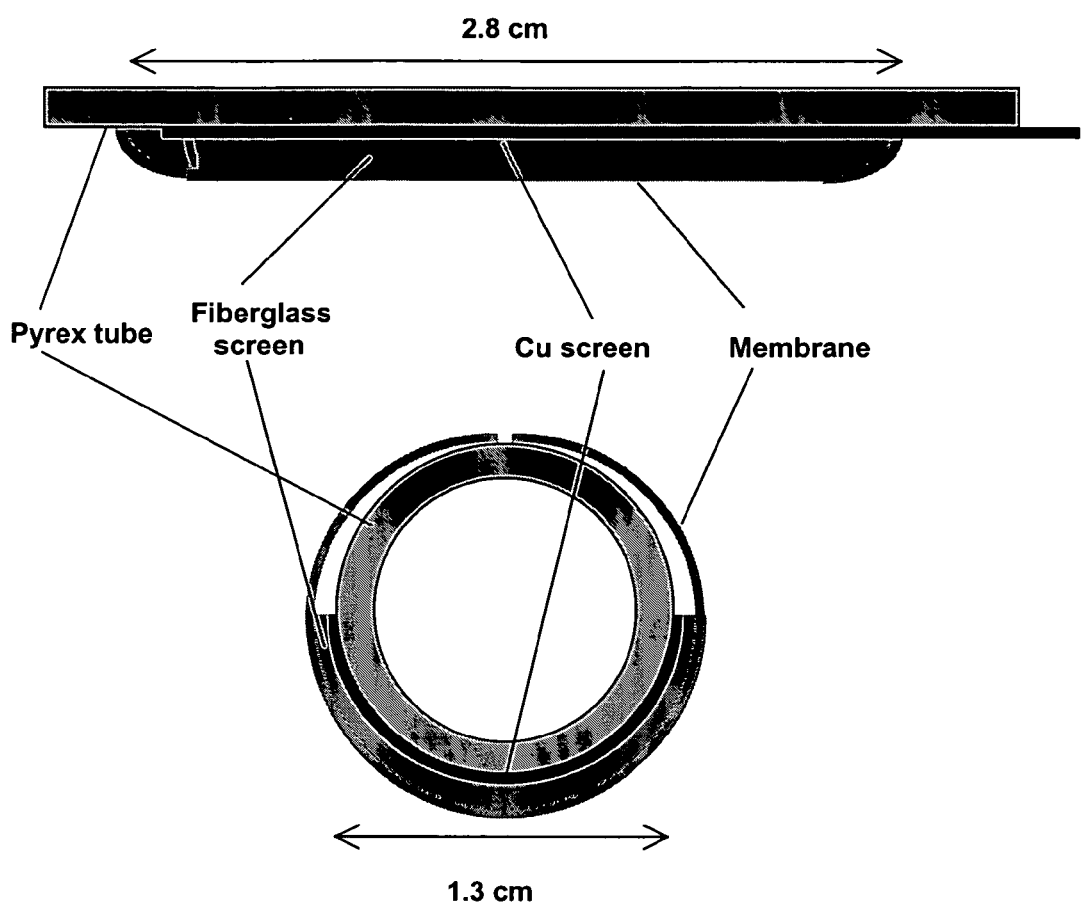
FIG. 9 shows a schematic illustration of a low profile cathode half-cell.

A low-profile cathode half-cell was constructed as illustrated in FIG. 9. A piece of Cu wire screen (100×100 mesh), 3×1 cm, was covered by a piece of PVC-coated fiberglass screen (20×20 mesh, Phifer Engineered Products), 3.5×2 cm, and the two were fastened to the external surface of Pyrex® glass tube 1.3 cm in diameter and 10 cm by means of narrow strips of tape along the edges.

Cupric acetate was dissolved in a 30% solution of poly (ammonium methacrylate) to obtain an homogenerous, deep blue electrolyte 1.0 M in $Cu^{+2}$, which is highly viscous with the consistence of a grease. Approximately 0.2 ml of this electrolyte was spread over about 2 $cm^2$ of the fiberglass, so that it filled the openings in both fiberglass and underlying Cu screens. A piece of N115 Nafion® membrane 2.5×2.5 cm was then wrapped around the entire assembly as illustrated schematically in FIG. 9. A section of the Cu mesh extending beyond the end of the tube was connected to the negative terminal of the power supply as the cathode. A Cu coupon was attached to the positive terminal of the power supply at an applied voltage of +8V and was immersed in a shallow bath of deionized water. When the surface of the membrane was rubbed over the surface of the coupon a steady current of about 200 mA was obtained and after passage of 10 coulombs, the surface of the coupon was visibly polished. The high viscosity of the electrolyte prevented flow or leakage of the electrolyte outside of the cell. The polymeric nature of the poly(methacrylate) anion prevented any permeation of electrolyte through the membrane.

Experimental Procedures— Determining $A_c$, z, and $F_z$

Many parameters are given relative to the contact area $A_c$, and therefore it is advantageous to have a standard method to measure the contact area of a membrane on a surface. A cathode half-cell was constructed, typically with a Nafion® N117 membrane sealed over an oblong window 25 by 18 mm. FIG. 10-A is representative of this single-window half-cell configuration. Another configuration used was a ⅞" circle. Electrolyte solution (0.8 M $CuSO_4$ in 0.5 M $H_2SO_4$) was pumped through the half-cell by means of a variable speed peristaltic pump (Masterflex model 7021-24) and the hydrostatic pressure $P_h$ was measured by means of a pressure transducer connected before the inlet port of the half-cell. Experiments were carried out with Cu coupons whose surface had been mechanically polished with 1000-grit abrasive. The half-cell was mounted over a flat Cu work piece covered with de-ionized water by means of an adjustable stage incorporating a transducer calibrated to measure the normal force $F_z$ between the half-cell and the work piece as a function of the vertical displacement z, which was measured with a micrometer. A simplistic drawing of the half-cell moving across a wetted substrate surface is shown in FIG. 11-A. The membrane assumes the form of a blister, and therefore the contact area $A_c$ can be varied by changing the vertical displacement z, which was varied by means of a micrometer. Once a distance z had been set, the normal force $F_z$ was measured. A brief period of electrolysis was then carried out under static conditions (v=0) producing an elliptical "footprint" of the anodic oxidation. $A_c$ was determined by measuring the area of the well-defined ellipse on the surface of the work piece. In FIG. 11-B, the area of that surface polished at zero velocity for values of z ranging from 0 to −1.00 mm is clearly evident from the outlines left on the substrate. While there is little polishing within the contact area, a easily visible trench is formed around the periphery of the contact area. Only a fraction of the oblong 25×18 mm membrane contacts the substrate surface. The contact area at static conditions is presumed to not change significantly when the membrane is moving over the substrate surface.

FIG. 12-B shows measurements of the contact dimensions as a function of $F_z$ for a oblong 25×18 mm Nafion® N117 membrane single-window cathode half-cell having 6.2 psi hydrostatic pressure being exerted by the electrolyte on the membrane. The long and short axes of the elliptical contact increases approximately as $(F_z)^{1/2}$ so that $A_c$ increases linearly. The contact area $A_c$ is proportional to the product of long and short axes, and is therefore proportional to $F_z$. The initial point of contact is fixed at $F_z=0$, where the membrane blister just contacts the substrate surface, and $A_c$ was found to increase linearly with $F_z$ from about 0 to over 700 grams.

Another parameter used here is the total area to be polished. In the experiments described subsequently, the polishing path was radial. FIG. 11-B also shows the clear outline of a typical radial polishing path, which is shown schematically in FIG. 12-A. The interfacial velocity is given by v=2πrω, where ω is the angular velocity of the work piece and r the radius of the track (approximately 1.7 cm). The polishing area $A_p$ was determined by the long axis of the contact and the circumference of the circular "track" covered in a single cycle of rotation. Anodic oxidation was carried out at either a fixed applied voltage or applied current. The respective dependent variable was measured once steady-state conditions were established (approximately 30 sec), and the total integrated charge passed was measured by means of digital coulometer. The removal rate RR was calculated by measuring the mass loss Δm for any given processing time t over a given area of polishing $A_p$ using equation (5). Dwell time is the velocity times the length of the short axis of the contact area (about one half of the long axis) or was the diameter of the area of contact if a circular window was used.

Example 11

Formation/Removal of Copper Oxide/Hydroxide/Carbonate Accumulation

During previous experiments with membrane mediated electropolishing, we had noted that when the voltages between about 4 V and 8 V were used, there would often be small particulates of material disposed on the polished surface. These were presumed to be copper oxides, though the particles could have also included copper hydroxides and copper carbonates. Such particles do not provide a satisfactory finished surface. Experience suggested these particles were minimized when lower voltages were used.

A copper substrate was membrane-mediated electro-polished using a single window half cell similar to those described above. The velocity v was 21 cm/sec, $P_c$ was 2.2 psi, the area of contact $A_c$ was 0.96 cm², and the dwell time was about 0.04 seconds. Dwell time is the average length of the contact area measured in the direction of v, divided by v. The voltage was increased a sequentially from zero, using one volt increments. While we could not be certain when copper oxides/hydroxides/carbonates started to form, by the time the experiment had reached 7 volts the particulate residue was readily visible in the polished section. We continued to increase the voltage, and we surprisingly found that by 11 volts the copper oxide particles were no longer present. The current density at 7 V was about 80 mA/cm², and the current density at 11 V was 150 mA/cm². The polarization curve is shown in FIG. 23-C.

Example 12

Effect of z and $A_c/A_p$ on I and RR

FIG. 12-C summarizes the experimental results, showing the effects of z and $A_c/A_p$ on current density and removal rate at 10V, when a 25×18 mm Nafion® N117 membrane single-window cathode half-cell having 6.2 psi hydrostatic pressure was used to polish a copper substrate at velocity v=55 cm/sec. The dwell time varied from about 0.005 seconds at the lowest load (~150 grams) to about 0.029 seconds at the highest load (~750 grams), where velocity was constant and the change in dwell time reflects the change in the length of the short axis. The contact area, and the total area polished by the half-cell moving on the circular track, was changed by varying z. The data is shown in FIG. 12-C. The fact that I is essentially independent of Ac indicates that the current density must be substantially uniform within the contact area. The current density averaged about 660 mA/cm² as the contact area was increased by a factor of 300%, and the current density did not change as $A_c/A_p$ by a factor of about 50%. FIG. 12-C also shows that RR increases with $(A_c/A_p)$ as z is systematically decreased.

Example 13

Effect of Hydrostatic Pressure on Normal Force $F_z$

The same single-window half-cell configuration as used in Example 12 was used here. A cathode half-cell was constructed with a Nafion® N117 membrane sealed over an oblong window 25 by 18 mm. Electrolyte solution (0.8 M $CuSO_4$ in 0.5 M $H2SO_4$) was pumped through the half-cell by means of a variable speed peristaltic pump (Masterflex model 7021-24) and the hydrostatic pressure $P_h$ was measured by means of a pressure transducer connected before the inlet port of the half-cell. The half-cell was mounted over a flat Cu work piece covered with de-ionized water by means of an adjustable stage incorporating a transducer calibrated to measure the normal force between the half-cell and the work piece as a function of the vertical displacement z. FIG. 20-A shows results of the measurements of normal force versus distance (a constant plus z) for three hydrostatic pressures $P_h$ of the electrolyte. FIG. 20-B shows the calculated variation in contact area $A_c$ with normal load and hydrostatic pressure $P_h$ of the electrolyte. The normal load $F_z$ should equal the contact pressure $P_c$ times the contact area $A_c$. The values of $P_h$ in FIG. 20 included a pressure drop between the transducer and the half-cell. After correcting for this error the values of $P_c$ were found to be very close to the true hydrostatic pressure inside the half-cell. FIG. 20-A shows the contact pressure, which is defined here as $P_c=F_z/A_c$, increases with increasing $P_h$.

Changing the distance z changed the total force exerted by the membrane on the surface $F_z$, because the area of contact increased as the half-cell is moved closer to the substrate surface. The data in FIG. 20-B show the contact pressure $P_c$ was substantially independent of the area of contact $A_c$. $F_z$ changed proportionally to $A_c$. The hydrostatic pressure $P_h$ in the half-cell was generated by the resistance to flow of electrolyte while pumping electrolyte into the half-cell at a constant rate. The resistance to flow was primarily due to the inlet and outlet, and the area within the cell was so large that we expect there to be very little pressure drop within the cell, and consequently very little change in the pressure when the dimensions of the half-cell are changed a small amount. So changing the distance between the base of the half-cell and the substrate surface would not increase the resistance of flow of electrolyte. Such a assembly will result in the half cell advantageously self-correcting to the same pressure after movement toward the substrate surface (to increase the contact area between the membrane and the substrate surface). The pressure within the half-cell in such a system can be changed by varying the flow rate of electrolyte circulation through the half cell, by altering the back-pressure at the at the cell outlet while maintaining constant flow rate, and/or by changing the size of a restricted opening at the point where electrolyte exits the cell.

In contrast, if the half-cell is enclosed like a sealed bag, then both $P_h$ and $P_c$ will become extremely sensitive to variations in z. Both will increase as the half-cell is moved closer to the substrate surface (to increase the contact area between the membrane and the substrate surface).

Comparative Example 14

While it seems reasonable to assume the polishing rate will be constant throughout the contact area of the membrane and the substrate surface, this is not always the case. polishing depends on the presence of water between the membrane and the substrate surface, and if movement is too slow, then there will not be sufficient replenishment of water beneath the membrane to replace that amount consumed by electrolysis and/or migration through the membrane. In the extreme case, polishing at static contact (v=0) resulted in the membrane beginning to adhere strongly to the surface of the work piece, and it was difficult to obtain steady state current data. When extended electrolyses were carried out Cu removal was primarily restricted to the periphery of the contact, with little or no polishing over the center of the contact area. See, for example, the polishing pattern at zero velocity shown in FIG. 11-B. The outline of the contact area after static polishing shows the polishing was occurring only at the periphery of the membrane to surface contact, where sufficient water could presumably be obtained by diffusion and other weak forces drawing water into the point of contact of the membrane and the substrate surface. Under these conditions the current density is concentrated on the periphery of the contact area, so that the nominal current density $i/A_c$ does not represent the true current density. To show this, the same single-window half-cell configuration as used in Example 12 was used here. Polishing was done at v=0 cm/sec. The contact area was varied between about 0.05 cm² and about 0.6 cm² by changing z. As indicated by the filled symbols in FIG. 13, the apparent current density I at v=0 declined with the contact area $A_c$.

Example 15

Effect of Velocity and Contact Area on Nominal Current Density

By contrast, when the contact area was kept moving across the surface of the sample (v=19 cm/sec) the adhesive force is suppressed and, when i is measured as a function of $A_c$ at constant V, the nominal current density $I=i/A_c$ is found to be constant. FIG. 13 shows the effect of interfacial motion of the membrane over the substrate surface (the v=0 data discussed in the comparative example and 19 cm/sec) on the variation in nominal current density with contact area, at a low applied voltage of 7 V. The same single-window half-cell configuration as used in Example 12 and in Comparative Example 14 was used here. Polishing was done at v=19 cm/sec. The contact area was varied between about 0.05 cm² and about 0.6 cm² by changing z. The dwell time varied from about 0.008 seconds to about 0.036 seconds.

The relatively constant current density suggests that for a membrane moving over the substrate surface at v=19 cm/sec, where the dwell time varied from about 0.008 seconds to about 0.036 seconds, the current density at V=7V was substantially uniformly distributed over the contact area and was given by $I=i/A_c$. Consequently, within the bounds of these experimental conditions, current is increased simply by increasing the contact area.

Example 16

Effect of Interfacial Velocity v on Polarization Curve

Example 16 illustrates the effects of interfacial velocity v=21, 39, and 56 cm/sec on the MMEP polarization curve I versus V. A flat Cu work piece was mounted on a rotating turntable in an MMEP apparatus with a cathode half-cell containing, for the data shown in FIG. 21, a Nafion® N117 membrane sealed over a round window ⅞" in diameter. The work piece was flooded with de-ionized water of conductivity 1 μS/cm. Electrolyte was pumped through the half-cell at a constant hydrostatic pressure so as to maintain a contact pressure $P_c$=8.2 psi. The half-cell was held at a fixed vertical displacement relative to the work piece so as to maintain a constant contact area $A_c$. The work piece was rotated about an axis offset from the area of contact so as to establish various interfacial velocities. By interfacial velocity we mean the average velocity of the membrane relative to, and substantially parallel to, the substrate surface, wherein the average velocity is the velocity seen by the membrane surface at the center of the membrane contact area with the substrate surface (within the contact area, points nearer or further from the center of rotation experience velocities slightly lower or higher respectively than the average velocity). As in the previous example, the contact area $A_c$ was measure following electrolysis at velocity v=0 to measure the contact area. Electrolysis was carried out at a series of applied voltages and the steady-state current I was measured at each voltage. In FIG. 21, the polarization curve, i.e., the nominal current density $I=i/A_c$ as a function of V, is shown for experiments where v was 21, 39 and 56 cm/sec (dwell times of about 26 milliseconds, 14 milliseconds, and 9.6 milliseconds, respectively). At V>25V and v>39 cm/sec (dwell time 14 milliseconds), I is seen to increase steeply with V and water oxidation became increasingly important as indicated by n>4.

It can be seen that, for voltages <8V, the values of I decrease systematically with increasing v. This effect is believed to reflect the introduction of an ohmic resistance due to dynamic introduction of a layer of water between the membrane and work piece, where with other factors being unchanged the thickness of the water layer increases with increasing v (much like a hydroplaning phenomenon). On the other hand, ohmic resistance can also be introduced when the rate of water consumption between the membrane and the substrate surface exceeds the rate of water supply, which we believe leads to a reduction in n, a reduction of I, and eventually squeaking and sticking of the membrane to the substrate, with accompanying damage to both the membrane and the substrate.

The experiment run at 21 cm/sec showed a fairly linear increase in I versus V from about 5 volts to about 24 volts, averaging about 70 mA/cm$^2$ per volt in this range. Throughout this test, the slope of the polarization curve dI/dV did not increase, but remained relatively constant. At about 14 volts, an audible squeak was heard. At 24 volts, the adherence of the membrane to the substrate was so strong that movement stopped. At v=21 cm/sec, dwell time ~0.050 seconds, voltage ~14 V, and I~700 mA/cm$^2$, the membrane began to squeak. At v=21 cm/sec, dwell time ~0.050 seconds, voltage ~24 V, and I~1000 to 1400 mA/cm$^2$, the membrane stuck.

Without being bound by theory, we believe the squeaking, audible sound is the result of intermediate sticking and releasing of at least a portion of the membrane to the substrate surface. We believe that with an sufficiently low dwell time, the value dI/dV should increase with V, and, when it is not increasing, the lack of water is impairing polishing and possibly causing undesired roughness, especially when squeaking. The portion that sticks may be, for example, that portion that is downstream of the direction of travel of the membrane, which therefore has proportionately longer time to dehydrate as the current flow results in water and proton transfer through the membrane. Squeaking is expected to result in a rough surface and in excessive membrane wear, and is therefore not desired.

The polarization curve was not substantially linear at the two higher velocities. At v=39 cm/sec, the slope of the polarization curve started well below the slope of the curve at 19 cm/sec, but the slope kept increasing. The slope of the polarization curve eventually exceeded the 70 mA/cm$^2$ per volt obtained at the lower velocity, and above 24.5 volts the slope of the polarization curve was over 300 mA/cm$^2$ per volt. At v=39 cm/sec, dwell time 0.027 seconds, the slope of the polarization curve dI/dV exhibited a monotonic increase, which we believe is indicative of being within the most preferred polishing conditions for this invention, until about 27 V. At 27 V, dwell time ~0.027 seconds, and I~2800 mA/cm$^2$, the membrane began to squeak. Immediately thereafter, the slope dI/dV not only quit monotonically increasing, but it took a sharp drop. Again, this is evidence that the dwell time is too large for the current, and that lack of water between the membrane and the substrate surface is impairing polishing.

Similarly, the slope of the polarization curve at v=56 cm/sec followed the same trend, albeit slightly more exaggerated, as did the slope of the polarization curve at 39 cm/sec, although no audible squeak was detected before the experiment was terminated (at 30 volts). At v=56 cm/sec, dwell time 0.019 seconds, the slope dI/dV of the polarization curve kept monotonically increasing, and no squeaking or sticking occurred to the experimental limits I=3300 mA/cm$^2$.

We emphasize that it is not merely the magnitude of dI/dV that is important, but additionally that many preferred embodiments include polishing at a voltage such that the slope dI/dV be increasing with increasing V (i.e., such that the polarization curve has a positive second derivative).

At static conditions, it is common to see apparent slopes d"I"/dV in excess of 150 mA/cm$^2$ per volt for a range of voltage between about 0 and about 2-3 volts, whereupon the slope turns down. Such polishing is not within the scope of embodiments of MMEP nor within the scope of embodiments of high rate MMEP, because there is no movement and no planarization of the substrate. MMEP requires that the membrane contact with a portion of the substrate be of short duration, and this is usually realized by sliding the membrane over the substrate surface.

Example 17

Effect of Interfacial Velocity v on Polarization Curve

A series of additional experiments were performed with other membranes and configurations to further define the relationship between v and the shape and slope of the polarization curve. FIG. 14-A shows the variation of nominal current density with voltage for a single-window half-cell using an 18×25 mm N117 Nafion® membrane with a thickness of 7 mil at a variety of interfacial velocities from 19 to 56 cm/sec. The distance z was held at −0.30 mm, where at z=0 the membrane just contacted the substrate surface.

For interfacial velocities of 19 cm/sec and 27 cm/sec, dwell times of about 0.032 seconds and 0.022 seconds, respectively, the slope and magnitude of the polarization curve was similar to that observed at 21 cm/sec in Example 16. That is, the slope dI/dV of the polarization curve was substantially unchanging for the experiment run at 19 cm/sec and 27 cm/sec for the 18×25 mm N117 Nafion® membrane showed a fairly linear increase in I versus V from about 5 volts to about 21 volts, averaging about 55 mA/cm$^2$ per volt at v=19 cm/sec and about 70 mA/cm$^2$ per volt at v=27 cm/sec. This slope is reasonably consistent with the Example 16 data for 7/8" round N117 Nafion® membrane run at 21 cm/sec that averaged about 70 mA/cm$^2$ per volt.

The steady-state currents could be sustained above 2000 mA/cm$^2$ for the higher velocity experiments, but the curves were shifted to higher V, consistent with an increase in ohmic resistance. The apparent resistance appears to reach a limiting value at v>40 cm/sec.

At the higher velocities of 37 and 56 cm/sec, the polarization curves exhibited only a small increase in the slope dI/dV after about 8 V. At v=37 cm/sec, the polarization curve was equal to or slightly above the polarization curves for the lower velocities. The slope of the polarization curve obtained at v=37 cm/sec, from 7 V to 21 V, was 120 mA/cm$^2$ per volt. The slope of the polarization curve obtained at v=56 cm/sec, from 7 V to 21 V, was over 150 mA/cm$^2$ per volt.

The slope dI/dV of the polarization curve does not necessarily have to be monotonically increasing to provide high RR, though it often is in preferred embodiments of the invention, but if the slope is not increasing then advantageously the slope of dI/dV is greater than 100 mA/cm$^2$ and the voltage V is greater than about 10V, preferably greater than about 14V.

Example 18

Effect of Interfacial Velocity v on Polarization Curve

FIG. 14-B shows the variation of nominal current density with voltage for a single-window half-cell using a 2 mil experimental expanded PTFE web impregnated with perfluorosulfonic acid polymer material similar to that used in Nafion® type membranes. We believe the PTFE membrane would reduce friction, and would also decrease wear, relative to Nafion® membranes. The membrane was only 2 mils thick, compared to the 7 mil Nafion® membranes we normally used. The z was controlled to give a modestly low contact area of about 0.3 cm$^2$. The polarization curves were determined at a variety of interfacial velocities from 12 to 64 cm/sec, i.e., dwell times from about 0.046 to about 0.008 seconds.

The 12 cm/sec experiment was the lowest constant velocity tested. While the slope dI/dV of the polarization curve monotonically increased, the 2 mil membrane developed sufficient adhesion at voltage V of only 2.4V to stop the rotor. The slope of the 12 cm/sec polarization curve between V=2 and V=2.4 was about 200 mA/cm² per volt. A velocity of 12 cm/sec or less, or a dwell time greater than about 0.046 seconds, does not provide sufficient water for the half cell to operate at high-current densities that are preferred. This conclusion is not directly applicable to the other examples described here, as the membrane used in this test was different than that used in other tests.

The polarization curve at 19 cm/sec (dwell time of about 0.029 seconds) was at least facially similar with the polarization curves at similar velocities described for other membranes and conditions. Again, rather than being concave upward, the polarization curve was relatively flat between 5 volts and 13 volts, and the slope was about 70 mA/cm per volt, the same as was observed for thicker membranes. However, the minor turndown at about 8 V suggests that lack of water was inhibiting the cell from reaching a higher I.

At higher velocities, the polarization curve was again characterized by a low slope that increased monotonically with increasing voltage, though again the increase after about 8V was very small. The initial slope at the intermediate velocity, v=30 cm/sec and dwell time is about 0.018 seconds, was greater than the initial slope at the higher velocities. While it appears that unlike other Examples described herein the slope at higher velocities did not eventually increase to provide a current density exceeding that for intermediate velocities, this may be partially the result of terminating testing at 13 volts, where other tests extended the voltage to over 20 volts. The slope of the polarization curve between about 7 volts and about 13 volts was for each of the three higher velocities tested was between about 150 mA/cm per volt to about 180 mA/cm² per volt.

Very similar behavior was obtained with membranes that were 2 mil or 7 mil thick, respectively, indicating that contributions from the bulk conductivity of the membrane are negligible. With increasing interfacial velocity, steady-state currents could be sustained to I>2000 mA/cm², but the curves were shifted to higher V, consistent with an increase in ohmic resistance. The apparent resistance appears to reach a limiting value at velocities greater than about 40 cm/sec, or dwell time less than about 0.013 seconds, at V less than 13 V.

Example 19

Effect of Contact Pressure $P_c$ on Polarization Curve

In order for the moving interface to introduce and maintain a layer of water between the work piece and membrane, the sheared water layer must develop a hydrostatic pressure comparable to the contact pressure $P_c$. For a given interface velocity v, the thickness of the water interlayer should decrease as $P_c$ is increased. Further, the quantity of water maintained at the interface must reflect a balance between hydrodynamics of the moving contact and electro-osmotic removal of water. We investigated whether the stiffness of the membrane blister might play a role in the hydrodynamics by measuring the effects of electrolyte hydrostatic pressure on the polarization curve. At applied voltages below about 10 V, the higher pressure inside the half cell provides a higher current density compared to lower pressures. This is consistent with the expectation that the hydrodynamic forces should produce a thinner water layer if swept with a harder, more rigid membrane blister, and a thicker water layer with a softer, more compliant membrane blister.

FIG. 22 shows polarization curves similar to those the previous example, but in which $P_c$ was varied from 2.5 psig to 14 psig while v was maintained constant at 39 to 40 cm/sec. The shape of the polarization curves suggests that higher $P_c$, for example the approximately 14 psig, has a similar effect to lower interfacial velocities of about 20 cm/sec. Lower $P_c$, for example below 5 psi, gave a polarization curve similar to that observed in Examples 16 and 17 when the interfacial velocity exceeded about 40 cm/sec. The half-cell comprised a ⅞" round window N117 Nafion® membrane. At <10V, the magnitude of I is seen to increase significantly with $P_c$, consistent with decreasing ohmic resistance from thinner water layers.

It can be seen that the shape and magnitude of the polarization curve at high pressure, that is, at 14 psig, is similar to the shape of the polarization curve for the v=21 cm/sec example seen in FIG. 21. The onset of squeaking and sticking occurs at lowest I for $P_c$=14 psi, consistent with its greater resistance to the hydrodynamic forces, and consistent with the velocity tests where squeaking started at the lowest I for the lower interfacial velocity tests. The shape of the polarization curve at low pressure, that is, at 2.5 psig, is similar to the shape of the polarization curve for the v=56 cm/sec example seen in FIG. 21. Therefore, the effects of increased or decreased velocity should be at least partially counteracted by changing the contact pressure.

Example 19 illustrates the effects of contact pressure on the MMEP polarization curve. One method of envisioning the introduction of the low-conductivity fluid (e.g., water) layer between the membrane and the substrate surface is to presume that, in order for the moving interface to introduce and maintain a layer of water between the work piece and membrane, the sheared water layer must develop a hydrostatic pressure comparable to the contact pressure $P_c$. Increasing the pressure exerted by the membrane on the surface will make the membrane more effectively sweep away the low-conductivity fluid, therefore generating a thinner initial layer of this low-conductivity fluid. For a given interface velocity v, the thickness of the water interlayer should therefore decrease as $P_c$ is increased, and as a result of the lower resistance I should increase. This effect is apparent from the influence of $P_c$ on ohmic resistance at V<14V and interfacial dehydration at >14V shown in FIG. 22.

At >24 V, the magnitude of I is much less sensitive to $P_c$, consistent with the hypothesis of drastic thinning of the water layer at high I, or of a substantial increase in the conductivity of the low-conductivity fluid at the areas where the membrane substantially contacts the substrate surface, or both. The onset of squeaking and sticking occurs at lowest I for the highest pressure investigated in this example, $P_c$=14 psi, which is consistent with its greater resistance to the hydrodynamic forces. Higher contact pressures therefore result, all things being equal, in lower maximum useful current density and lower polishing rates, provided the polishing is done at current densities near the maximum. On the other hand, at lower current densities, higher pressures result in greater polishing rates.

It is therefore preferable to use lower half cell pressures and higher velocities to achieve the desired high current density and metal removal rate. A membrane having a $P_c$ of 14 psig stuck to the substrate at a velocity of 40 cm/sec while polishing at a current density of about 2500 mA/cm². A membrane having a $P_c$ of 8.2 psig stuck to the substrate at a velocity of 21 cm/sec while polishing at a current density of about 1500 mA/cm². By lower pressure, we mean below 20 psig, for example below 15 psig, preferably below 10 psig, and more preferably below about 5 psig. While we polished copper substrates with a contact $P_c$ of 2 psig, we expect that a contact pressure of 0.5 psig or 1 psig will be operative. Generally, the higher the contact pressure $P_c$, the higher should be the interfacial velocity V. However, a half-cell operating at a low $P_c$, for example at 2.5 psig, can polish at high velocities or at low velocities.

Example 20

Dependence of Removal Rate and Stoichiometric Number on Voltage

Example 20 contains a set of experiments were performed to determine the dependence of the copper removal rate RR and of the stoichiometric number n on voltage. A single-window cathode half-cell with a 17×25 mm single-window N117 Nafion® membrane half-cell was used to polish a Cu coupon secured on the turntable of the laboratory spin-polishing apparatus at z=−0.40 mm, $A_c$=0.29 cm², $A_p$=9.9 cm², and v=55 cm/sec. Electrolyte was pumped under a hydrostatic pressure of ~14 psi. Polishing was carried out under constant applied current, and the steady-state voltage was measured. Following each period of polishing, the mass loss from the substrate was compared with the total charge passed to calculate the removal rate RR and stoichiometric number n. The results are summarized in FIGS. 16-A, 16-B, and 16-C. FIG. 16-A shows the dependence of removal rate (RR) and stoichiometric number (n) on current density I, where the current density varied from about 600 mA/cm² to about 2800 mA/cm². FIG. 16-B shows the dependence of I and n on voltage for the single-window half-cell experiment of FIG. 16-A. FIG. 16-C shows the variation of removal rate and current density versus voltage for the single-window half-cell experiment of FIG. 16-A. At the high end of the polarization curve I is very sensitive to V, therefore experiments in this regime were carried out under applied current. Over this 4-fold range of I the voltage increased from 14.5 and 18V, while RR increased by about 250%. RR varies with the ratio I/n (see Equation 6). The measurements of n confirm an increase of only about 50% beyond random error.

Both I and n increased with increasing V in the interval between 12 and 20V, but the proportional increase in I was much greater than that in n. There is a small decline in n at the very highest voltages, which may reflect an insufficient water supply, much as the audible squeaking at high rates is believed to indicate an insufficient water supply. The lower plot shows that RR also increased with V, consistent with the expectation that RR should vary with the ratio (I/n).

FIG. 16-B clearly shows that, at voltages between about 13 V and about 19 V, the n value ranges between about 4 and about 6. Values of n between about 2 and 3 were obtained in earlier experiments at voltages below 7V and I below 500 mA/cm². Under those conditions it was not uncommon to find a thin layer of material believed to be CuO over the surface or 2-5 μm dark particles (again possibly CuO) embedded in the surface. We believe that having the stoichiometric number be substantially above 3, for example above 3.5, and preferably above 3.9, electrons per copper atom, is the key to not having CuO deposits form. The data from FIGS. 16-A and 16-B suggest that, for this system, n will be greater than 3.9 if either the current density is greater than about 1000 mA/cm², or if the voltage is greater than about 15 volts. Further, the data from FIGS. 16-A and 16-B suggest that, for this system, n will be greater than 5 if either the current density is greater than about 1500 mA/cm², or if the voltage is greater than about 16 volts.

In addition, it is seen from the data in FIGS. 16-A and 16-B that the removal rate will increase with increasing I and/or with increasing V, despite the increase in n. We note that this system was run at an interfacial velocity of 56 cm/sec, which would be expected to give an increasing slope of the polarization curve I versus V as V increases. This broad generalization may not hold in all cases, particularly at polishing tests run at low interfacial velocities such as 20 cm/sec that do not exhibit the increasing slope of the polarization curve with increasing V. For the system tested, and particularly where v is greater than 40 cm/sec, FIG. 16-C clearly shows that both I and RR will increase almost linearly with increasing V between 13 V and 19V.

While the highest RR achieved in these experiments, ~750 nm/min, are certainly attractive for planarizing Cu interconnect, practical considerations, such as heat dissipation may preclude operating at such high I.

Example 21

Comparative Performance of Single and Dual-Window Half-Cells—Dependence of Area of Contact on Removal Rate and on Stoichiometric Number n FIG. 10-B shows a dual window half cell. A dual-window cathode half-cell with two 17×25 mm Nafion® membranes was used to polish a Cu coupon secured on the turntable of the laboratory spin-polishing apparatus. The tests described here compared the performance of a single window half-cell polisher of FIG. 10-A with a dual window half-cell polisher of FIG. 10-B. This example compared the key process performance parameters n and RR of a dual window polishing cell and compared these to the same parameters measured in Example 20 above. The process parameters for the single window and the dual window experiments are shown below for ease of comparison.

| Single Window Polisher | Double Window Polisher |
|---|---|
| z = −0.40 mm | z = −0.25 mm |
| $A_c$ = 0.29 cm² | $A_c$ = 0.617 cm² |
| $A_p$ = 9.9 cm² | $A_p$ = 10.5 cm² |
|  | normal load ~320 g |
| v = 55 cm/sec | v = 55 cm/sec |

FIG. 17 shows the results of a direct comparison of the performance of single and double-window half-cells operating in an overlapping region of I. At any given I, RR is seen to be roughly proportional to the total contact area. Most importantly, a removal rate of 900 nm/min was achieved with the double-window half-cell at less than 2000 mA/cm².

The normal force was independently measured to be 318 gm. Dividing by $A_p$ this corresponds to a tool pressure of 0.43 psi, or dividing by $A_c$ it corresponds to a contact pressure of 7.3 psi. For comparison, it has been estimated that for traditional chemical mechanical polishing the tool pressure of 5 psi the actual contact pressure is ~20 psi.

Example 22

The Relationship Between Normal Force $F_z$ Exerted on the Substrate Versus the Resultant Drag Force $F_d$ For comparison with chemical mechanical polishing, an important variable is the tool pressure $P_T$ (also referred to as the "down force"), which is defined as the normal force exerted by the pad onto the wafer (substrate) divided by the area of the wafer. However, much of the damage done to substrates is believed to be the result of drag forces operating in a direction substantially parallel to the direction of the interfacial velocity.

In this experiment, we provided transducers to measure both the normal force and the drag force exerted by the membrane as it polished a copper substrate. FIGS. 18-A, 18-B, and 18-C show an instrumented MMEP tool adapted for use on a 200 mm base and showing a cathode half-cell mounted on dual cantilever fixture, wherein displacements of the first cantilever are proportional to the z-axis (normal) force on the work piece, while displacements of the second cantilever are proportional to the interfacial drag force. FIG. 19 shows the static and drag forces as a function of the interfacial velocity v, using a larger membrane surface having an area of contact of about 1.05 cm$^2$ at z=-0.56 mm. Measurements were made of the forces on a wet contact as a function of interfacial velocity in the absence of electrochemistry. There was no current flow during these tests. It can be seen that the drag forces are initially about equal to the normal forces at very low velocities, e.g., from about 0 to about 13 cm/sec.

The results show a dramatic reduction in the drag force with increasing v. The drag forces quickly dropped off, and were less than one half the normal force at a velocity of about 50 cm/sec. There is potential of reducing drag forces to less than 20% of the normal force. This response suggests a hydrodynamic lubrication effect where interfacial shear carries a layer of water between the surfaces, and the thickness and corresponding normal stress increase with the strain rate. Of course, having a high current density will increase the drag force, as shown in the following Example.

Example 23

Variations in Coefficient of Friction with Voltage

A Cu work piece was mounted on the 200-mm tool and polished via MMEP at various combinations of voltage V, contact pressure $P_c$, and velocity v. For each set of polishing conditions the current density I, normal force $F_z$ and drag force $F_d$ were measured under steady-state conditions. Results are summarized in FIGS. 23-A, 23-B, and 23-C. FIG. 23-A shows the measured normal force $F_z$ and drag force $F_d$ exerted on the substrate as a function of V for polishing at $P_c$=4.6 psi and v=42 cm/sec. $F_d$ remains very low until the voltage is increased to >12V where $F_d$ increases monotonically with V. With increasing $F_d$ fluctuations in $F_z$ become larger, presumably due to torsional effects from the drag. FIG. 23-B shows that the coefficient of friction, defined by COF=$F_d/F_z$, remains very small until 12V, while at higher V the increase in COF correlates strongly with the increase in I.

The initial values of COF=0.02 are indicative of a fully lubricated hydrodynamic regime where solid surfaces are partially separated by a liquid lubricant, whereas the final value of COF=0.14 is more typical of boundary lubrication at a solid interface. This transition is consistent with a thinning of the interfacial water layer at V>10V, more so at V>12V, which is consistent with our hypothesis relating to the coincident steep increase in I discussed earlier.

FIG. 23-C shows the results of a similar experiment at $P_c$=2.2 psi, and v=21 cm/sec. The same trends and correlation between COF and I are seen here, but the initial value of COF (0.08) is higher than the 0.02 seen in 23-B, and the increase in both I and COF are more gradual than observed at $P_c$=4.6 psi, v=42 cm/sec. The rates of increase of I and COF are consistent with weaker hydrodynamic forces at lower v.

The experimental conditions results in another interesting effect. After several minute of polishing between 7 and 9V a uniform thin layer of dark CuO was observed to form on the surface of the work piece. However, this layer disappeared after polishing at voltage $\geq$10V. This phenomenon is thought to be related to the increased rate of water oxidation above 10V, and the importance of the protons produced in that reaction for suppressing precipitation of CuO, as discussed previously and in Example 1.

These results are consistent with the foregoing analysis of the polarization curves and suggest that the contact mechanics of MMEP may be a much less aggressive than the abrasive mechanics of CMP. Such a low drag force, coupled with the low normal forces obtainable with the MMEP process, may eliminate substrate damage. Additionally, the data suggests that when the polishing is started or stopped, lower drag forces will be generated if the interfacial velocity is greater than 20 cm/sec, preferably greater than 40 cm/sec, before the membrane contacts the substrate. Alternately, startup can occur with the membrane disposed over a margin of the substrate that does not have a pattern of circuits disposed thereon.

Example 23

Demonstration that Copper Ions Electropolished from a Surface Pass Through Membrane and into Electrolyte A cathode half-cell with a 1" diameter circular window fitted with N117 Nafion® membrane was filled with electrolyte comprising 0.40 M CuSO$_4$ in 1.32 M H$_2$SO$_4$ pumped under hydrostatic pressure $P_h$=6.0 psi. De-ionized water was delivered via two ports located on either side of the membrane window at a flow rate of 840 ml/min. The flow of de-ionized water was recovered prior to contact with the membrane and found to have a conductivity of 0.3 µS/cm. The same stream of de-ionized water was then allowed to flow across the surface of a flat copper work piece, 200 mm in diameter, mounted on the polishing tool and rotating at 190 rpm. The effluent stream recovered from the surface of this work piece was found to have a conductivity of 0.5 µS/cm. The cathode half-cell was then brought into contact with the moving work piece with a contact area $A_c$=0.825 cm$^2$ so that the de-ionized water contacted the external surface of the cathode half-cell as well as the surface of the work piece. The effluent stream recovered from the surface of this work piece was found to have a conductivity of 0.9 µS/cm. A voltage of 18 V was then applied between the work piece and cathode producing a current density of 630 mA/cm$^2$ and polishing was carried out over an area $A_p$=17 cm$^2$. The effluent stream recovered from the surface of this work piece was found to have a conductivity of 0.8 µS/cm. Thus the conductivity of the de-ionized water effluent was not significantly increased by contact with the half-cell or by current flow during polishing of the work piece. This example confirms that the membrane is an effective barrier against diffusion of electrolyte out of the half-cell and prevents contamination of the de-ionized water and the work piece. Moreover, the conductivity of the effluent is low enough that it becomes more practical to directly recycle this water through the de-ionizer rather than utilizing a fresh water supply. This procedure reduces the cost of generating de-ionized water and also eliminates a waste stream.

Although the present invention is described with reference to certain preferred embodiments, it is apparent that modification and variations thereof may be made by those skilled in the art without departing from the spirit and scope of this

We claim:

1. A method of membrane-mediated electropolishing of a work piece having a surface comprising a metal, the method comprising:
   A) providing the work piece surface at least partially covered with a low-conductivity fluid, wherein the metal is in electrical contact with a positive terminal of an electrical power source having positive and negative terminals;
   B) substantially and movably contacting at least a portion of the metal on the work piece surface covered with the low-conductivity-fluid with at least a portion of the first side of an ion-conducting membrane having first and second sides, wherein the second side of that portion of the ion-conducting membrane contacts a conductive electrolyte composition having a conductivity greater than 5 mS/cm, and the ion-conducting membrane substantially prevents the conductive electrolyte composition from contacting the work piece surface; and
   C) electrically contacting the conductive electrolyte composition with a cathode that is electrically connected to the negative terminal of the electrical power source, thereby applying a voltage, causing an electric current to flow between the work piece and the cathode, and electropolishing metal-containing ions from the work piece surface, and wherein a majority of metal-containing ions electropolished from the work piece migrate through the ion-conducting membrane and into the conductive electrolyte composition.

2. The method of claim 1, wherein: the ion-conducting membrane is a charge-specific ion-conducting membrane; the conductive electrolyte composition has a conductivity greater than about 30 mS/cm; and the low-conductivity fluid has a conductivity below about 500 µS/cm.

3. The method of claim 1, wherein no active ion exchange material having ability to substantially capture and retain the metal-containing ions is disposed in the electric current pathway between the cathode and the work piece surface, and wherein the conductive electrolyte composition has a conductivity greater than about 100 mS/cm.

4. The method of claim 1, further comprising introducing additional low-conductivity fluid between the membrane and the work piece surface during polishing.

5. The method of claim 2, wherein the ion-conducting membrane is a charge-specific cation-conducting membrane comprising a polymeric ionomer functionalized with strong acid moieties.

6. The method of claim 5, wherein the ion-conducting membrane comprises a perfluorosulfonic acid/PTFE copolymer.

7. The method of claim 2, wherein the ion-conducting membrane comprises a perfluorocarboxylic acid/PTFE copolymer.

8. The method of claim 2, wherein the ion-conducting membrane is a charge-specific anion-conducting membrane.

9. The method of claim 2, further comprising providing a structure between the charge-specific ion-conducting membrane and the work piece, wherein said structure has at least one opening sufficiently large to permit direct contact between an area of the membrane and the work piece.

10. The method of claim 1, wherein: the ion-conducting membrane is a charge-specific ion-conducting membrane; the conductive electrolyte composition has a conductivity greater than about 100 mS/cm and comprises water, an acid, and a metal salt; and the low-conductivity fluid has a conductivity below about 100 µS/cm.

11. The method of claim 2, wherein: the low conductivity fluid comprises a water-soluble nitrile, an alkanolamine, a diamine, ammonia, a water-soluble amide, or mixture thereof.

12. The method of claim 1, wherein the low-conductivity fluid has a conductivity between about 0.5 µS/cm and about 150 µS/cm.

13. The method of claim 1, wherein the low-conductivity fluid consists essentially of water and has a conductivity between about 1 µS/cm and about 10 µS/cm.

14. The method of claim 1, wherein the low-conductivity fluid consists essentially of water, acetonitrile, propionitrile, ethylene carbonate, propylene carbonate, glycol, ethylene glycol, propylene glycol, diethlyene glycol, or mixtures thereof.

15. The method of claim 1, wherein the low-conductivity fluid consists essentially of water and at least one of acetonitrile, an alcohol having from 1 to 8 carbon atoms, glycol, ethylene glycol, propylene glycol, diethlyene glycol, propylene glycol monomethyl ether, propylene carbonate, ethylene carbonate, and dimethylformamide.

16. The method of claim 1, wherein the low-conductivity fluid comprises between about 1 and about 300 ppm surfactants.

17. The method of claim 1, wherein the conductive electrolyte composition comprises water and a reducible-metal salt in an amount sufficient to substantially reduce formation of hydrogen gas.

18. The method of claim 1, wherein the conductivity of the low-conductivity fluid is at least about 100 times lower than the conductivity of the conductive electrolyte composition, and wherein the metal electropolished from the surface of the work-piece comprises silver.

19. The method of claim 1, wherein the conductivity of the low-conductivity fluid is at least about 100 times lower than the conductivity of the conductive electrolyte composition, and wherein the metal electropolished from the surface of the work-piece comprises aluminum.

20. The method of claim 1, wherein the conductivity of the low-conductivity fluid is at least about 100 times lower than the conductivity of the conductive electrolyte composition, and wherein the metal electropolished from the surface of the work-piece comprises nickel.

21. The method of claim 1, wherein the conductivity of the low-conductivity fluid is at least about 100 times lower than the conductivity of the conductive electrolyte composition, and wherein the metal electropolished from the surface of the work-piece comprises cobalt.

22. The method of claim 1, wherein the conductivity of the low-conductivity fluid is at least about 100 times lower than the conductivity of the conductive electrolyte composition, and wherein the metal electropolished from the surface of the work-piece comprises tin.

23. The method of claim 1, wherein the conductivity of the low-conductivity fluid is at least about 100 times lower than the conductivity of the conductive electrolyte composition, and wherein the metal electropolished from the surface of the work-piece comprises brass.

24. The method of claim 1, wherein the conductivity of the low-conductivity fluid is at least about 100 times lower than the conductivity of the conductive electrolyte composition, and wherein the metal electropolished from the surface of the work-piece comprises iron.

25. The method of claim 1, wherein the conductivity of the low-conductivity fluid is at least about 100 times lower than the conductivity of the conductive electrolyte composition, and wherein the metal electropolished from the surface of the work-piece comprises stainless steel.

26. The method of claim 1, further comprising the steps of:
providing a cathode half-cell comprising a fully or partially enclosed volume, wherein the ion-conducting membrane is a charge-selective ion-conducting membrane forming a surface of the volume, the cathode is disposed within the volume, the conductive electrolyte composition partially or essentially fills the volume, and the volume comprises an inlet and an outlet flowingly connected to a pump adapted to circulate the conductive electrolyte composition; and
circulating conductive electrolyte composition between the volume and the pump.

27. The method of claim 26, wherein flow of conductive electrolyte composition into and out from the half cell is controlled such that the pressure within the half cell is between about 0.1 psig and about 20 psig.

28. The method of claim 26, wherein the pump is further flowingly connected to a second apparatus adapted to change the temperature of the electrolyte composition, to change the composition of the electrolyte composition, or both.

29. The method of claim 1, wherein the electrical power source provides a pulsed DC current alternating between a high current value and a low current value that is less than 50% of the high current value.

30. The method of claim 1, wherein the electrical power source provides a pulsed DC current alternating between a high current value and a low current value that is less than 50% of the high current value, wherein the low current value is maintained for a period of time between 0.01 seconds and 1 second and the high current value is maintained for a period of time between about 0.01 second and 5 seconds.

31. The method of claim 1 wherein the conductive electrolyte composition comprises water, an acid, and from about 0.001 M to about 1 M of a metal salt.

32. The method of claim 1 wherein the conductive electrolyte composition comprises from about 0.001 M to about 1 M of a metal salt, wherein the metal ion is reducible at the cathode.

33. The method of claim 1 wherein the metal of the metal salt is the same metal electropolished from the work piece surface.

34. The method of claim 1 wherein the low-conductivity fluid comprises a chelator.

35. The method of claim 1 wherein the low-conductivity fluid comprises a polar organic solvent.

36. The method of claim 1 wherein the metal on the work piece surface comprises aluminum, iron, or both, and wherein the low conductivity-fluid, the conductive electrolyte composition, or both comprise a source of strong base or cyanide ion.

37. The method of claim 1 wherein the metal of the work piece surface comprises copper.

38. The method of claim 1 wherein the metal of the work piece surface comprises rhenium, osmium, iridium, ruthenium, or rhodium.

39. The method of claim 1 wherein the metal of the work piece surface comprises tin, lead, iron, brass, 316 stainless steel, or 314 stainless steel.

40. The method of claim 1 wherein the metal of the work piece surface comprises chromium, vanadium, manganese, zirconium, niobium, molybdenum, or hafnium.

41. The method of claim 1 wherein the work piece is a copper damascene wafer.

42. The process of claim 41, wherein: the low-conductivity fluid comprises water and has a conductivity less than about 100 $\mu$S/cm; the conductive electrolyte composition comprises anions and cations and has a conductivity greater than about 10 mS/cm; the ion-conducting membrane is a cation-selective ion-conducting membrane; wherein substantially preventing the conductive electrolyte composition from contacting the work piece surface means the membrane allows less than one anion from the conductive electrolyte composition to migrate through the ion-conducting membrane for every 10 electropolished copper ions that migrate from the low-conductivity fluid through the membrane to the conductive electrolyte composition.

43. The process of claim 42 wherein the voltage between the cathode and the copper damascene wafer is greater than about 10V.

44. The process of claim 43 wherein the velocity of the membrane relative to the work piece surface is greater than about 30 cm/sec.

45. The process of claim 41, wherein: the low-conductivity fluid consists essentially of de-ionized water; the area of contact of the membrane to the work-piece surface is $A_c$ and the current flow is i, and the current density $I=i/A_c$ is greater than about 500 mA/cm$^2$, and wherein the slope of I versus voltage V is greater than about 50 mA/cm$^2$ per volt.

46. The process of claim 45 wherein the current density $I=i/A_c$ is greater than about 1000 mA/cm$^2$.

47. The process of claim 41, wherein: the low-conductivity fluid comprises water and has a conductivity less than about 100 $\mu$S/cm; the membrane does not contact the cathode; the conductive electrolyte composition has a conductivity greater than about 1×10$^{-1}$ S/cm; the ion-conducting membrane is a cation-selective ion-conducting membrane; the area of contact of the membrane to the work-piece surface is $A_c$, the current is i, and the current density $I=i/A_c$ is greater than about 500 mA/cm$^2$, and wherein the ratio n of current to copper electropolished is greater than about 3 electrons per atom of copper.

48. The process of claim 47 wherein wherein the ratio n of current to copper electropolished is between about 3.5 to 9 electrons per atom of copper.

49. The process of claim 48 wherein the current density $I=i/A_c$ is greater than about 1000 mA/cm$^2$.

50. The process of claim 41, wherein: the low-conductivity fluid comprises water and has a conductivity less than about 500 $\mu$S/cm; the ion-conducting membrane is a cation-selective ion-conducting membrane; the area of contact of the membrane to the work-piece surface is $A_c$, the area polished $A_p$ is greater than $A_c$, the force $F_z$ exerted by the membrane on the work-piece surface is greater than 0, and the tool pressure $F_z/A_p$ is less than 5 psi; and the average removal rate of copper from the area $A_p$ is greater than about 500 nm per minute.

51. A membrane-mediated electropolishing process comprising:
   a. providing a cathode half-cell comprising:
      1. a fully or partially enclosed volume, cavity or vessel;
      2. an electrolyte solution or gel having a conductivity greater than about 10 mS/cm, which partially or essentially fills the enclosed volume, cavity or vessel;
      3. a cathode in contact with the electrolyte solution or gel;
      4. a connector electrically connecting the cathode to a DC power source; and
      5. a charge-selective ion-conducting membrane which forms a surface of the enclosed volume, cavity or vessel, wherein at least a portion of the internal surface of said membrane contacts the electrolyte solution or gel and the external surface of that portion is accessible to contact a metal work piece;
   b. applying a low-conductivity solvent or solution to the surface of a metal work piece, wherein the conductivity of the low-conductivity solvent or solution is less than about 1000 μS/cm;
   c. providing a source of DC electrical power whose positive voltage terminal is electrically connected to the metal to be polished and whose negative voltage terminal is electrically connected to the cathode; and
   d. contacting at least a portion of the metal to be polished with the external surface of the membrane, wherein the internal surface of the membrane is simultaneously contacting the electrolyte solution or gel, thereby electropolishing metal from the work piece.

52. The process of claim 51, wherein the metal work piece and the membrane of the cathode half-cell are moved relative to each other in such a way that an area of contact of the membrane to the work piece moves across at least a portion of the surface of the metal work piece.

53. The process of claim 51, wherein additional low-conductivity fluid is supplied continuously or intermittently to the metal to be polished.

54. The process of claim 51, wherein the electrolyte solution or gel comprises metal salts that are the same element and the same oxidation state as the metal ions electropolished from the work-piece.

55. The process of claim 51, wherein the cathode half-cell further comprises a second membrane specific to hydronium ions disposed between the cathode and the charge-selective ion-conducting membrane, said inner membrane partitioning the electrolyte solution or gel into first and second parts, wherein the first part contacts the charge-selective ion-conducting membrane and comprises less than about 0.01 M of metal salts, and wherein the second part contacts the cathode and comprises between 0.01 M to about 1 M of metal salts.

* * * * *